US012604604B2

(12) United States Patent
Lee et al.

(10) Patent No.: US 12,604,604 B2
(45) Date of Patent: Apr. 14, 2026

(54) LIGHT EMITTING DEVICE AND DISPLAY APPARATUS INCLUDING THE SAME

(71) Applicant: Samsung Display Co., Ltd., Yongin-si (KR)

(72) Inventors: Jongwon Lee, Seongnam-si (KR); Daehyeon Kim, Anyang-si (KR); Seung Cheol Kim, Seoul (KR); Heungsu Park, Anyang-si (KR); Chang-Min Lee, Suwon-si (KR); Hyunshik Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 722 days.

(21) Appl. No.: 17/822,633

(22) Filed: Aug. 26, 2022

(65) Prior Publication Data

US 2023/0209861 A1 Jun. 29, 2023

(30) Foreign Application Priority Data

Nov. 9, 2021 (KR) ........................ 10-2021-0153371

(51) Int. Cl.
*H10K 50/17* (2023.01)
*H10K 50/13* (2023.01)
(Continued)

(52) U.S. Cl.
CPC ........... *H10K 50/171* (2023.02); *H10K 50/13* (2023.02); *H10K 59/122* (2023.02); *H10K 59/38* (2023.02);
(Continued)

(58) Field of Classification Search
CPC ...... H10K 50/171; H10K 50/13; H10K 50/19; H10K 50/16–167; H10K 50/854;
(Continued)

(56) References Cited

U.S. PATENT DOCUMENTS

| | | | |
|---|---|---|---|
| 9,935,161 | B2 | 4/2018 | Kim et al. |
| 10,153,452 | B2 | 12/2018 | Oh et al. |

(Continued)

FOREIGN PATENT DOCUMENTS

| | | | | |
|---|---|---|---|---|
| CN | 106058069 A | * 10/2016 | ............. | H10K 50/85 |
| CN | 109473561 A | * 3/2019 | ............. | H10K 50/00 |

(Continued)

*Primary Examiner* — Steven B Gauthier
*Assistant Examiner* — Adam D Weiland
(74) *Attorney, Agent, or Firm* — Womble Bond Dickinson (US) LLP

(57) ABSTRACT

Provided is a light emitting device including a first electrode, a hole transport region on the first electrode, a first light emitting layer on the hole transport region and configured to emit light of a first wavelength, a second light emitting layer on the hole transport region and configured to emit light of a second wavelength different from the first wavelength, an electron transport region including an electron transport layer on the first light emitting layer and the second light emitting layer, and an electron injection layer on the electron transport layer, and a second electrode on the electron transport region, wherein the electron injection layer includes magnesium (Mg) and ytterbium (Yb).

16 Claims, 11 Drawing Sheets

(51) Int. Cl.
*H10K 59/122* (2023.01)
*H10K 59/38* (2023.01)
*H10K 102/00* (2023.01)

(52) U.S. Cl.
CPC ... *H10K 2102/00* (2023.02); *H10K 2102/351* (2023.02)

(58) Field of Classification Search
CPC .... H10K 59/122; H10K 59/38; H10K 59/351; H10K 59/32; H10K 2102/00; H10K 2102/351; H10K 2102/331; H10K 2101/90; H10H 20/00–882; H10H 20/851–8516; H10H 29/00–142; H10H 29/30–962
See application file for complete search history.

(56) References Cited

U.S. PATENT DOCUMENTS

| | | | | |
|---|---|---|---|---|
| 10,516,125 | B1 | 12/2019 | Na et al. | |
| 11,043,649 | B2 | 6/2021 | Yang et al. | |
| 11,917,905 | B2 | 2/2024 | Doh et al. | |
| 2007/0001588 | A1* | 1/2007 | Boroson | H10K 50/19 313/504 |
| 2012/0181526 | A1* | 7/2012 | Kasahara | H10K 50/171 257/40 |
| 2013/0049024 | A1 | 2/2013 | Choi et al. | |
| 2015/0102305 | A1* | 4/2015 | Jung | H10K 50/82 257/40 |
| 2020/0280017 | A1* | 9/2020 | Helander | C09K 11/06 |
| 2021/0066618 | A1 | 3/2021 | Kang et al. | |
| 2022/0208860 | A1* | 6/2022 | Choi | H10K 59/122 |
| 2023/0100309 | A1* | 3/2023 | Li | H10K 50/858 257/40 |

FOREIGN PATENT DOCUMENTS

| | | | |
|---|---|---|---|
| EP | 3 518 288 | A1 | 7/2019 |
| KR | 10-2013-0022986 | A | 3/2013 |
| KR | 10-2017-0136688 | A | 12/2017 |
| KR | 10-2018-0044466 | A | 5/2018 |
| KR | 10-2019-0123829 | A | 11/2019 |
| KR | 10-2021-0028317 | A | 3/2021 |
| KR | 10-2021-0098590 | A | 8/2021 |

* cited by examiner

LIGHT EMITTING DEVICE AND DISPLAY APPARATUS INCLUDING THE SAME

CROSS-REFERENCE TO RELATED APPLICATIONS

This application claims priority to and the benefit of Korean Patent Application No. 10-2021-0153371, filed on Nov. 9, 2021, the entire contents of which are hereby incorporated by reference.

BACKGROUND

1. Field

Embodiments of the present disclosure relate to a light emitting device and a display apparatus including the same.

2. Description of the Related Art

An organic light emitting device is a self-luminous type (or kind) of device having a short response time and driven by a low voltage. Accordingly, an organic light emitting display apparatus including the organic light emitting device may not include a separate light source, and thus, may be made to be lightweight and thin, and has a number of benefits such as having excellent luminance and no (or substantially no) viewing angle dependency.

An organic light emitting device is a display device having a light emitting layer composed of an organic matter and between an anode and a cathode. A hole provided from the anode and an electron provided from the cathode are combined in the light emitting layer to form an exciton, and then the exciton generates light corresponding to energy between the energy of the hole and the energy of the electron.

A tandem organic light emitting device has a structure including two or more stacks of a hole transport layer/a light emitting layer/an electron transport layer between an anode and a cathode, and a charge generation layer which is present between the respective stacks and assists in the generation and movement of charges.

SUMMARY

Embodiments of the present disclosure provide a light emitting device in which a pixel shrinkage phenomenon is prevented or reduced and luminescence efficiency and device lifespan are improved.

Embodiments of the present disclosure also provide a display apparatus having improved display efficiency and reliability.

Embodiments of the present disclosure provide a light emitting device including a first electrode, a hole transport region on the first electrode, a first light emitting layer on the hole transport region configured to emit light of a first wavelength, a second light emitting layer on the hole transport region and configured to emit light of a second wavelength different from the first wavelength, an electron transport region including an electron transport layer on the first light emitting layer and the second light emitting layer, and an electron injection layer on the electron transport layer, and a second electrode on the electron transport region, wherein the electron injection layer includes magnesium (Mg) and ytterbium (Yb).

In an embodiment, a mass ratio of the magnesium (Mg) to the ytterbium (Yb) may be about 5:5 to about 8:2.

In an embodiment, a thickness of the electron injection layer may be about 1 nm to about 2 nm.

In an embodiment, the electron injection layer may be directly on a lower surface of the second electrode.

In an embodiment, the electron injection layer may include a first sub-electron injection layer on the electron transport layer and including the magnesium (Mg), and a second sub-electron injection layer on the first sub-electron injection layer and including the ytterbium (Yb).

In an embodiment, a thickness of the first sub-electron injection layer may be about 0.5 nm to about 0.9 nm, and a thickness of the second sub-electron injection layer may be about 0.1 nm to about 0.5 nm.

In an embodiment, the first wavelength may be about 420 nm to about 480 nm, and the second wavelength may be about 520 nm to about 600 nm.

In an embodiment, the light emitting device may further include a first charge generation layer between the first light emitting layer and the second light emitting layer.

In an embodiment, the first charge generation layer may include a first p-type charge generation layer doped with a p-type dopant, and a first n-type charge generation layer doped with an n-type dopant.

In an embodiment, the light emitting device may further include an additional light emitting layer between the hole transport region and the electron transport region and configured to emit the light of the first wavelength.

In an embodiment, the additional light emitting layer may include a first additional light emitting layer between the first light emitting layer and the second light emitting layer, and a second additional light emitting layer between the first additional light emitting layer and the second light emitting layer.

In an embodiment, the additional light emitting layer may include a third additional light emitting layer between the second electrode and the second light emitting layer, and configured to emit the light of the first wavelength.

In an embodiment, the second light emitting layer may be between the first light emitting layer and the second electrode.

In an embodiment, the light emitting device may further include an intermediate electron transport layer between the first light emitting layer and the first charge generation layer, and an intermediate hole transport layer between the first charge generation layer and the second light emitting layer.

In embodiments of the present disclosure, a light emitting device includes a first electrode, a plurality of first light emitting layers on the first electrode and configured to emit light of a first wavelength, a second light emitting layer on the first electrode and configured to emit light of a second wavelength different from the first wavelength, an electron transport region including an electron transport layer on the first light emitting layer and the second light emitting layer, and an electron injection layer on the electron transport layer, and a second electrode on the electron transport region, wherein a plurality of first light emitting layers include a first first-light emitting layer, a second first-light emitting layer, and a third first-light emitting layer, and the electron injection layer includes magnesium (Mg) and ytterbium (Yb).

In embodiments of the present disclosure, a display apparatus includes a substrate on which a first pixel region configured to emit light of a first wavelength, a second pixel region configured to emit light of a second wavelength different from the first wavelength, and a third pixel region configured to emit light of a third wavelength different from the first wavelength and the second wavelength are defined, and a plurality of light emitting devices that overlap the first pixel region, the second pixel region, and the third pixel region on the substrate, wherein each of the plurality of light emitting devices includes a first electrode, a hole transport region on the first electrode, a first light emitting layer on the hole transport region and configured to emit the light of the first wavelength, a second light emitting layer on the hole transport region and configured to emit the light of the second wavelength, an electron transport region including an electron transport layer on the first light emitting layer and the second light emitting layer, and an electron injection layer on the electron transport layer, and a second electrode on the electron transport region, wherein the electron injection layer includes magnesium (Mg) and ytterbium (Yb).

In an embodiment, the display apparatus further includes a light control layer on the plurality of light emitting devices, wherein the light control layer may include a first light control unit overlapping the first pixel region and configured to transmit the light of the first wavelength, a second light control unit overlapping the second pixel region and configured to transit the light of the second wavelength, and a third light control unit overlapping the third pixel region and configured to transmit the light of the third wavelength.

In an embodiment, a fourth pixel region configured to emit white light may be defined on the substrate, and the light control layer may further include a transmission unit overlapping the fourth pixel region and configured to transmit the white light.

BRIEF DESCRIPTION OF THE DRAWINGS

The accompanying drawings are included to provide a further understanding of the subject matter of the present disclosure, and are incorporated in and constitute a part of this specification. The drawings illustrate example embodiments of the present disclosure and, together with the description, serve to explain principles of the subject matter of the present disclosure. In the drawings.

DETAILED DESCRIPTION

Figure 1:
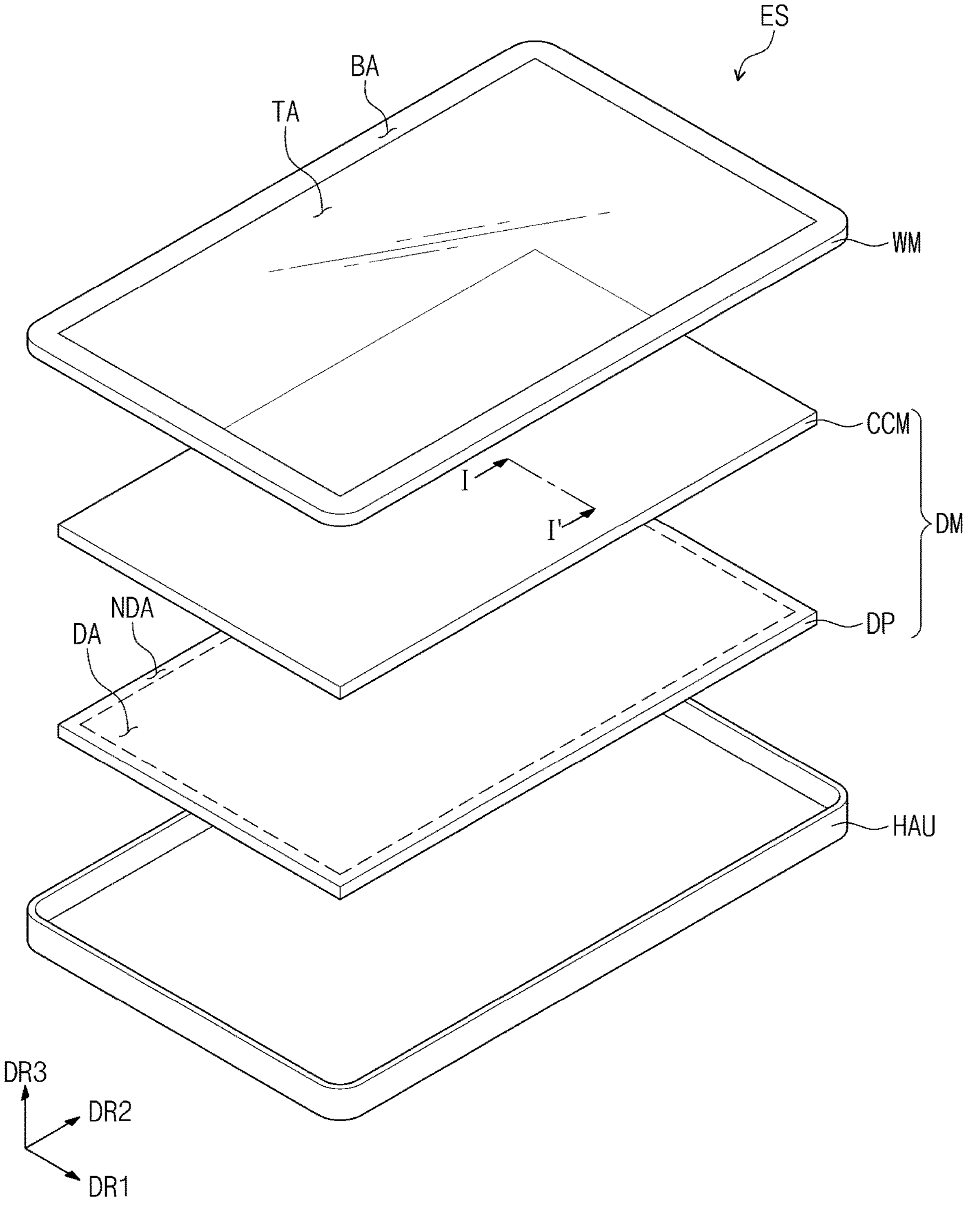
FIG. 1 is an exploded perspective view of a display apparatus according to an embodiment of the present disclosure.

In the present disclosure, when an element (or a region, a layer, a portion, and the like) is referred to as being "on," "connected to," or "coupled to" another element, it means that the element may be directly on/connected to/coupled to the other element, or that a third element may be therebetween.

Like reference numerals refer to like elements. Also, in the drawings, the thickness, the ratio, and the dimensions of elements may be exaggerated for clarity. The term "and/or," includes all combinations of one or more of which associated components may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing from the spirit and scope of the present disclosure. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise," or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, a display apparatus and a light emitting device according to embodiments of the present disclosure will be described with reference to the accompanying drawings.

Figure 2:
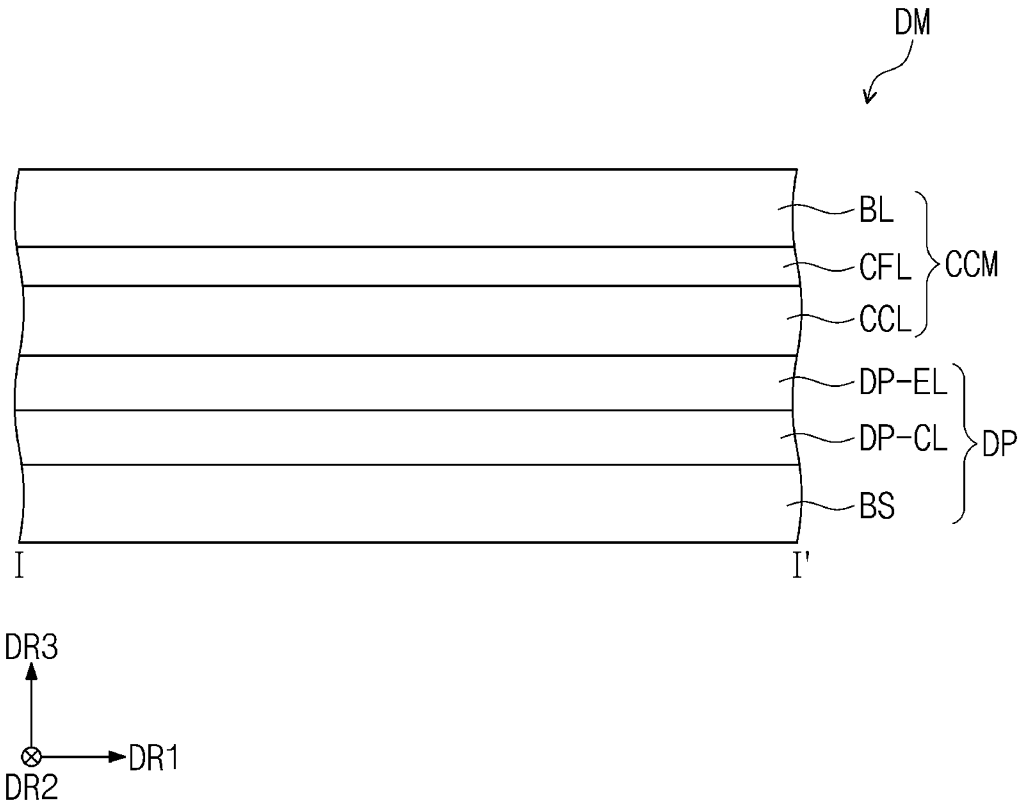
FIG. 2 is a cross-sectional view of a display module according to an embodiment of the present disclosure.

FIG. 1 is an exploded perspective view of a display apparatus according to an embodiment of the present disclosure. FIG. 2 is a cross-sectional view of a display module according to an embodiment of the present disclosure. FIG. 2 shows a cross-sectional view corresponding to line I-I' of FIG. 1.

In an embodiment, a display apparatus ES may be a large display apparatus such as a television, a monitor, and/or an external advertisement board. Also, the display apparatus ES may be a display apparatus used in a small-and-medium-sized product such as a personal computer, a laptop computer, a personal digital terminal, a car navigation system unit, a game console, a smart phone, a tablet personal computer, and/or a camera. In addition, it should be understood that these are merely example embodiments, and the subject matter of the present disclosure may be employed as other display apparatuses without departing from spirit and scope of the present disclosure.

The display apparatus ES of an embodiment may include a window WM, a display module DM, and a housing HAU. The display module DM may include a display panel DP. In some embodiments, the display apparatus ES may include various suitable devices which are activated according to an electrical signal, such as a touch device and/or a detection device, in addition to a display device.

In FIG. 1 and the following drawings, a first direction DR1 to a third direction DR3 are illustrated. Directions indicated by the first to third directions DR1, DR2, and DR3 described in the present disclosure are a relative concept, and may be converted to different directions.

In the present disclosure, for convenience of description, the third direction DR3 is defined as a direction in which an image is provided to a user. Also, the first direction DR1 and the second direction DR2 are perpendicular (e.g., substantially perpendicular) to each other, and the third direction DR3 may be a normal direction with respect to a plane defined by the first direction DR1 and the second direction DR2. In FIG. 1, the plane defined by the first direction DR1 and the second direction DR2 may be a display surface on which an image is provided.

In the display apparatus ES of an embodiment, the window WM may be on the display module DM. The window WM may be a material including glass, sapphire, and/or plastic. The window WM includes a transmissive region TA which transmits an image provided from the display module DM, and a light blocking region BA, which is adjacent to the transmissive region TA and does not transmit an image. Unlike what is illustrated in FIG. 1, in the display apparatus ES of an embodiment, the window WM may be omitted.

In the display apparatus ES of an embodiment, the display module DM may be in a lower portion of the window WM. The display module DM may include the display panel DP, and a light control member CCM on the display panel DP.

The display panel DP may be a light-emitting display panel. For example, the display panel DP may be a light-emitting diode (LED) display panel, an organic electroluminescence display panel, and/or a quantum dot light emitting display panel. However, embodiments of the present disclosure are not limited thereto.

The light-emitting diode (LED) display panel may include a light emitting diode, and a light emitting layer of the organic electroluminescence display panel may include an organic electroluminescence material, and a light emitting layer of the quantum dot light emitting display panel may include a quantum dot, a quantum rod, and/or the like. Hereinafter, the display panel DP included in the display apparatus ES of an embodiment is described as an organic electroluminescence display panel. However, embodiments of the present disclosure are not limited thereto.

The display apparatus ES of an embodiment includes the display panel DP, and the light control member CCM on an upper side of the display panel DP, and the display apparatus ES of an embodiment may be an organic electroluminescence display apparatus including an organic electroluminescence display panel. The display panel DP may provide a first light having a set or predetermined wavelength. For example, the display panel DP may provide blue light as the first light. However, embodiments of the present disclosure are not limited thereto. The display panel DP may emit white light.

The light control member CCM may convert the wavelength of the first light provided from the display panel DP, or may transmit the first light provided from the display panel DP.

On a plane, one surface of the display panel DP on which an image is displayed is defined as a display surface. The display surface includes a display region DA in which an image is displayed and a non-display region NDA in which an image is not displayed (or is not designed to be displayed). The display region DA may be defined in the center of the display panel DP on a plane, and may overlap the transmissive region TA of the window WM.

The housing HAU may be in a lower portion of the display panel DP to receive the display panel DP. The housing HAU may cover the display panel DP such that an upper surface of the display panel DP, which is the display surface, may be exposed. The housing HAU covers a side surface and a bottom surface of the display panel DP, and may expose the entire upper surface thereof.

Referring to FIG. 2, the display DP may include a base substrate BS, a circuit layer DP-CL provided on the base substrate BS, and a display device layer DP-EL. In an embodiment, the base substrate BS, the circuit layer DP-CL, and the display device layer DP-EL may be sequentially stacked in the third direction DR3.

The base substrate BS may be a member which provides a base surface on which the display device layer DP-EL is located. The base substrate BS may be a glass substrate, a metal substrate, a plastic substrate, and/or the like. However, embodiments of the present disclosure are not limited thereto, and the base substrate BS may be an inorganic layer, an organic layer, or a composite material layer.

In an embodiment, the circuit layer DP-CL may be on the base substrate BS, and the circuit layer DP-CL may include a plurality of transistors. Each of the transistors may include a control electrode, an input electrode, and an output electrode. For example, the circuit layer DP-CL may include a switching transistor and a driving transistor for driving an organic electroluminescence device ED (see FIG. 4A) of the display device layer DP-EL.

The light control member CCM is on the display panel DP. The light control member CCM may include a light control layer CCL, a color filter layer CFL, and an upper base layer BL. For example, the display panel DP may include a light emitting device ED(see FIG. 4A) which emits the first light, and the light control member CCM may include the light control layer CCL (see FIG. 4A) which either converts the wavelength of light provided from the light emitting device ED (see FIG. 4A) or transmits the light.

Figure 3:
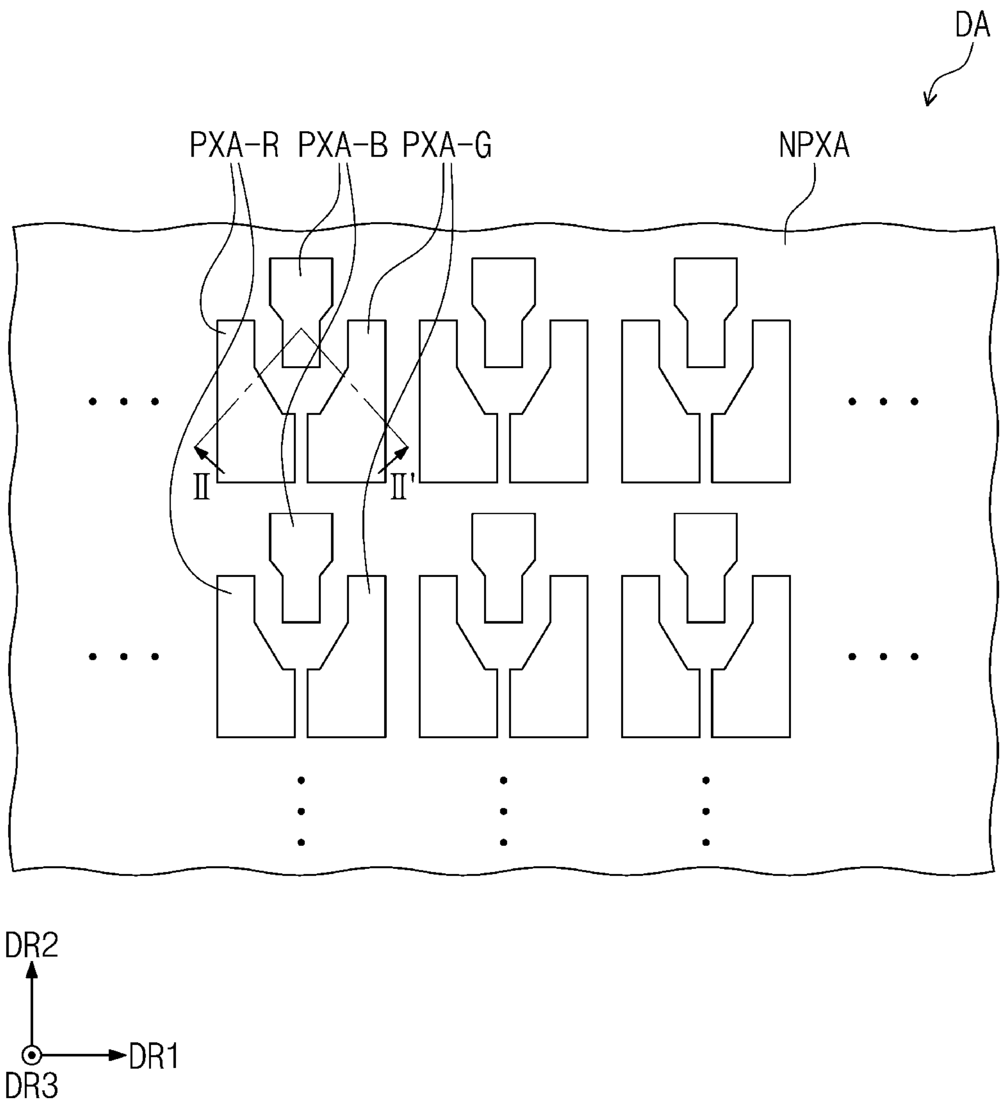
FIG. 3 is a plan view illustrating an enlarged portion of a display panel included in a display apparatus according to an embodiment of the present disclosure.
Figure 4A:
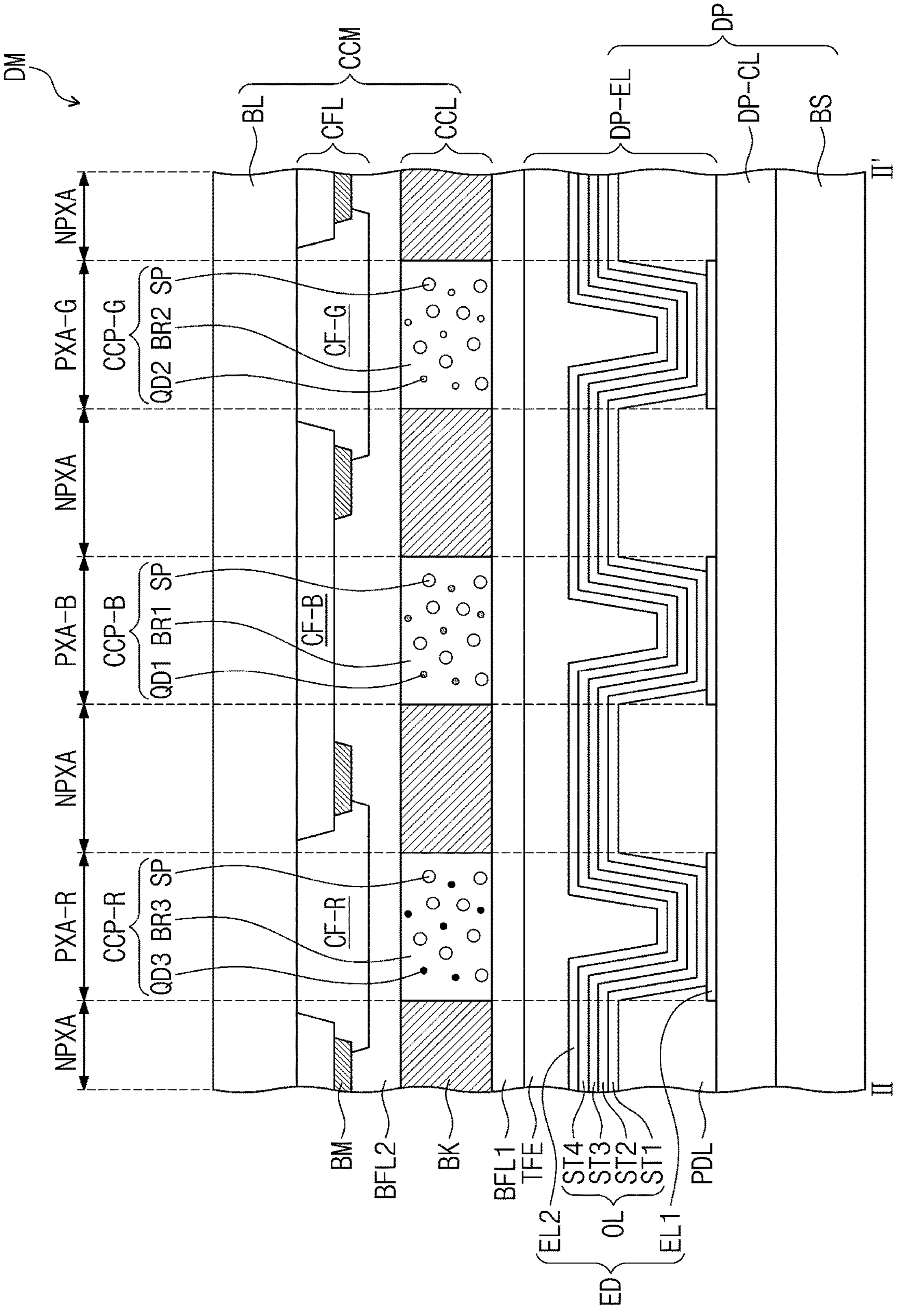
FIG. 4A to FIG. 4C are cross-sectional views illustrating an enlarged portion of a display module included in a display apparatus according to an embodiment of the present disclosure.
Figure 4B:
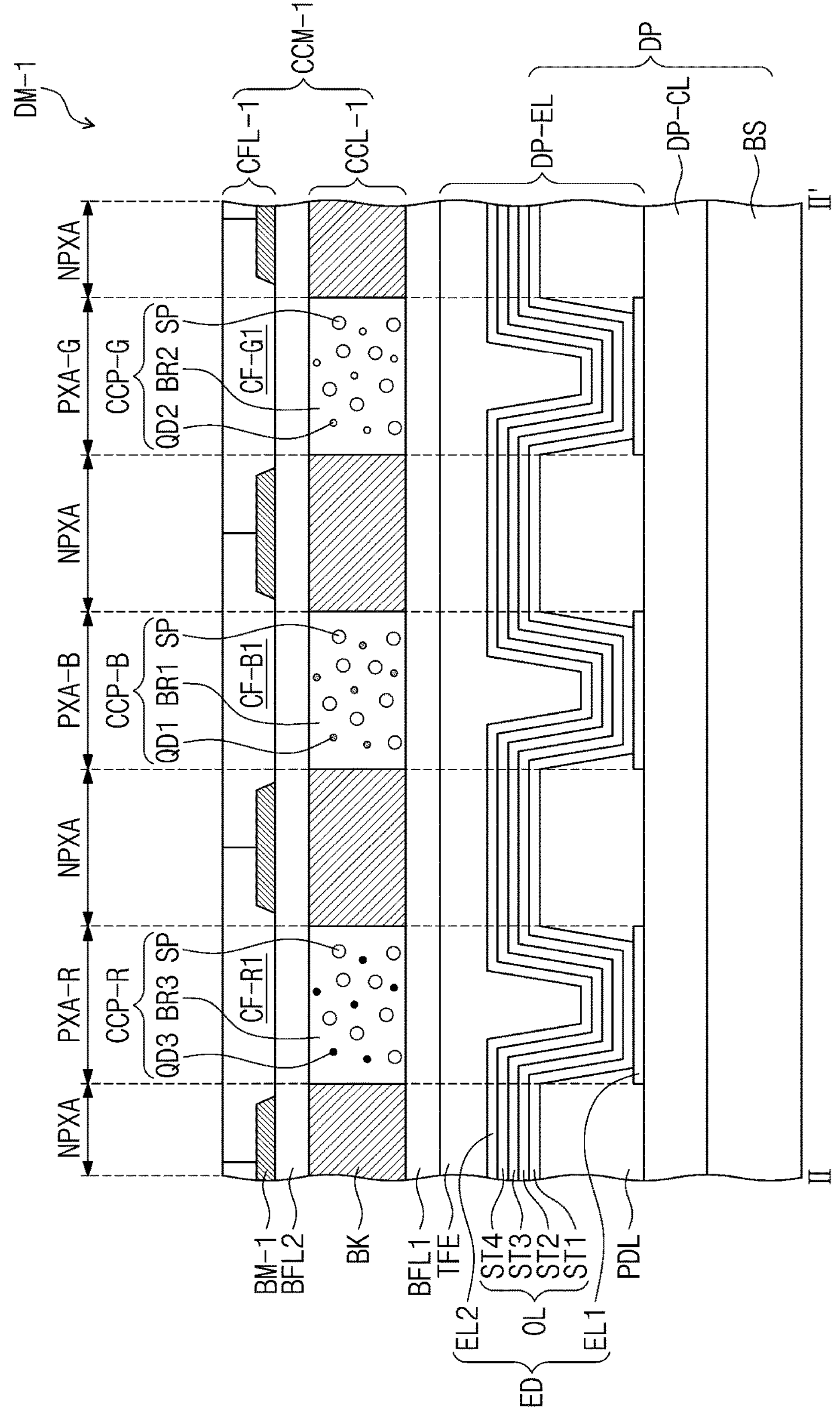
Figure 4C:
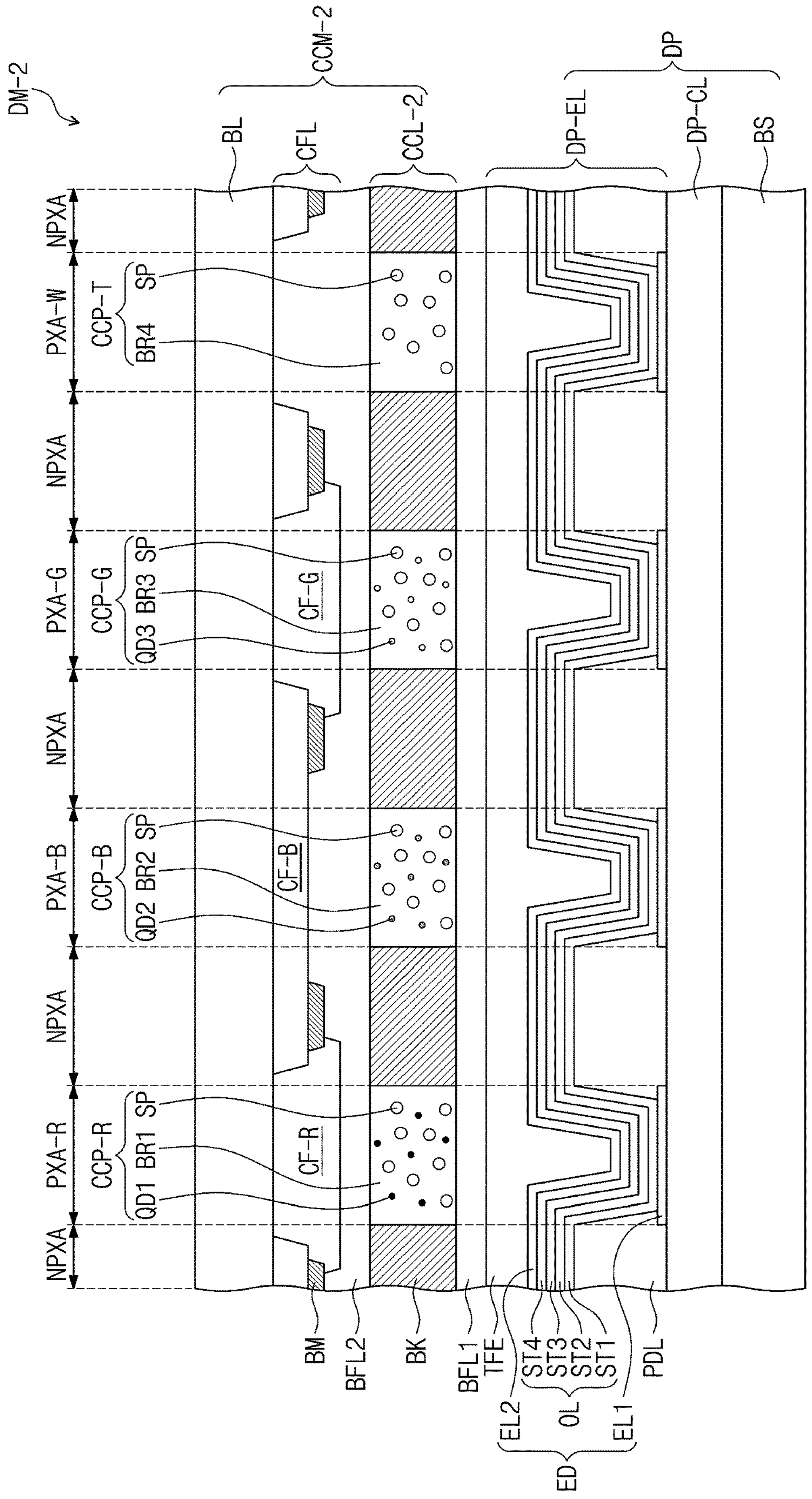

FIG. 3 is a plan view illustrating an enlarged portion of a display panel included in a display apparatus according to an embodiment of the present disclosure. FIG. 4A to FIG. 4C are cross-sectional views illustrating an enlarged portion of a display module included in a display apparatus according to an embodiment of the present disclosure. FIG. 3 illustrates a portion of the display region DA in a display panel according to an embodiment of the present disclosure. FIG. 4A and FIG. 4B illustrate a portion corresponding to line II-II' of FIG. 3. FIG. 4C shows a display module of another embodiment in a cross-section corresponding to FIG. 4A.

Hereinafter, display modules DM, DM-1, and DM-2 of embodiments described with reference to FIG. 3, and FIG. 4A to FIG. 4C are included in the display apparatus ES of an embodiment described with reference to FIG. 1, and the display modules DM, DM-1, and DM-2 include the display panel DP and the light control member CCM.

The display module DM according to an embodiment includes the display panel DP and the light control member CCM on the display panel DP, and the light control member CCM may include the light control layer CCL and the color filter layer CFL. The light control member CCM may include the upper base layer BL, the light control layer CCL on a lower side of the upper base layer BL, and the color filter layer CFL between the light control layer CCL and the upper base layer BL. In the light control member CCM, the light control layer CCL may be adjacent to the display panel DP.

The light control member CCM may include a plurality of partition walls BK and light control units CCP-R, CCP-B, and CCP-G between the partition walls BK.

Referring to FIG. 3, FIG. 4A, and FIG. 4B, the display module DM may include a non-pixel region NPXA and pixel regions PXA-R, PXA-B, and PXA-G. Each of the pixel regions PXA-R, PXA-B, and PXA-G may be a region in which light generated from the light emitting device ED is emitted. The area of each of the pixel regions PXA-R, PXA-B, and PXA-G may be different from each other, wherein the area may refer to an area when viewed on a plane.

The pixel regions PXA-R, PXA-B, and PXA-G may be classified into a plurality of groups according to the color of emitted light. In the display module DM of an embodiment illustrated in FIG. 3, FIG. 4A, and FIG. 4B, three pixel regions PXA-R, PXA-B, and PXA-G which respectively emit red light, blue light, and green light are illustrated as examples. For example, the display apparatus ES of an embodiment (see FIG. 1) may include a red pixel region PXA-R, a blue pixel region PXA-B, and a green pixel region PXA-G separated from each other. The red pixel region PXA-R may emit light having a light emission wavelength of about 620 nm to about 700 nm, the blue pixel region PXA-B may emit light having a light emission wavelength of about 410 nm to about 480 nm, and the green pixel region PXA-G may emit light having a light emission wavelength of about 500 nm to about 600 nm.

In the display modules DM and DM-1 of an embodiment illustrated in FIG. 4A and FIG. 4B, the display panel DP is illustrated as including the light emitting device ED which includes an organic layer OL as a common layer. In some embodiments, in the display modules DM and DM-1 of an embodiment in accordance with FIG. 4A and FIG. 4B, the display panel DP may emit the same light regardless of the pixel regions PXA-R, PXA-B, and PXA-G of the display module DM. For example, the display panel DP may provide blue light, which is the first light, to the light control member CCM. In some embodiments, the display panel DP may provide white light as the first light to the light control member CCM.

In the display modules DM and DM-1 of an embodiment illustrated in FIG. 3, FIG. 4A, and FIG. 4B, the red pixel region PXA-R and the green pixel region PXA-G among the pixel regions PXA-R, PXA-B, and PXA-G may have the same (e.g., substantially the same) area, and the blue pixel region PXA-B may have a smaller area than the red pixel region PXA-R and the green pixel region PXA-G. However, embodiments of the present disclosure are not limited thereto. Each of the pixel regions PXA-R, PXA-B, and PXA-G may have the same (e.g., substantially the same) area, or may have various suitable areas depending on colors emitted from the light control units CCP-R, CCP-B, and CCP-G. For example, in the display module DM of an embodiment, the blue pixel region PXA-B may have the largest area, and the green pixel region PXA-G may have the smallest area. However, embodiments of the present disclosure are not limited thereto. The pixel regions PXA-R, PXA-B, and PXA-G may emit lights of colors other than red light, blue light, and green light, or the pixel regions PXA-R, PXA-B, and PXA-G may be provided at different area ratios.

Each of the light pixel regions PXA-R, PXA-B, and PXA-G may be a region separated by a pixel definition film PDL. Non-pixel regions NPXA may be regions between adjacent pixel emitting regions PXA-R, PXA-B, and PXA-G, and may be a region corresponding to the pixel definition film PDL.

As illustrated in FIG. 3, the red pixel region PXA-R and the green pixel region PXA-G among the pixel regions PXA-R, PXA-B, and PXA-G may have symmetrical shapes with respect to a reference axis extending in the second direction DR2, and the blue pixel region PXA-B may be between the red pixel region PXA-R and the green pixel region PXA-G. When viewed in the first direction DR1, a portion of the blue pixel region PXA-B may not overlap the red pixel region PXA-R and the green pixel region PXA-G. However, embodiments of the present disclosure are not limited to. The pixel regions PXA-R, PXA-B, and PXA-G may have various suitable polygonal shapes and/or circular shapes, and the arrangement structure of the pixel regions is not limited as well. For example, the pixel regions may have a stripe structure in which the blue pixel region PXA-B, the green pixel region PXA-G, and the red pixel region PXA-R are sequentially and alternately arranged, or the arrangement structure of the pixel regions PXA-R, PXA-B, and PXA-G may be a PENTILE© structure (e.g., an RGBG matrix, RGBG structure, or RGBG matrix structure), but the present disclosure is not limited thereto. PENTILE® is a duly registered trademark of Samsung Display Co., Ltd.

Referring to FIG. 4A to FIG. 4C, the display panel DP according to an embodiment may include the base substrate BS, the circuit layer DP-CL on the base substrate BS, and the display device layer DP-EL on the circuit layer DP-CL. The display device layer DP-EL may include the pixel definition film PDL, the light emitting device ED between the pixel definition films PDL, and a thin film encapsulation layer TFE on the light emitting device ED.

The pixel definition film PDL may be formed of a polymer resin. For example, the pixel definition film PDL may be formed by including a polyacrylate-based resin and/or a polyimide-based resin. Also, the pixel definition film PDL may be formed by further including an inorganic matter in addition to the polymer resin. In some embodiments, the pixel definition film PDL may be formed by including a light absorbing material, or may be formed by including a black pigment and/or a black dye. In some embodiments, the pixel definition film PDL may be formed of an inorganic matter. For example, the pixel definition film PDL may be formed by including silicon nitride ($SiN_x$), silicon oxide ($SiO_x$), silicon oxynitride ($SiO_xNy$), and/or the like. The pixel definition film PDL may define the pixel regions PXA-R, PXA-B, and PXA-G. The pixel regions PXA-R, PXA-B, and PXA-G and the non-pixel region NPXA may be separated (e.g., spaced apart) by the pixel definition film PDL.

The pixel definition film PDL may overlap the partition wall BK. In some embodiments, each of the plurality of pixel definition films PDL may correspond to and overlap each of the plurality of partition walls BK.

The light emitting device ED may include a first electrode EL1 and a second electrode EL2 facing each other, and a plurality of organic layers OL between the first electrode EL1 and the second electrode EL2. The organic layer OL of the light emitting device ED may include a plurality of stacks ST1, ST2, ST3, and ST4. Each of the stacks ST1, ST2, ST3, and ST4 may include functional layers including a hole transport material and an electron transport material, and light emitting layers including a light emitting material. In some embodiments, the light emitting device ED included in the display module DM of an embodiment may be a light emitting device of a tandem structure including a plurality of light emitting layers. Hereinafter, each of the functional layers and the light emitting layers included in the light emitting device ED will be further described herein below.

FIG. 4A and FIG. 4B illustrate an embodiment in which each of the plurality of stacks ST1, ST2, ST3, and ST4 included in the organic layer OL is provided as a common layer throughout the pixel regions PXA-R, PXA-B, and PXA-G and the non-pixel region NPXA. In some embodiments, a portion of each of the plurality of stacks ST1, ST2, ST3, and ST4 included in the light emitting device ED may be on the pixel definition film PDL, and portions of the plurality of stacks ST1, ST2, ST3, and ST4 in the pixel regions PXA-R, PXA-B, and PXA-G may be connected to each other on the pixel definition film PDL to form common layers having an integral shape. Accordingly, each of the functional layers and the light emitting layers in the plurality of stacks ST1, ST2, ST3, and ST4 may also form common layers having an integral shape throughout the pixel regions PXA-R, PXA-B, and PXA-G and the non-pixel region NPXA. However, embodiments of the present disclosure are not limited thereto. In some embodiments, at least a portion of the plurality of stacks ST1, ST2, ST3, and ST4 may be patterned inside openings defined on the pixel definition film PDL and provided. At least a portion of the plurality of stacks ST1, ST2, ST3, and ST4, or at least a portion of the functional layers and the light emitting layers included in the plurality of stacks ST1, ST2, ST3, and ST4 may be patterned by an ink-jet printing method and provided inside an opening of the pixel definition film PDL which is defined to overlap the pixel regions PXA-R, PXA-B, and PXA-G.

The thin film encapsulation layer TFE may be on the light emitting device ED, and the thin film encapsulation layer TFE may be on the second electrode EL2. The thin film encapsulation layer TFE may be directly on the second electrode EL2. The thin film encapsulation layer TFE may be a single layer, or a plurality of stacked layers. The thin film encapsulation layer TFE includes at least one insulation layer. The thin film encapsulation layer TFE according to an embodiment may include at least one inorganic film (hereinafter may be referred to as an encapsulation inorganic film). In addition, the thin film encapsulation layer TFE according to an embodiment may include at least one organic film (hereinafter may be referred to as an encapsulation organic film) and at least one encapsulation inorganic film.

The encapsulation inorganic film protects the light emitting device ED from moisture/oxygen, and the encapsulation organic film protects the light emitting device ED from foreign matters such as dust particles. The encapsulation inorganic film may include silicon nitride, silicon oxynitride, silicon oxide, titanium oxide, aluminum oxide, and/or the like, but is not particularly limited thereto. The encapsulation organic film may include an acrylic compound, an epoxy-based compound, and/or the like. The encapsulation organic film may include a photopolymerizable organic material, but is not particularly limited thereto.

A display apparatus according to an embodiment includes the light control member CCM on a display panel DP. The light control member CCM includes the upper base layer BL, and the light control layer CCL on a lower side of the upper base layer BL. The light control layer CCL may include the plurality of partition walls BK spaced apart from each other and the light control units CCP-R, CCP-B, and CCP-G between the partition walls BK. In some embodiments, the light control member CCM according to an embodiment may include the upper base layer BL, the plurality of partition walls BK on the upper base layer BL, and the light control units CCP-R, CCP-B, and CCP-G between the plurality of partition walls BK spaced apart from each other. FIG. 4A illustrates that the upper base layer BL which provides a reference surface on which the light control layer CCL is located is separately provided, but embodiments of the present disclosure are not limited thereto. The light control layer CCL may be on a reference surface provided by the thin film encapsulation layer TFE of the display device layer DP-EL.

The light control member CCM of an embodiment may include the plurality of light control units CCP-R, CCP-B, and CCP-G. The light control units CCP-R, CCP-B, and CCP-G may include a first light control unit CCP-B configured to transmit light having a first wavelength, a second light control unit CCP-G configured to transmit light having a second wavelength, and a third light control unit CCP-R configured to transmit light having a third wavelength. The light of the second wavelength may be the light having a longer wavelength region than the light of the first wavelength, and the light of the third wavelength may be light having a longer wavelength region than the light of the first wavelength and the light of the second wavelength. For example, the light of the first wavelength may be blue light, the light of the second wavelength may be green light, and the light of the third wavelength may be red light. The light of the first wavelength may be light having a light emission wavelength of about 410 nm to about 480 nm, the light of the second wavelength may be light having a light emission wavelength of about 500 nm to about 600 nm, and the light of the third wavelength may be light having a light emission wavelength of about 620 nm to about 700 nm. In some embodiments, the light of the first wavelength may be source light provided from the display panel DP to the light control layer CCL.

Each of the first light control unit CCP-B, the second light control unit CCP-G, and the third light control unit CCP-R may include a light emitting body. The light emitting body may be a particle which converts the wavelength of incident light to emit light of a different wavelength. In an embodiment, the light emitting body included in the second light control unit CCP-G and in the third light control unit CCP-R may be a quantum dot or a fluorescent body. However, embodiments of the present disclosure are not limited thereto, and the first light control unit CCP-B may be a transmission unit configured to transmit the first light without converting the wavelength thereof. The first light control unit CCP-B may not include a light emitting body such as a quantum dot.

A quantum dot may be a particle configured to convert the wavelength of provided light. A core of the quantum dot may be selected from a Group II-VI compound, a Group III-VI compound, a Group I-III-VI compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$, $In_2Se_3$, and/or the like, a ternary compound such as $InGaS_3$, $InGaSe_3$, and/or the like, or any combination thereof.

The Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and/or the Group I-III-VI compound may include a quaternary compound such as $AgInGaS_2$, $CuInGaS_2$, and the like.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In some embodiments, the Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

At this time, a binary compound, a ternary compound, or a quaternary compound may be present in a particle at a uniform (e.g., substantially uniform) concentration, or may be present in the same particle with a partially different concentration distribution. In addition, a binary compound, a ternary compound, or a quaternary compound may have a core/shell structure in which one quantum dot surrounds another quantum dot. In the core/shell structure, a binary compound, a ternary compound, or a quaternary compound may have a concentration gradient in which the concentration of an element present in the shell becomes lower toward the center.

In some embodiments, a quantum dot may have the above core-shell structure including a core having nano-crystals and a shell surrounding the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer, or multiple layers. An example of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. However, embodiments of the present disclosure are not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like. However, embodiments of the present disclosure are not limited thereto.

A quantum dot may have a full width of half maximum (FWHM) of a light emission wavelength spectrum of about 45 nm or less, about 40 nm or less, or, for example, about 30 nm or less, and color purity and/or color reproducibility may be improved in the above range. In addition, light emitted through such a quantum dot is emitted in all directions (e.g., substantially all directions), so that a wide viewing angle may be improved.

In addition, the form of a quantum dot is not particularly limited and may be any suitable form generally used in the art, a quantum dot in the form of, for example, spherical, pyramidal, multi-arm, and/or cubic nanoparticles, nanotubes, nanowires, nanofibers, nanoplate particles, and/or the like may be used.

A quantum dot may control the color of emitted light according to the particle size thereof. Accordingly, the quantum dot may have various suitable light emission colors such as blue, red, green, and/or the like. The smaller the particle size of a quantum dot, light of the shorter wavelength region may be emitted. For example, the particle size of a quantum dot that emits green light may be smaller than the particle size of a quantum dot that emits red light, and the particle size of a quantum dot that emits blue light may be smaller than the particle size of the quantum dot emitting green light.

Each of the plurality of light control units CCP-R, CCP-B, and CCP-G included in the light control layer CCL may further include a scattering body SP (e.g., a light scattering body SP). The first light control unit CCP-B may include a first quantum dot QD1 and the scattering body SP, the second light control unit CCP-G may include a second quantum dot QD2 and the scattering body SP, and the third light control unit CCP-R may include a third quantum dot QD3 and the scattering body SP. However, embodiments of the present disclosure are not limited thereto. In the first light control unit CCP-B, the first quantum dot QD1 may be omitted, and the first light control unit CCP-B may include only the scattering body SP.

The scattering body SP may be an inorganic particle. For example, the scattering body SP may include at least one of $TiO_2$, ZnO, $Al_2O_3$, $SiO_2$, or hollow silica. The scattering body SP may include any one of $TiO_2$, ZnO, $Al_2O_3$, $SiO_2$, or hollow silica, or may be a mixture of two or more materials selected from $TiO_2$, ZnO, $Al_2O_3$, $SiO_2$, and hollow silica.

Each of the first light control unit CCP-B, the second light control unit CCP-G, and the third light control unit CCP-R may include base resins BR1, BR2, and BR3 in which the quantum dots QD1, QD2, and QD3 and the scattering body SP are dispersed. In an embodiment, the first light control unit CCP-B may include the first quantum dot QD1 and the scattering body SP dispersed in a first base resin BR1, the second light control unit CCP-G may include the second quantum dot QD2 and the scattering body SP dispersed in a second base resin BR2, and the third light control unit CCP-R may include the third quantum dot QD3 and the scattering body SP dispersed in the third base resin BR3. The base resins BR1, BR2, and BR3 are media in which the quantum dots QD1, QD2, and QD3 and the scattering body SP are dispersed, and may be formed of various suitable resin compositions which may be generally referred to as a binder. For example, the base resins BR1, BR2, and BR3 may each be an acrylic resin, a urethane-based resin, a silicone-based resin, an epoxy resin, and/or the like. The base resins BR1, BR2, and BR3 may each be a transparent resin. In an embodiment, the first base resin BR1, the second base resin BR2, and the third base resin BR3 may be the same or different from each other.

The partition walls BK may define an opening which separates each of the pixel regions PXA-R, PXA-B, and PXA-G overlapping the light control layer CCL. The light control units CCP-R, CCP-B, and CCP-G may fill the openings defined on the partition walls BK. In some embodiments, the partition walls BK may be formed by including a light absorbing material, and/or may be formed by including a black pigment and/or a black dye.

The light control member CCM according to an embodiment may further include the color filter layer CFL. The color filter layer CFL may be between the upper base layer BL and the light control layer CCL. The color filter layer CFL may include a light blocking part BM and filters CF-B, CF-G, and CF-R. The color filter layer CFL may include a first filter CF-B configured to transmit blue light, a second filter CF-G configured to transmit green light, and a third filter CF-R configured to transmit red light. For example, the first filter CF-B may be a blue filter, the second filter CF-G may be a green filter, and the third filter CF-R may be a red filter. Each of the filters CF-B, CF-G, and CF-R may include a polymer photosensitive resin, and a pigment and/or a dye. The first filter CF-B may include a blue pigment and/or a blue dye, the second filter CF-G may include a green pigment and/or a green dye, and the third filter CF-R may include a red pigment and/or a red dye. Embodiments of the present disclosure, however, are not limited thereto. The first filter CF-B may not include a pigment and/or a dye. The first filter CF-B may include a polymer photosensitive resin, but may not include a pigment and/or a dye. The first filter CF-B may be transparent. The first filter CF-B may be formed of a transparent photosensitive resin.

In addition, in an embodiment, the second filter CF-G and the third filter CF-R may each be a yellow filter. The second filter CF-G and the third filter CF-R may be provided as one body without being separated (e.g., spaced apart) from each other.

The light blocking part BM may be a black matrix. The light blocking part BM may be formed by including an organic light blocking material and/or an inorganic light blocking material which includes a black pigment and/or a black dye. The light blocking part BM may prevent or reduce a light leakage phenomenon and separate boundaries between adjacent filters CF-B, CF-G, and CF-R. In addition, in an embodiment, the light blocking part BM may be formed of a blue filter. Each of a plurality of light blocking parts BM may overlap each of the plurality of partition walls BK in correspondence thereto.

The first to third filters CF-B, CF-G, and CF-R may respectively correspond to the blue pixel region PXA-B, the green pixel region PXA-G, and the red pixel region PXA-R.

The upper base layer BL may be on the color filter layer CFL. The upper base layer BL may be a member which provides a base surface on which the color filter layer CFL, the light control layer CCL, and/or the like are located. The upper base layer BL may be a glass substrate, a metal substrate, a plastic substrate, and/or the like. However, embodiments of the present disclosure are not limited thereto, and the upper base layer BL may be an inorganic layer, an organic layer, or a composite material layer. In addition, unlike what is illustrated, in an embodiment, the upper base layer BL may be omitted.

In some embodiments, the color filter layer CFL may further include a low refractive layer. The low refraction layer may be between the filters CF-B, CF-G, and CF-R and the light control layer CCL. The refractive index of the low refractive layer may be about 1.1 to about 1.5. A refractive index value of the low refraction layer may be adjusted by the ratio of hollow inorganic particles, and/or voids included in the low refractive layer.

In some embodiments, the display module DM may further include a reflection prevention layer in an upper portion or lower portion of the color filter layer CFL and blocking or reducing external light incident on the display module DM. The reflection prevention layer may block or reduce reflection and/or transmission a portion of external light. The reflection prevention layer may reduce reflected light generated in the display panel DP by external light. The reflection prevention layer may be, for example, a polarizing layer. In an embodiment, the display module DM includes a polarizing layer in a lower portion of the upper base layer BL, and the color filter layer CFL may be omitted.

The light control member CCM may further include buffer layers BFL1 and BFL2 which block or reduce penetration of moisture, oxygen, and/or the like, and protect components in an upper portion and a lower portion. The buffer layers BFL1 and BFL2 may include a first buffer layer BFL1 and a second buffer layer BFL2. The first buffer layer BFL1 may be between the thin film encapsulation layer TFE and the light control layer CCL. The second buffer layer BFL2 may be between the light control layer CCL and the color filter layer CFL.

The first buffer layer BFL1 may be a layer which serves to prevent or reduce the penetration of moisture and/or oxygen (hereinafter may be referred to as 'moisture/oxygen') into the light control layer CCL. The first buffer layer BFL1 may be in a lower portion of the light control layer CCL to prevent or reduce exposure of the light control layer CCL to moisture/oxygen. The first buffer layer BFL1 may include at least one inorganic layer. In some embodiments, the first buffer layer BFL1 may be formed by including an inorganic material. For example, the first buffer layer BFL1 may be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and/or a thin metal film having a light transmittance rate secured, and/or the like. In some embodiments, the first buffer layer BFL1 may further include an organic film. The first buffer layer BFL1 may be composed of a single layer or a plurality of layers.

The second buffer layer BFL2 may be a protection layer which protects the light control layer CCL and the color filter layer CFL. The second buffer layer BFL2 may be an inorganic material layer including at least one inorganic material selected from among silicon nitride, silicon oxide, and silicon oxynitride. The second buffer layer BFL2 may be composed of a single layer or a plurality of layers.

Referring to FIG. 4B, a display module DM-1 according to an embodiment may include a display panel DP, and a light control member CCM-1 on the display panel DP, and the light control member CCM-1 may include a light control layer CCL-1 and a color filter layer CFL-1. In the display module DM-1 of an embodiment, the light control layer CCL-1 may be on the display panel DP. The light control layer CCL-1 may be on the display panel DP having the first buffer layer BFL1 interposed therebetween.

The light control layer CCL-1 of the light control member CCM-1 may include a plurality of partition walls BK and light control units CCP-R, CCP-B, and CCP-G between the partition walls BK. The color filter layer CFL-1 may include a light blocking part BM-1 and filters CF-R1, CF-B1, and CF-G1.

When compared to the display module DM illustrated in FIG. 4A, the display module DM-1 according to an embodiment illustrated in FIG. 4B is an embodiment in which the upper base layer BL is omitted, and the light control layer CCL-1 and the color filter layer CFL-1 are formed having an upper surface of a thin film encapsulation layer TFE as a base surface. In some embodiments, the light control units CCP-R, CCP-B, and CCP-G of the light control layer CCL-1 may be formed on the display panel DP by a continuous process (e.g., a substantially continuous process), and the filters CF-R1, CF-B1, and CF-G1 of the color filter layer CFL-1 may be sequentially formed on the light control layer CCL-1 through a continuous process (e.g., a substantially continuous process).

In some embodiments, the color filter layer CFL-1 may include a low refractive layer. Portions of the light blocking part BM-1 and the filters CF-R1, CF-B1, and CF-G1 included in the color filter layer CFL-1 may be omitted. The light control member CCM-1 may further include buffer layers BFL1 and BFL2 which block or reduce penetration of moisture, oxygen, and/or the like, and protect components in an upper portion and a lower portion. The buffer layers BFL1 and BFL2 may include a first buffer layer BFL1 between the thin film encapsulation layer TFE and the light control layer CCL-1, and a second buffer layer BFL2 between the light control layer CCL-1 and the color filter layer CFL-1.

When compared to the display module DM illustrated in FIG. 4A, in the display module DM-2 according to an embodiment illustrated in FIG. 4C, pixel regions PXA-R, PXA-B, PXA-G, and PXA-W may further include a white pixel region PXA-W. In the display module DM-2 of an embodiment, a light emitting device ED may generate white light, and the white pixel region PXA-W may be a region in which light generated in the light emitting device ED is not converted but is instead transmitted. FIG. 4C illustrates that the pixel regions PXA-R, PXA-B, PXA-G, and PXA-W have the same (e.g., substantially the same) planar area, but the white pixel region PXA-W may have an area different from the area of each of the other pixel regions PXA-R, PXA-B, and PXA-G. White light released from the white pixel region PXA-W may be a mixture of light of various suitable wavelengths.

A light control layer CCL-2 of a light control member CCM-2 of the display module DM-2 according to an embodiment may further include a fourth light control unit CCP-T in addition to the first light control unit CCP-B, a second light control unit CCP-G, and a third light control unit CCP-R. The fourth light control unit CCP-T may overlap the white pixel region PXA-W. A partition wall BK may be provided between the fourth light control unit CCP-T and another light control unit adjacent thereto. The fourth light control unit CCP-T may not include a light emitting body such as a quantum dot. The fourth light control unit CCP-T may be a transmission unit configured to transmit incident light without converting the wavelength thereof. The fourth light control unit CCP-T may include only the scattering body SP dispersed in a fourth base resin BR4. Descriptions that are the same as those given above may be applied to the fourth base resin BR4 and the scattering body SP.

An opening overlapping the white pixel region PXA-W may be defined on a color filter layer CFL-2 of the display module DM-2 according to an embodiment. Filters CF-B, CF-G, and CF-R and a light blocking part BM included in the color filter layer CFL-2 may not overlap the white pixel region PXA-W. For example, an opening corresponding to the white pixel region PXA-W may be defined in a first filter CF-B, and accordingly, the filters CF-B, CF-G, and CF-R and the light blocking part BM may not overlap the white pixel region PXA-W. However, embodiments of the present disclosure are not limited thereto. The first filter CF-B may overlap the white pixel region PXA-W, and the first filter CF-B may be formed of a transparent photosensitive resin.

Figure 5A:
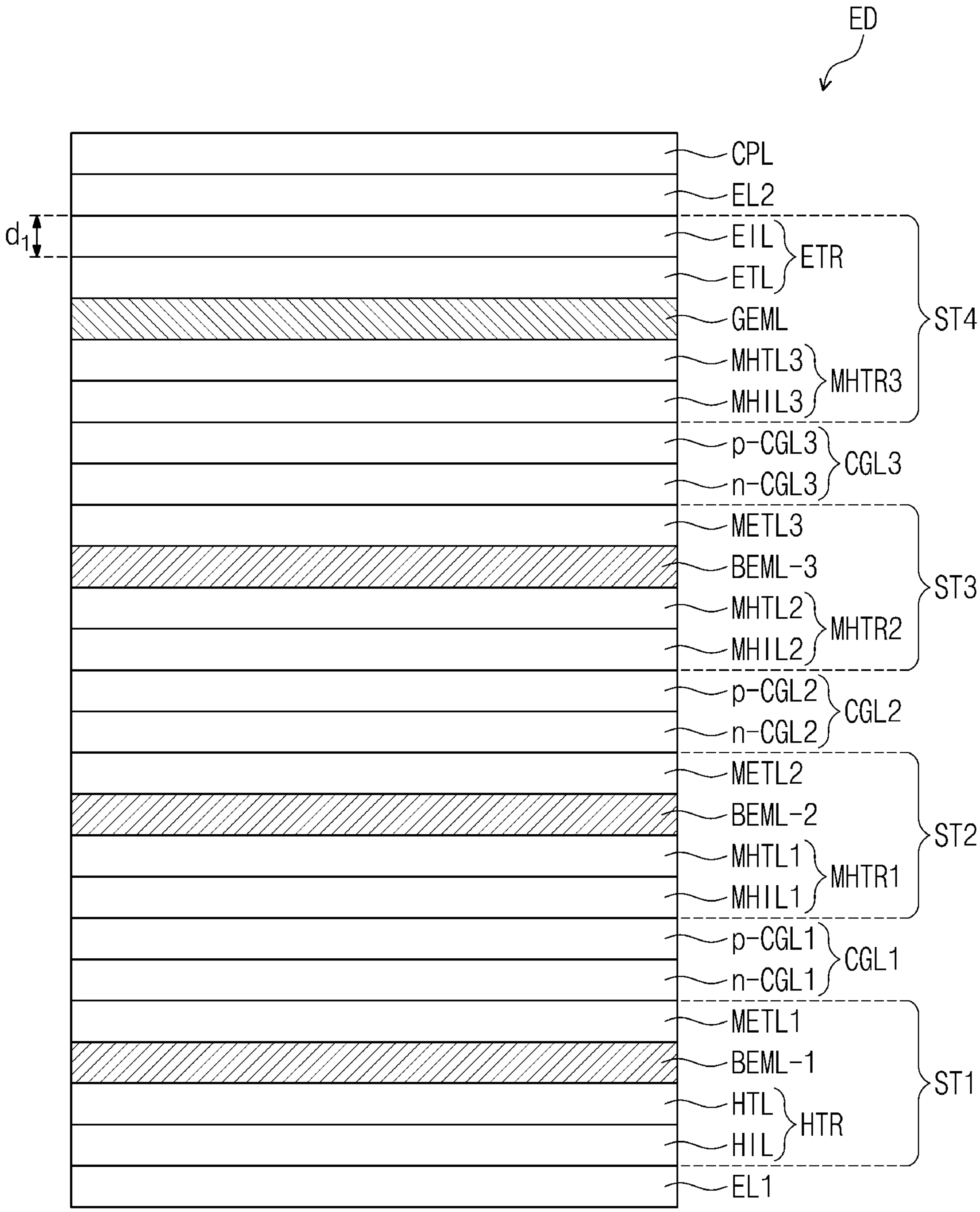
FIG. 5A to FIG. 5D are cross-sectional views schematically showing a light emitting device according to an embodiment of the present disclosure.

FIG. 5A is a cross-sectional view schematically showing a light emitting device according to an embodiment of the present disclosure. Hereinafter, the light emitting device ED according to an embodiment of the present disclosure will be described with reference to FIG. 5A.

Referring to FIG. 5A, the light emitting device ED of an embodiment includes the first electrode EL1, the second electrode EL2 facing the first electrode EL1, and a plurality of stacks ST1, ST2, ST3, and ST4 between the first electrode EL1 and the second electrode EL2. The plurality of stacks ST1, ST2, ST3, and ST4 may include a first stack ST1, a second stack ST2, a third stack ST3, and a fourth stack ST4. Each of the first stack ST1, the second stack ST2, the third stack ST3, and the fourth stack ST4 may include a light emitting layer. FIG. 5A illustrates that the light emitting device ED includes a total of four stacks ST1, ST2, ST3, and ST4. However, embodiments of the present disclosure are not limited thereto. The light emitting device ED may include two, three, or five or more stacks. For example, in the light emitting device ED structure illustrated in FIG. 5A, the second stack ST2 and the third stack ST3 may be omitted, and a light emitting device structure having the first stack ST1 and the fourth stack ST4 may be provided.

In the light emitting device ED of an embodiment, a hole transport region HTR may be between the first electrode EL1 and the plurality of stacks ST1, ST2, ST3, and ST4. An electron transport region ETR may be between the second electrode EL2 and the plurality of stacks ST1, ST2, ST3, and ST4. In an embodiment, the light emitting device ED may emit light in the direction from the first electrode EL1 to the second electrode EL2. The light emitting device ED of an embodiment may, for example, have a structure in which, based on a direction in which light is emitted, the hole transport region HTR is in a lower portion of the plurality of stacks ST1, ST2, ST3, and ST4 and the electron transport region ETR is in an upper portion of the plurality of stacks ST1, ST2, ST3, and ST4. However, embodiments of the present disclosure are not limited thereto, and the light emitting device ED may have an inverted device structure in which, based on a direction in which light is emitted, the electron transport region ETR is in a lower portion of the plurality of stacks ST1, ST2, ST3, and ST4 and the hole transport region HTR is in an upper portion of the plurality of stacks ST1, ST2, ST3, and ST4.

The light emitting device ED of an embodiment includes the electron transport region ETR below the second electrode EL2. The electron transport region ETR includes an electron transport layer ETL on first light emitting layers BEML-1, BEML-2, and BEML-3 and a second light emitting layer GEML, and an electron injection layer EIL on the electron transport layer ETL. The electron injection layer EIL may be below the second electrode EL2 to serve to smoothly move electrons injected from the second electrode EL2 to the light emitting layers BEML-1, BEML-2, BEML-3, and GEML. For example, in the light emitting device ED illustrated in FIG. 5A, the electron injection layer EIL may serve to smoothly move electrons injected from the second electrode EL2 to the second light emitting layer GEML. The electron injection layer EIL may be between the second electrode EL2 and the electron transport layer ETL. The electron injection layer EIL may be directly on a lower surface of the second electrode EL2. An upper surface of the electron injection layer EIL and the lower surface of the second electrode EL2 may contact (e.g., physically contact) each other.

In an embodiment, the electron injection layer EIL may include magnesium (Mg) and ytterbium (Yb). For example, the electron injection layer EIL may be composed of (or may consist of) magnesium (Mg) and ytterbium (Yb). Ytterbium (Yb) is a low work function metal and has shallow lowest unoccupied molecular orbital (LUMO) properties, and thus, may serve to lower the energy barrier at an interface between the second electrode EL2 and an electron injection layer EIL. Accordingly, when the electron injection layer EIL below the second electrode EL2 includes ytterbium (Yb), electrons injected from the second electrode EL2 may be smoothly moved to a light emitting layer EML, so that the efficiency and lifespan properties of the light emitting layer ED may be improved.

Magnesium (Mg) may be included in the electron injection layer EIL to suppress or reduce the aggregation and migration of ytterbium (Yb) included in the electron injection layer EIL, and serve to improve the coverage effect of the second electrode EL2 on an upper portion of the electron injection layer EIL. In addition, magnesium (Mg) may be included together with ytterbium (Yb) in the electron injection layer EIL to improve the transmission efficiency of light emitted from the light emitting layer.

The electron injection layer EIL of an embodiment may include both magnesium (Mg) and ytterbium (Yb) to prevent or reduce changes in the interface between the second electrode EL2 and the electron injection layer EIL over time. For example, when an electric field is applied to the light emitting device ED, a metal material included in the electron injection layer EIL may form an island on an upper surface of the electron injection layer EIL through the aggregation and/or migration between elements. When an island is formed on the upper surface of the electron injection layer EIL, the coverage properties of the second electrode EL2 are degraded to cause pixel shrinkage. According to embodiments of the present disclosure, the electron injection layer EIL includes both magnesium (Mg) and ytterbium (Yb), so that the interface between the second electrode EL2 and the electron injection layer EIL may be stabilized, and the coverage properties of the second electrode EL2 are enhanced to increase the stability of the light emitting device ED. In the present disclosure, the term "coverage" may refer to the area of a surface on which a metal of the second electrode EL2 and a metal of the electron injection layer EIL are in direct contact (e.g., physical contact) with each other in areas of surfaces of the second electrode EL2 and the electron injection layer EIL facing each other.

Magnesium (Mg) included in the electron injection layer EIL may have a mass ratio equal to or higher than that of ytterbium (Yb) in order to increase the transmittance of the light emitting device ED and to improve the coverage properties of the second electrode EL2. In an embodiment, the mass ratio of magnesium (Mg) and ytterbium (Yb) in the electron injection layer EIL may be about 5:5 to about 8:2. When the mass ratio of magnesium (Mg) and ytterbium (Yb) satisfies the above range, electron injection properties may be improved and the coverage properties of the second electrode EL2 by the electron injection layer EIL may be improved. Accordingly, the luminescence efficiency and lifespan of the light emitting device ED are improved, and pixel shrinkage may be prevented or reduced.

The content of ytterbium (Yb) may be about 10% to about 50% based on the total mass of the magnesium (Mg) and ytterbium (Yb). When the content of ytterbium (Yb) is less than about 10%, electron injection properties may be degraded to reduce the luminescence efficiency of the light emitting device ED. When the content of ytterbium (Yb) is greater than about 50%, the cohesive force between ytterbium (Yb) elements may be increased to make the properties of the electron injection layer EIL unstable. As a result, the interface between the second electrode EL2 and the electron injection layer EIL may be deformed, which may result in the deterioration of the light emitting device ED and cause pixel shrinkage and lifespan degradation.

The content of magnesium (Mg) may be about 50% to about 80% based on the total mass of the magnesium (Mg) and ytterbium (Yb). When the content of magnesium (Mg) is less than about 50%, the coverage effect of the second electrode EL2 may be reduced, and the transmittance may be lowered to reduce luminescence efficiency. When the content of magnesium (Mg) is greater than about 80%, due to the degradation in electron injection properties, a driving voltage may be increased, and luminescence efficiency may be degraded.

In an embodiment, a thickness ($d_1$) of the electron injection layer EIL may be about 1 nm to about 2 nm. When the thickness ($d_1$) of the electron injection layer EIL satisfies the above range, excellent electron injection properties may be implemented without a substantial increase in driving voltage, and the luminescence efficiency of a light emitting device may be improved. When the thickness ($d_1$) of the electron injection layer EIL is less than about 1 nm, the surface of the electron injection layer EIL may become unstable due to a small thickness, so that the coverage properties of the second electrode EL2 may be degraded. When the thickness ($d_1$) of the electron injection layer EIL is greater than about 2 nm, a driving voltage may increase due to a large thickness, and the device lifespan may be reduced.

In order to improve electron injection properties, a display apparatus may include an electron injection layer between a second electrode and a light emitting layer. In order to improve electron injection properties, an electron injection layer including a mixture of a metal such as magnesium (Mg) and a metal halide compound such as lithium fluoride (LiF) has been applied to a display apparatus. In a metal halide compound such as lithium fluoride, there is an effect of offsetting the difference in ionization potential between a second electrode and an electron injection layer because the vacuum level is moved down by the dipole present in a molecule, so that electron injection properties may be improved. However, when the metal halide compound is included together with a metal in an electron injection layer, there is a problem in that pixel shrinkage occurs during device operation.

In embodiments of the present disclosure, the electron injection layer EIL is composed of magnesium (Mg) and ytterbium (Yb), so that the deformation of the interface between the second electrode EL2 and the electron injection layer EIL may be prevented or reduced, and the coverage properties of the second electrode EL2 by the electron injection layer EIL are improved to have an effect of preventing or reducing a pixel shrinkage phenomenon. In the light emitting device ED, lifespan degradation and pixel shrinkage may occur due to degradation of the film quality by a change in composition of the electron injection layer EIL, or due to a change in interface properties between the second electrode EL2 and the electron injection layer EIL. The light emitting device ED according to embodiments of the present disclosure includes magnesium (Mg) and ytterbium (Yb) in the electron injection layer EIL below the second electrode EL2, and thus, may exhibit similar or improved luminescence efficiency and lifespan properties compared to when including an electron injection layer EIL generally used in the art, and may effectively suppress or reduce a change in interface properties between the second electrode EL2 and the electron injection layer EIL to prevent or reduce pixel shrinkage. Accordingly, when the light emitting device ED of an embodiment is applied to the display apparatus ES, the display apparatus ES exhibiting excellent efficiency and reliability may be implemented.

Referring back to FIG. 5A, the light emitting device ED according to an embodiment may include charge generation layers CGL1, CGL2, and CGL3 between the plurality of stacks ST1, ST2, ST3, and ST4. The light emitting device ED according to an embodiment may include a first charge generation layer CGL1 between the first stack ST1 and the second stack ST2, a second charge generation layer CGL2 between the second stack ST2 and the third stack ST3, and a third charge generation layer CGL3 between the third stack ST3 and the fourth stack ST4.

When a voltage is applied, the charge generation layers CGL1, CGL2, and CGL3 may generate charges (electrons and holes) by forming a complex through an oxidation-reduction reaction. Then, the charge generation layers CGL1, CGL2, and CGL3 may provide the generated charges to each of adjacent stacks ST1, ST2, ST3 and ST4. The charge generation layers CGL1, CGL2, and CGL3 may double the efficiency of currents generated in each of the stacks ST1, ST2, ST3, and ST4, and may serve to control the balance of charges between adjacent stacks ST1, ST2, ST3 and ST4.

Each of the charge generation layers CGL1, CGL2, and CGL3 may have a layered structure in which n-type charge generation layers n-CGL1, n-CGL2, and n-CGL3 and p-type charge generation layers p-CGL1, p-CGL2, and p-CGL3 are bonded to each other. The first charge generation layer CGL1 may have a layered structure in which a first n-type charge generation layer n-CGL1 and a first p-type charge generation layer p-CGL1 are bonded to each other. The second charge generation layer CGL2 may have a layered structure in which a second n-type charge generation layer n-CGL2 and a second p-type charge generation layer p-CGL2 are bonded to each other. The third charge generation layer CGL3 may have a layered structure in which a third n-type charge generation layer n-CGL3 and a third p-type charge generation layer p-CGL3 are bonded to each other.

The n-type charge generation layers n-CGL1, n-CGL2, and n-CGL3 may be charge generation layers which provide electrons to adjacent stacks. The n-type charge generation layers n-CGL1, n-CGL2, and n-CGL3 may be layers in which a base material is doped with an n-dopant. The p-type charge generation layers p-CGL1, p-CGL2, and p-CGL3 may be charge generation layers which provide holes to adjacent stacks. In some embodiments, a buffer layer may be further between the n-type charge generation layers n-CGL1, n-CGL2, and n-CGL3 and the p-type charge generation layers p-CGL1, p-CGL2, and p-CGL3.

Each of the charge generation layers CGL1, CGL2, and CGL3 may include an n-type aryl amine-based material, or a p-type metal oxide. For example, each of the charge generation layers CGL1, CGL2, and CGL3 may include an aryl amine-based organic compound, a metal, a metal oxide, a carbide, a fluoride, and/or a charge generation compound composed of a mixture thereof.

For example, the aryl amine-based organic compound may be α-NPD, 2-TNATA, TDATA, MTDATA, spiro-TAD, or spiro-NPB. For example, the metal may be cesium (Cs), molybdenum (Mo), vanadium (V), titanium (Ti), tungsten (W), barium (Ba), and/or lithium (Li). In addition, for example, the metal oxide, the carbide, and the fluoride may be $Re_2O_7$, $MoO_3$, $V_2O_5$, $WO_3$, $TiO_2$, $Cs_2CO_3$, BaF, LiF, and/or CsF.

In the light emitting device ED according to an embodiment, the first stack ST1, the second stack ST2, and the third stack ST3 respectively include first light emitting layers BEML-1, BEML-2, and BEML-3, which emit the light of the first wavelength. The light of the first wavelength may be light of a blue wavelength region. In an embodiment, the first wavelength may be about 420 nm to about 480 nm. The first light emitting layers BEML-1, BEML-2, and BEML-3 may include an organic material which emits light having a wavelength of about 420 nm to about 480 nm. The first light emitting layers BEML-1, BEML-2, and BEML-3 may include, for example, a host and a dopant.

In an embodiment, the first light emitting layers BEML-1, BEML-2, and BEML-3 may include a first first-light emitting layer BEML-1 included in the first stack ST1, a second first-light emitting layer BEML-2 included in the second stack ST2, and a third first-light emitting layer BEML-3 included in the third stack ST3.

The first light emitting layers BEML-1, BEML-2, and BEML-3 may have a single-layered structure. For example, the first first-light emitting layer BEML-1, the second first-light emitting layer BEML-2, and the third first-light emitting layer BEML-3 included in the first light emitting layers BEML-1, BEML-2, and BEML-3 may each have a single-layered structure. The first light emitting layers BEML-1, BEML-2, and BEML-3 having a single-layered structure may have a thickness of about 10 nm to about 40 nm, but are not limited thereto. In addition, unlike what is illustrated in FIG. 5A, at least some of the first light emitting layers BEML-1, BEML-2, and BEML-3 may have a double-layered structure. The double-layered structure, which at least some of the first light emitting layers BEML-1, BEML-2, and BEML-3 have, may include host materials different from each other, but embodiments of the present disclosure are not limited thereto.

The first light emitting layers BEML-1, BEML-2, and BEML-3 may include a host and a dopant. In an embodiment, the first light emitting layers BEML-1, BEML-2, and BEML-3 may include a host, and a first dopant which emits the light of the first wavelength. The host included in each of the first light emitting layers BEML-1, BEML-2, and BEML-3 may be a blue fluorescent host, and the first dopant may be a blue fluorescent dopant.

In the light emitting device ED according to an embodiment, the host included in the first light emitting layers BEML-1, BEML-2, and BEML-3 may include any one selected from H1-1 to H1-9 below. A host material included in each of the first light emitting layers BEML-1, BEML-2, and BEML-3 may include any one selected from the H1-1 to H1-9 below. However, the host material included in the first light emitting layers BEML-1, BEML-2, and BEML-3 is not limited thereto.

H1-1

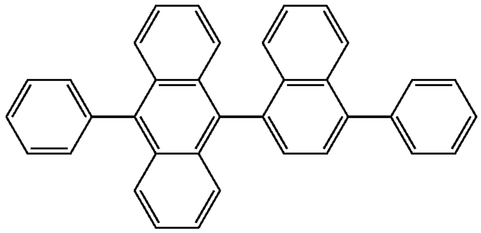

-continued

H1-2

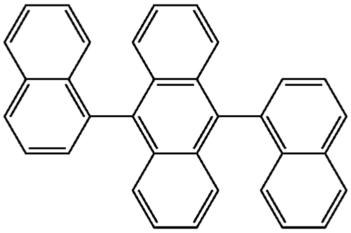

H1-3

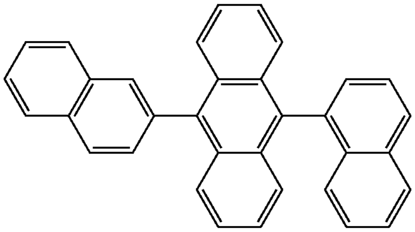

H1-4

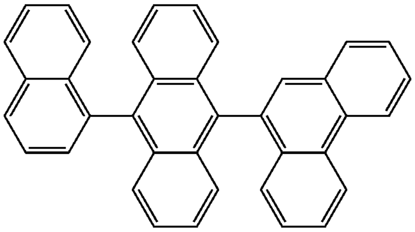

H1-5

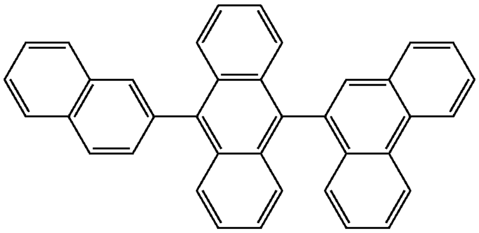

H1-6

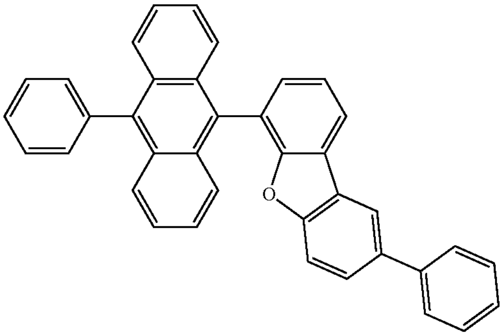

H1-7

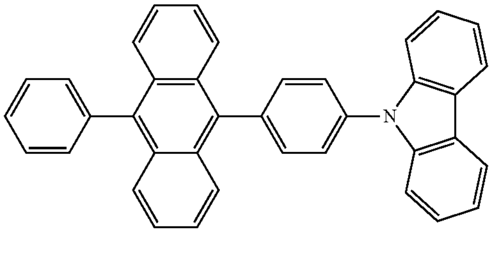

-continued

H1-8

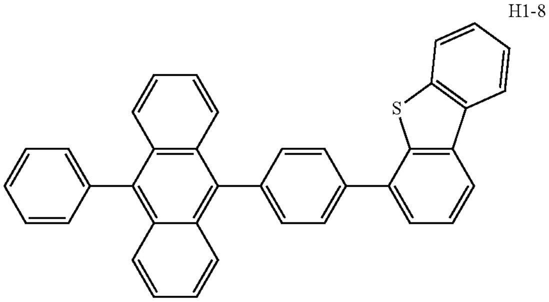

H1-9

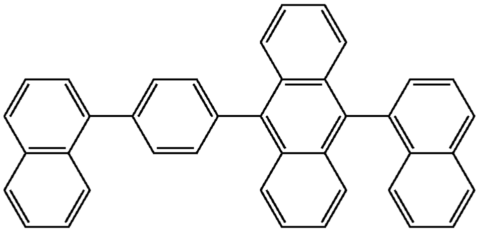

In an embodiment, the above H1-1 to H1-9 compounds may each independently have any one of hydrogen atoms substituted with a deuterium atom.

For example, the H1-1 may be denoted as H1-1D below.

H1-1D

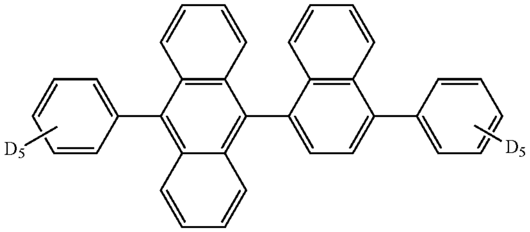

In the light emitting device ED according to an embodiment, the first dopant included in the first light emitting layers BEML-1, BEML-2, and BEML-3 may include any one selected from FD1 to FD33 below. In an embodiment, the first dopant included in each of the first light emitting layers BEML-1, BEML-2, and BEML-3 may include any one selected from the FD1 to FD33 below. However, a first dopant material included in the first light emitting layers BEML-1, BEML-2, and BEML-3 is not limited to the following embodiment.

FD1
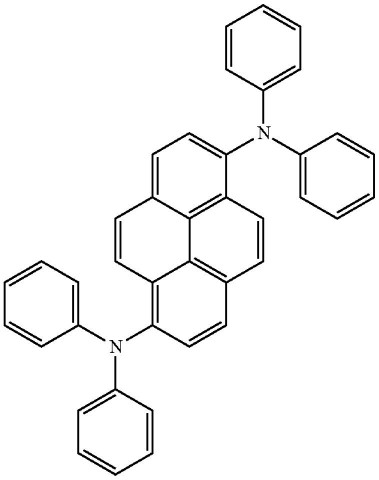
FD2
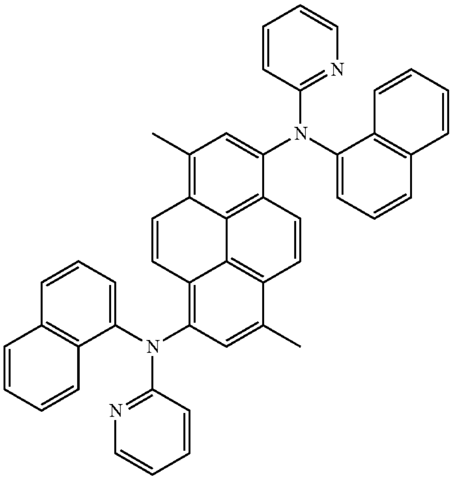
FD3
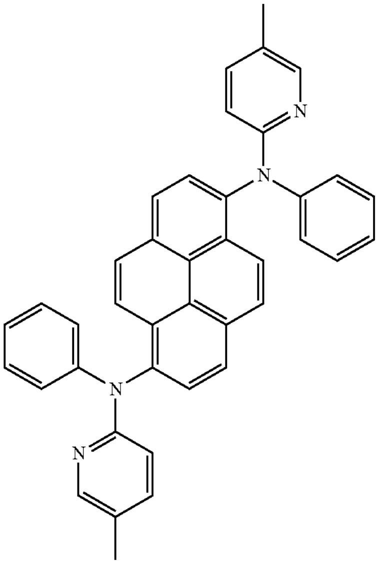
-continued
FD4
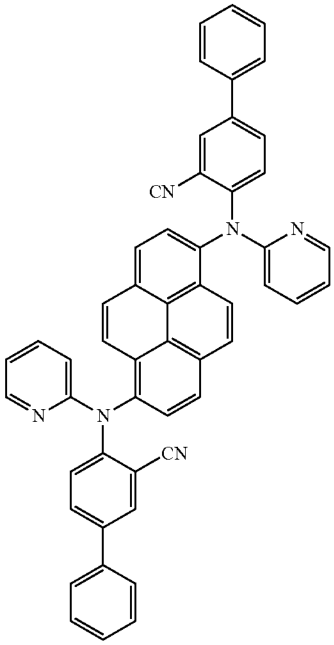
FD5
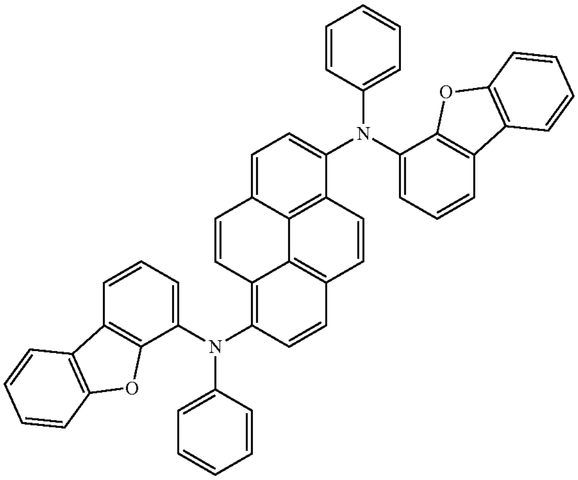
FD6
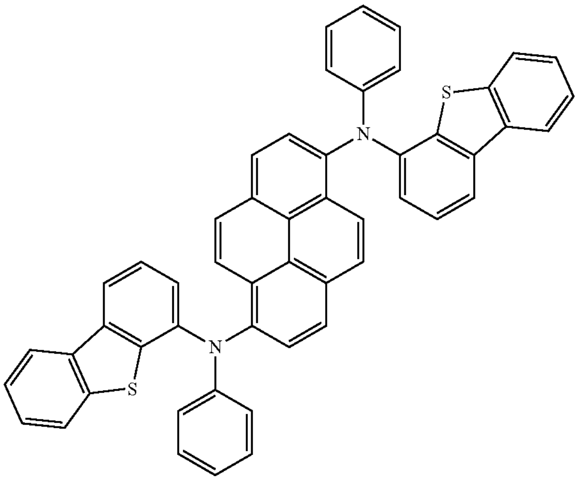

-continued
FD7
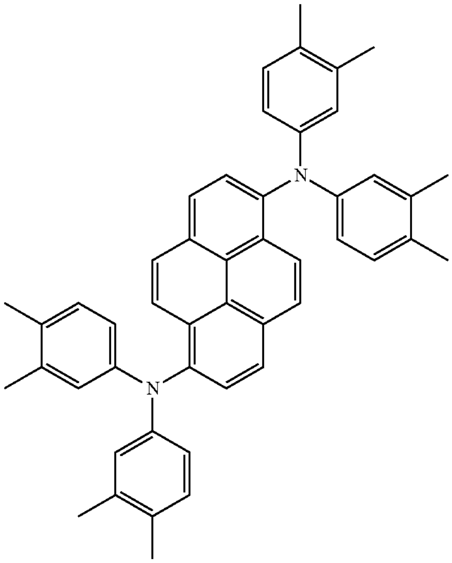
FD8
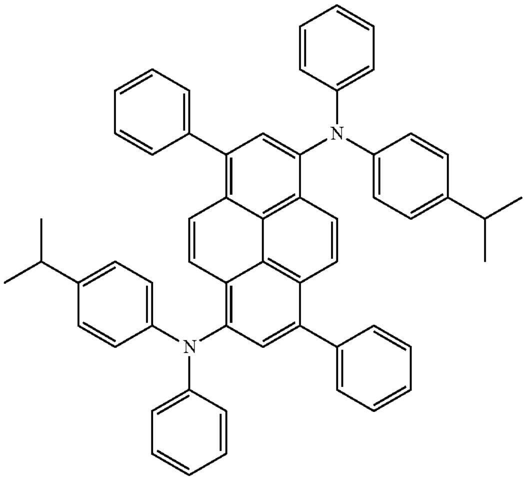
FD9
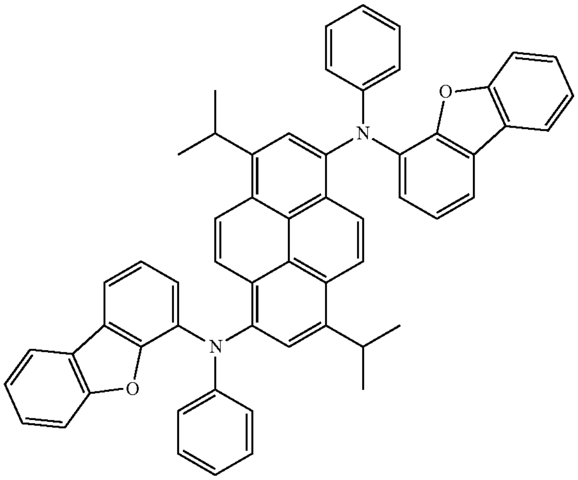
-continued
FD10
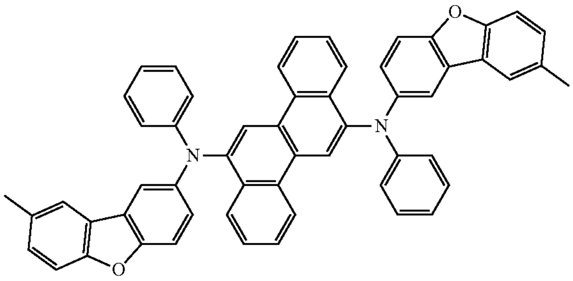
FD11
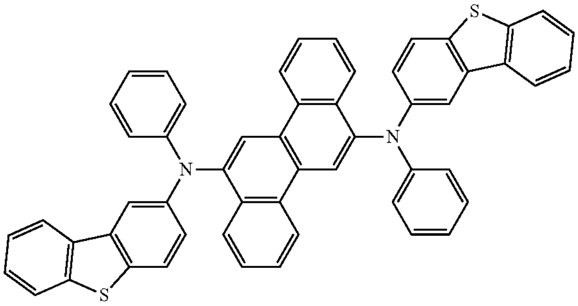
FD12
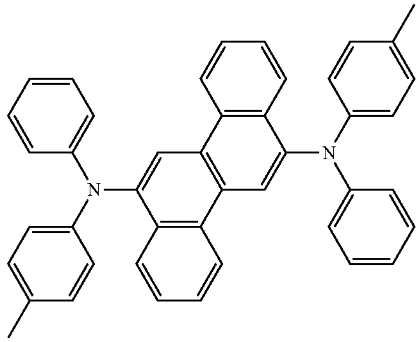
FD13
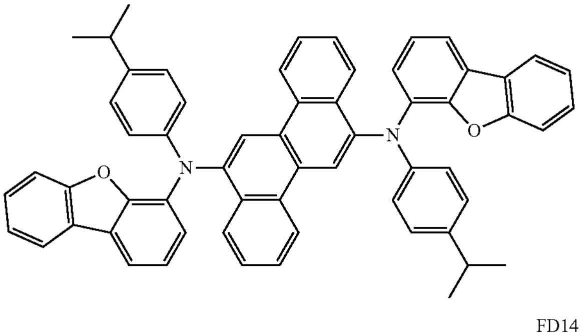
FD14
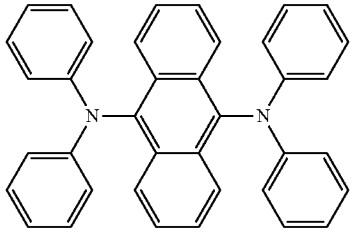

-continued
FD15
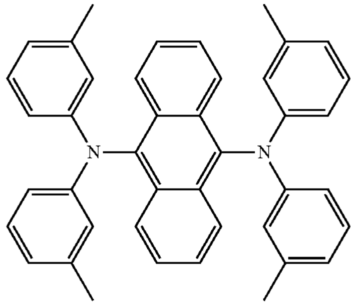
FD16
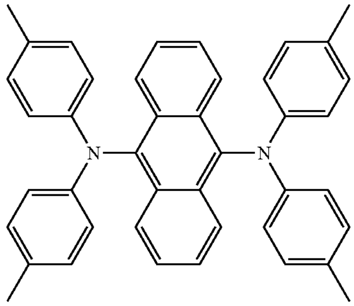
FD17
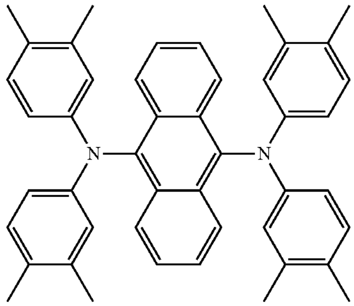
FD18
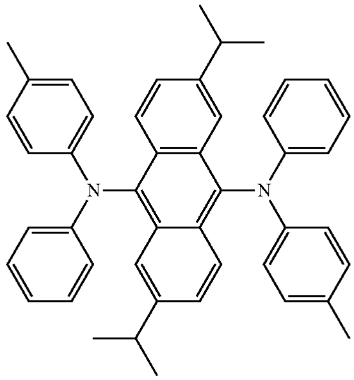
-continued
FD19
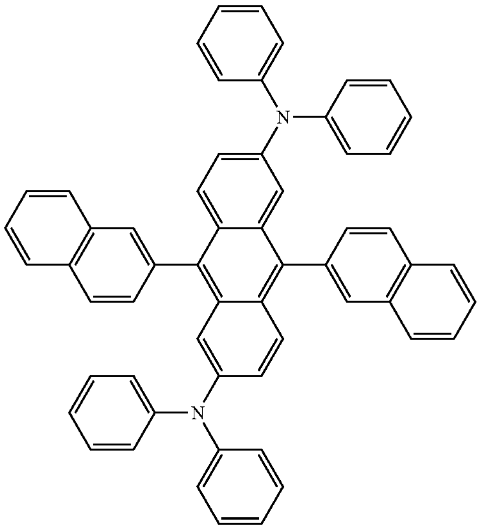
FD20
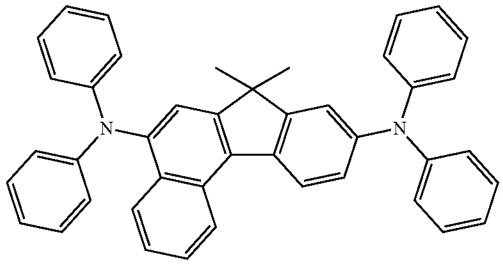
FD21
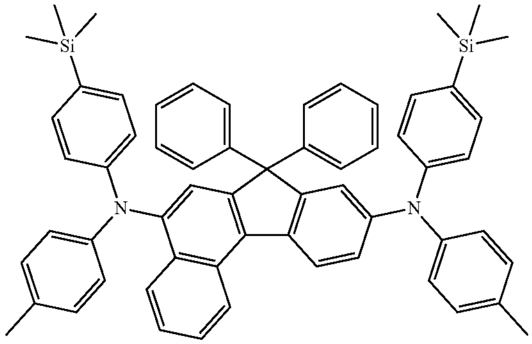
FD22
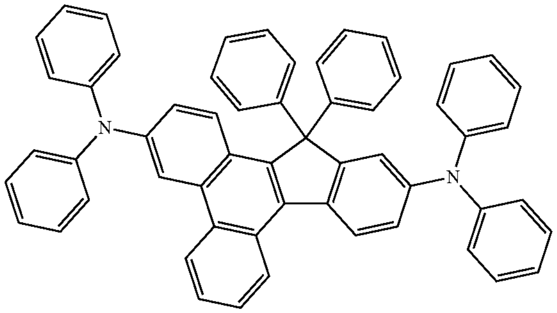

FD23
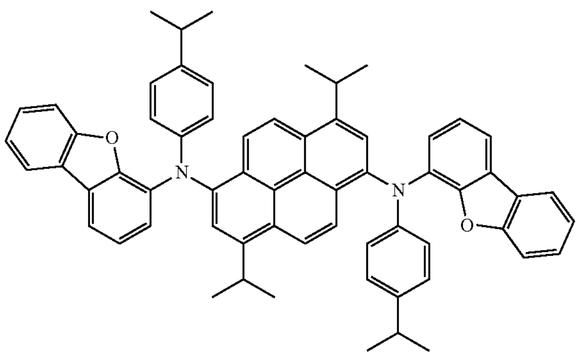
FD24
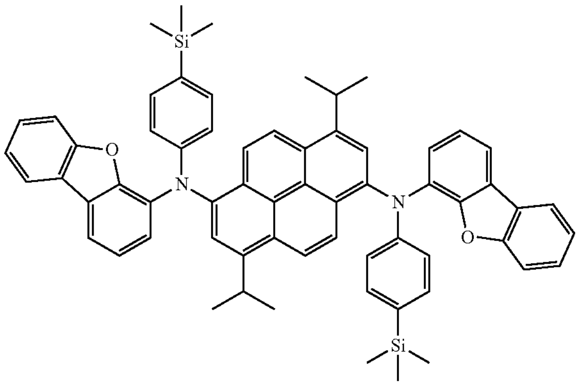
FD25
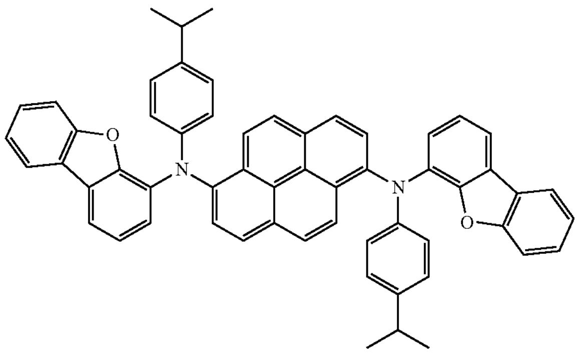
FD26
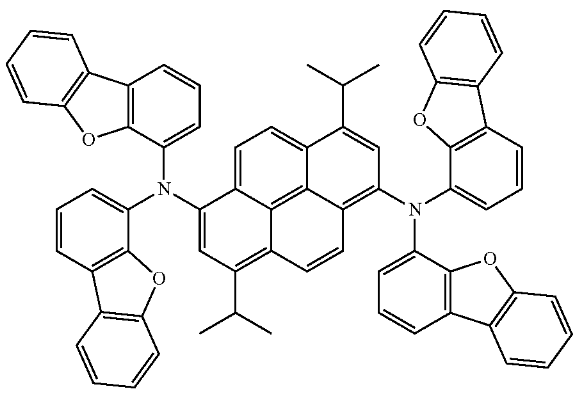
FD27
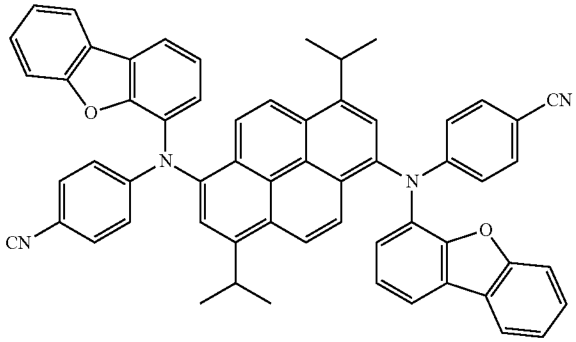
FD28
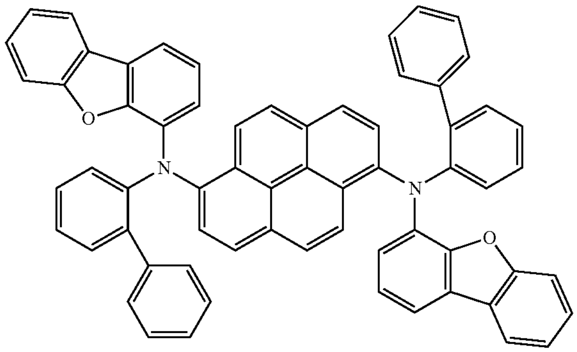
FD29
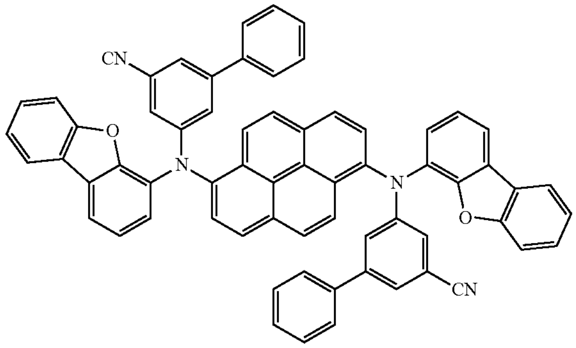
FD30
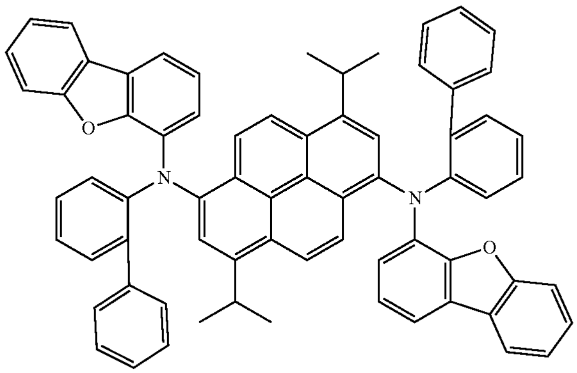

-continued

FD31

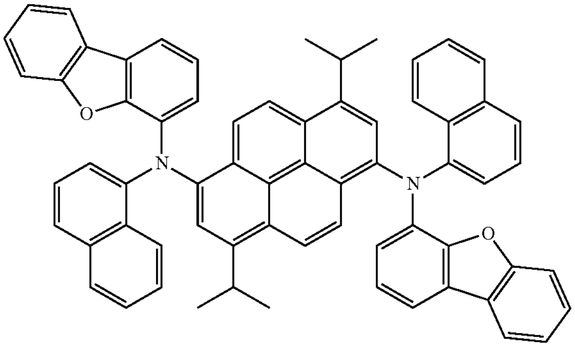

FD32

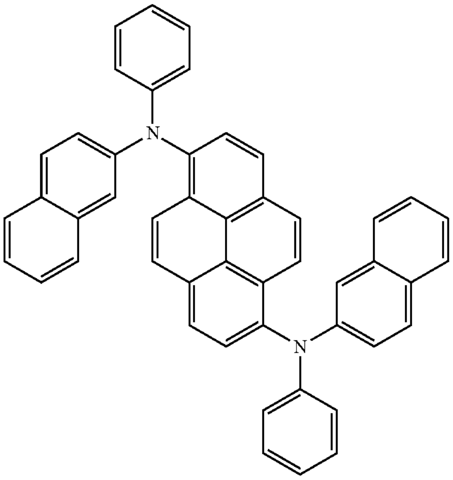

FD33

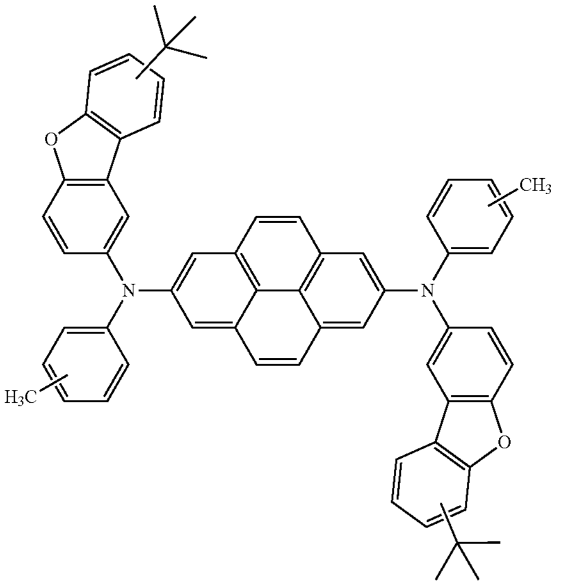

In the light emitting device ED according to an embodiment, the fourth stack ST4 includes the second light emitting layer GEML which emit the light of the second wavelength. The light of the second wavelength may be light of a green wavelength region. In an embodiment, the second wavelength may be about 520 nm to about 600 nm. The second light emitting layer GEML may include an organic material, which emits light having a wavelength of about 520 nm to about 600 nm.

The second light emitting layer GEML may have a single-layered structure. The second light emitting layer GEML having a single-layered structure may have a layer structure in which two different host materials are mixed together in one layer. In an embodiment, the second light emitting layer GEML may have a structure in which a hole transporting host material and an electron transporting host material are mixed together in one layer. The second light emitting layer GEML having a single-layered structure may have a thickness of about 10 nm to about 40 nm. In addition, unlike what is illustrated in FIG. 5A, the second light emitting layer GEML may have a double-layered structure. When the second light emitting layer GEML has a double-layered structure, the double-layered structure may include host materials different from each other, but embodiments of the present disclosure are not limited thereto.

In an embodiment, the second light emitting layer GEML includes a first hole transporting host, a first electron transporting host, and a second dopant. The second light emitting layer GEML may be a layer in which the second dopant that emits the light of the second wavelength is doped in a layer in which the first hole transporting host and the first electron transporting host are mixed together. In an embodiment, the first hole transporting host and the first electron transporting host included in the second light emitting layer GEML may be materials different from the host material included in the first light emitting layers BEML-1, BEML-2, and BEML-3. The second dopant may be a phosphorescent dopant. The second dopant may be a green phosphorescent dopant.

In the light emitting device ED according to an embodiment, the first hole transporting host included in the second light emitting layer GEML may include any one selected from H4-1 to H4-11 below. However, a first hole transport material included in the second light emitting layer GEML is not limited to the following embodiment.

H4-1

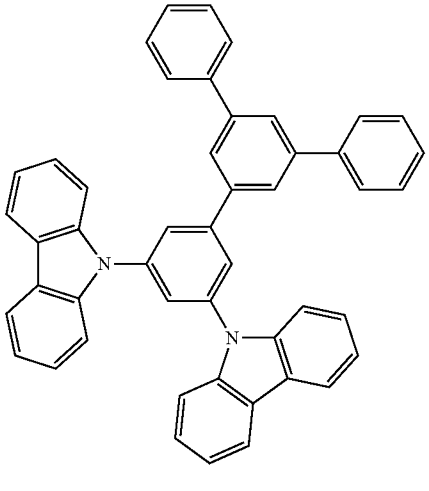

-continued
H4-2
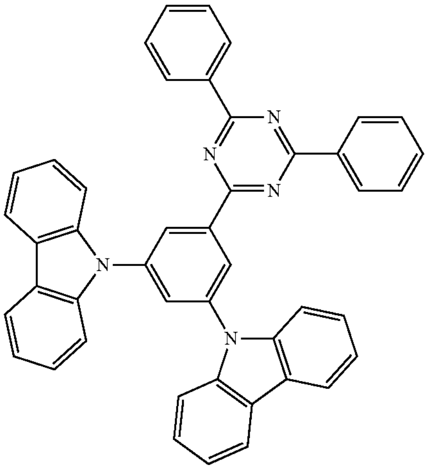
H4-3
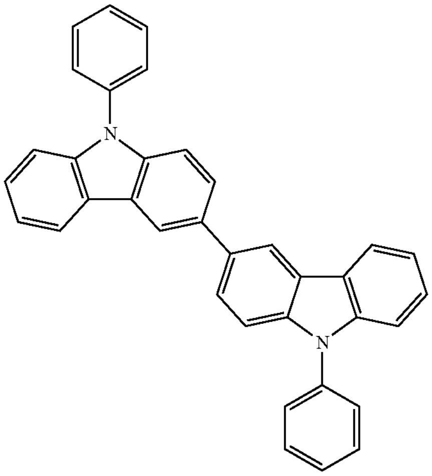
H4-4
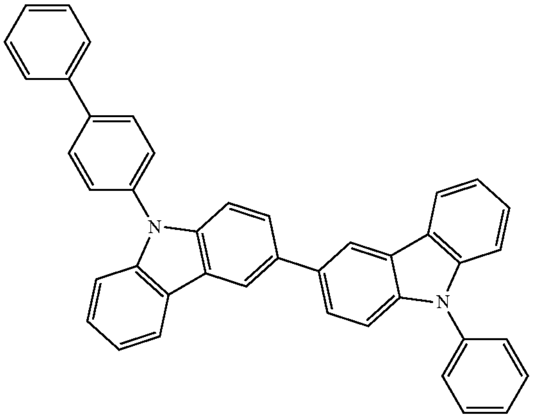
-continued
H4-5
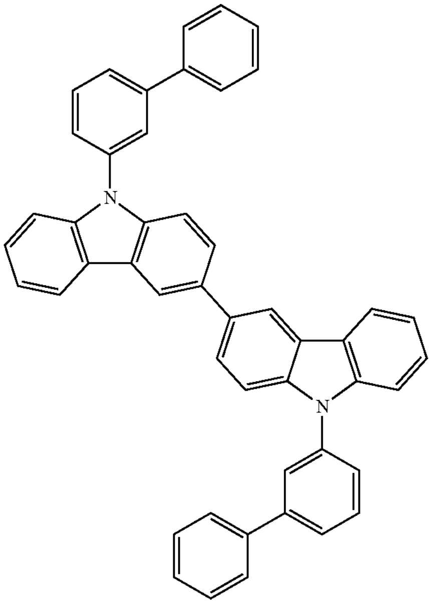
H4-6
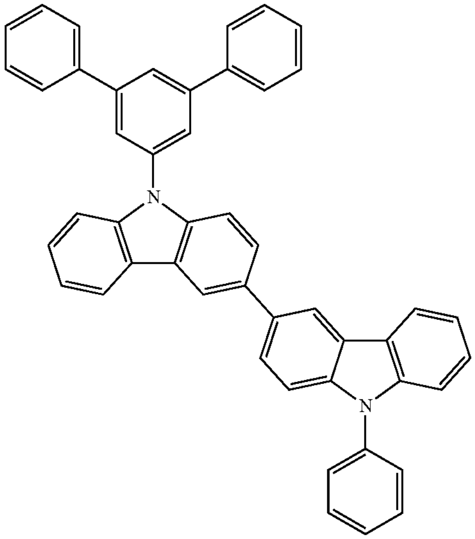

-continued
H4-7
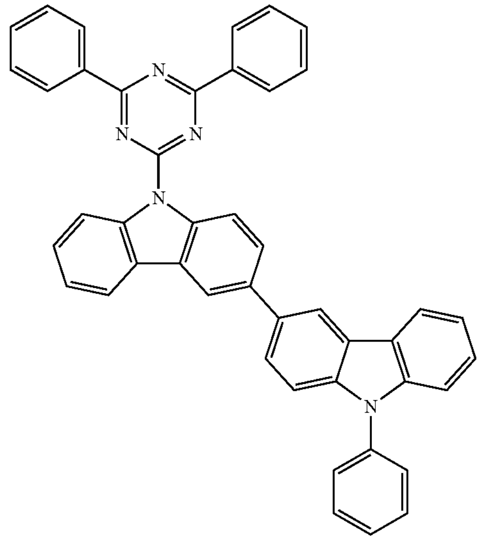
H4-8
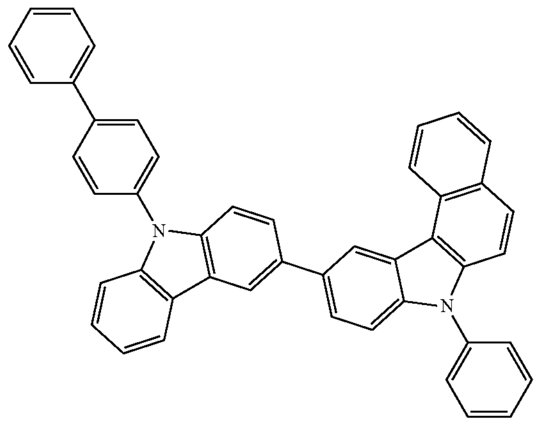
H4-9
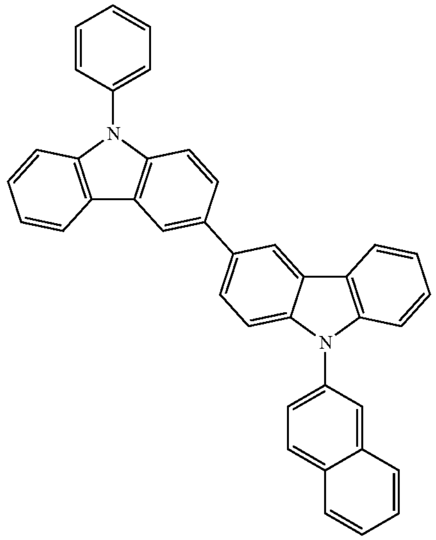
-continued
H4-10
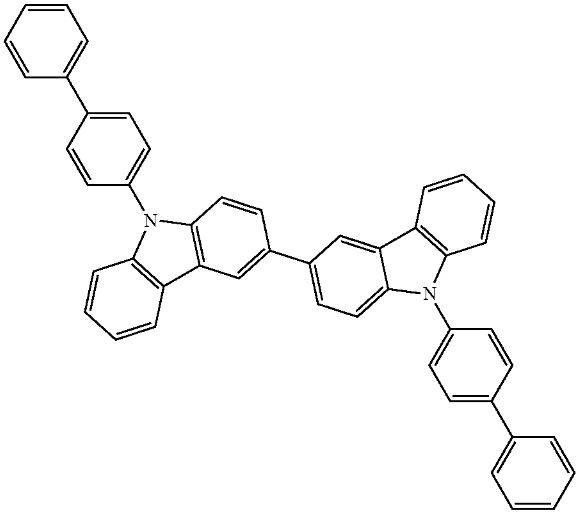
H4-11
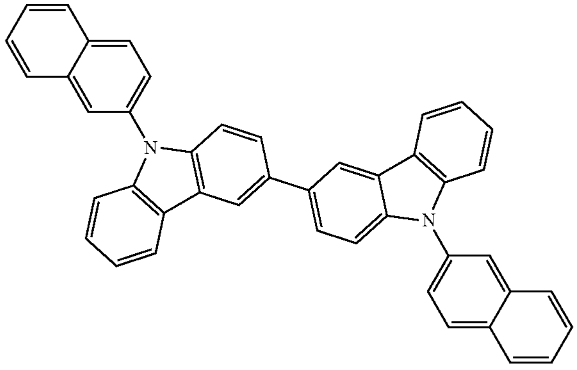
In the light emitting device ED according to an embodiment, a second electron transporting host included in the second light emitting layer GEML may include any one selected from H3-1 to H3-23 below. However, a second electron transport material included in the second light emitting layer GEML is not limited to the following embodiment.
H3-1
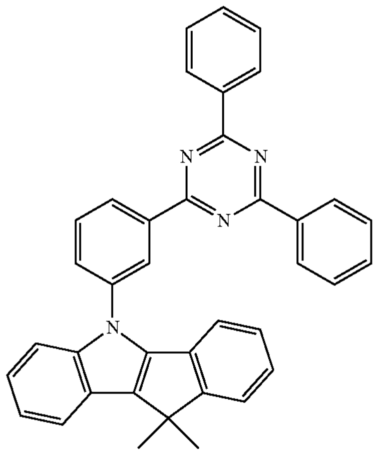

-continued
H3-2
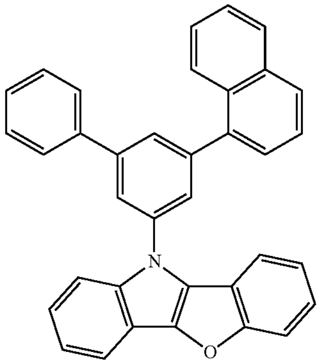
H3-3
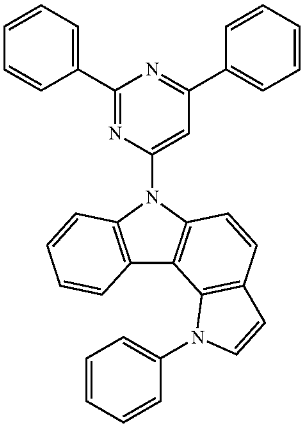
H3-4
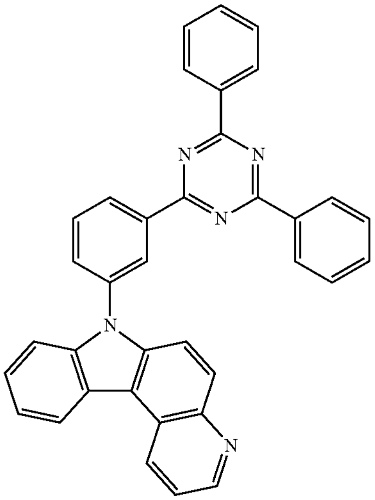
H3-5
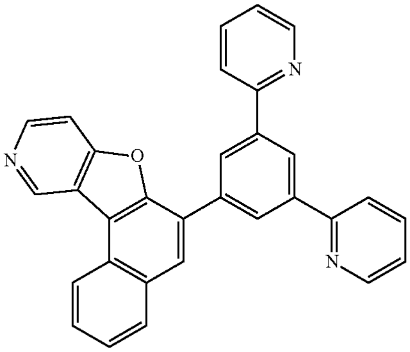
-continued
H3-6
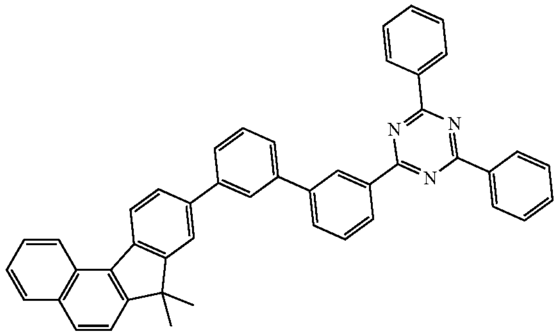
H3-7
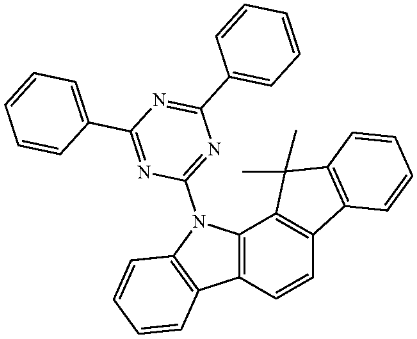
H3-8
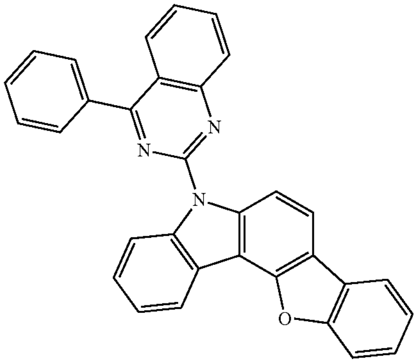
H3-9
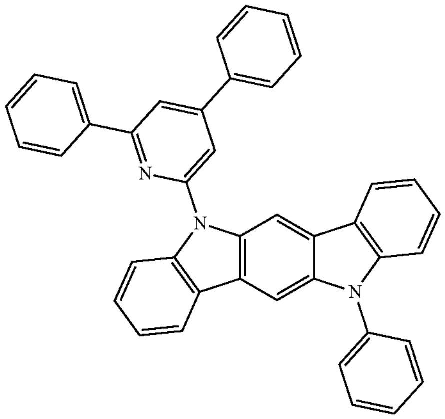

-continued
H3-10
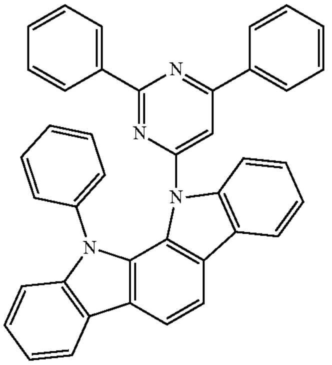
H3-11
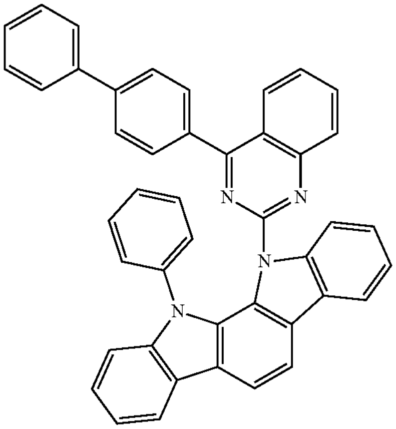
H3-12
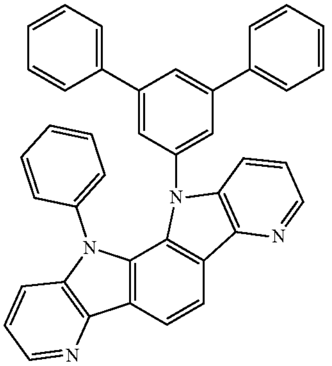
H3-13
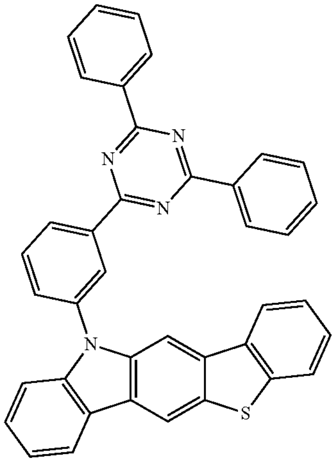
-continued
H3-14
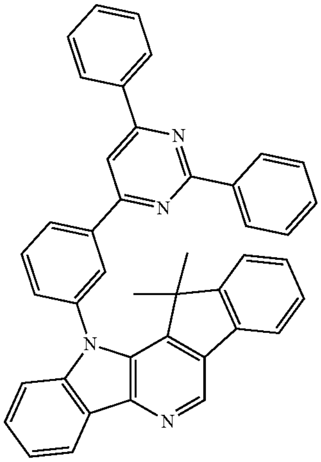
H3-15
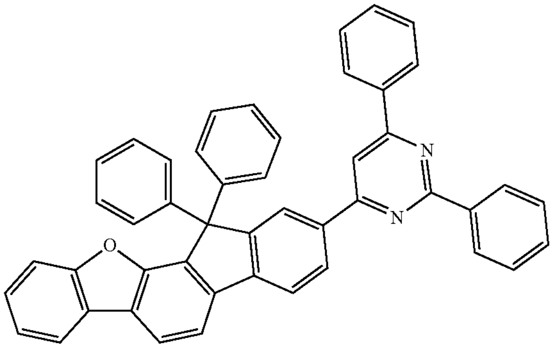
H3-16
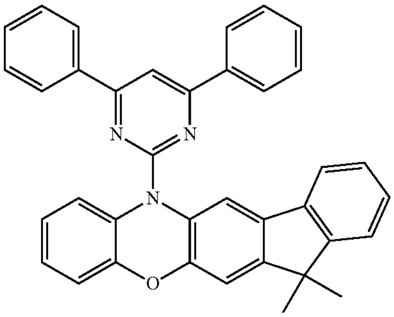

-continued
H3-17
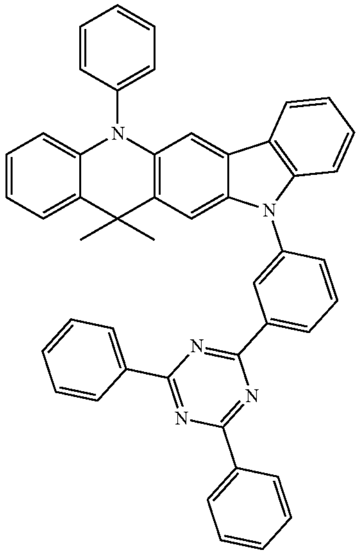
H3-18
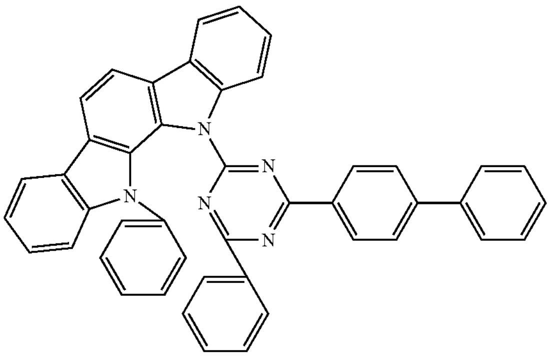
H3-19
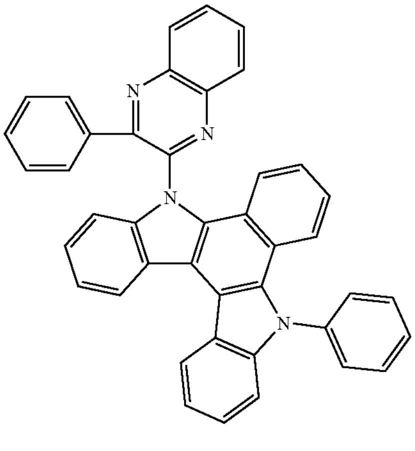
-continued
H3-20
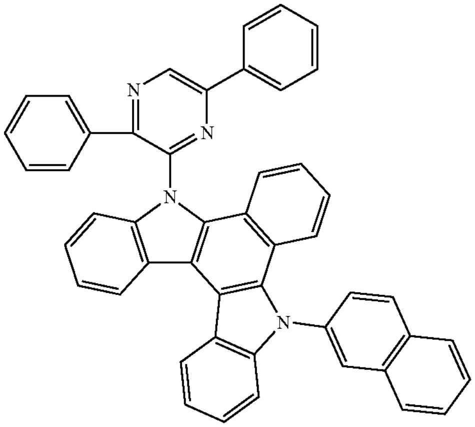
H3-21
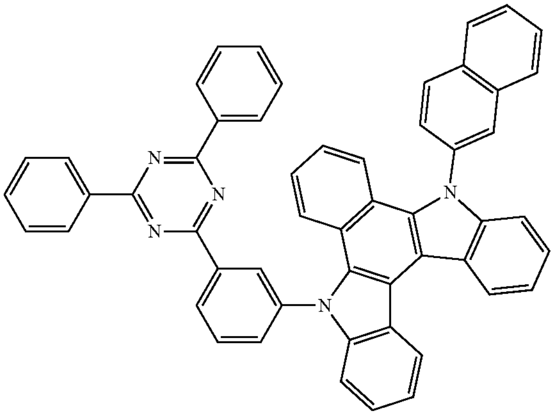
H3-22
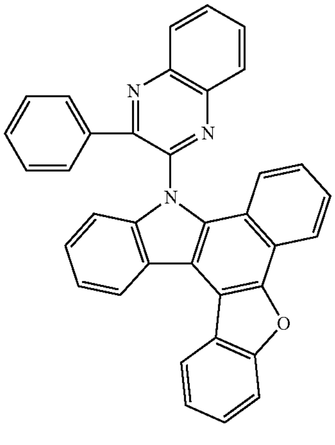

-continued
H3-23
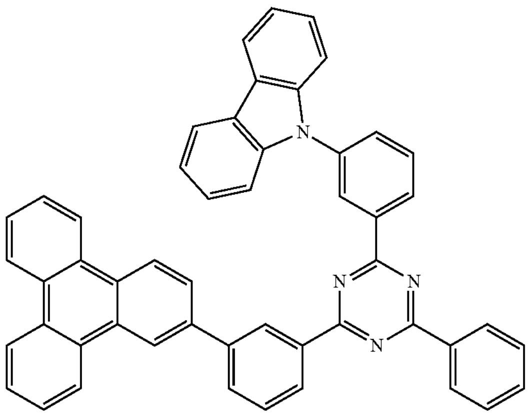
In the light emitting device ED according to an embodiment, the second dopant included in the second light emitting layer GEML may include any one selected from PD1 to PD25 below. However, a second dopant material included in the second light emitting layer GEML is not limited to the following embodiment.
PD1
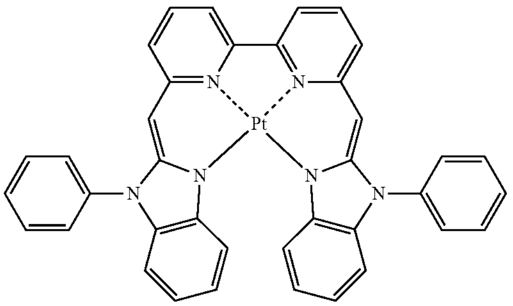
PD2
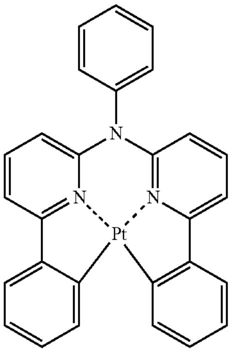
PD3
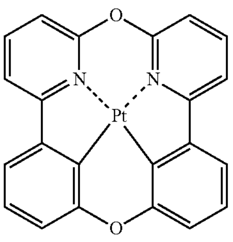
-continued
PD4
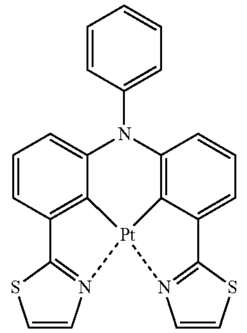
PD5
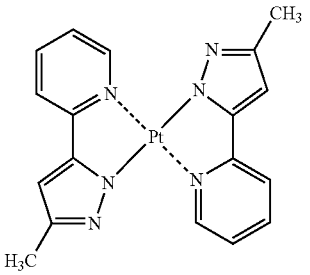
PD6
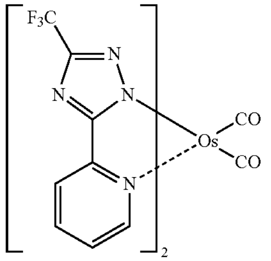
PD7
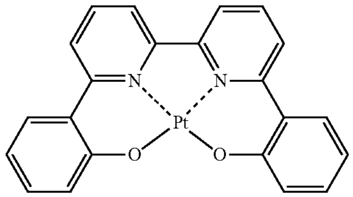
PD8
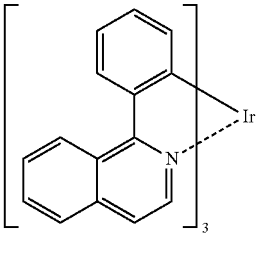
PD9
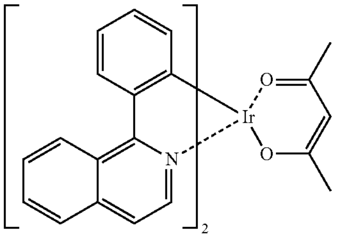

-continued
PD10
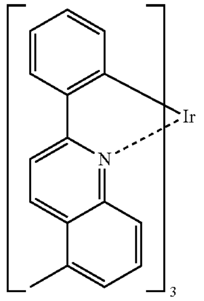
PD11
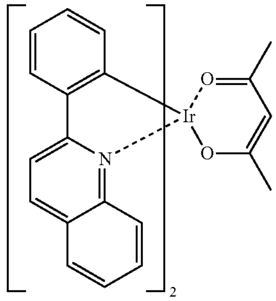
PD12
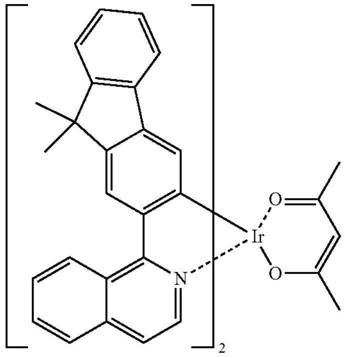
PD13
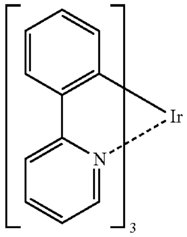
PD14
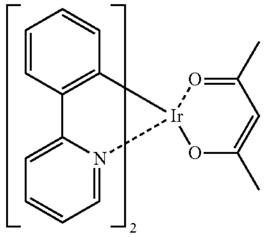
-continued
PD15
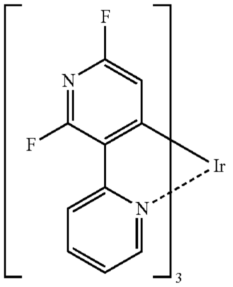
PD16
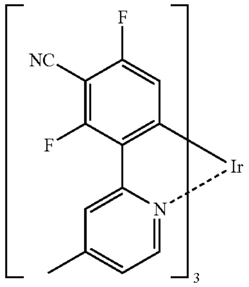
PD17
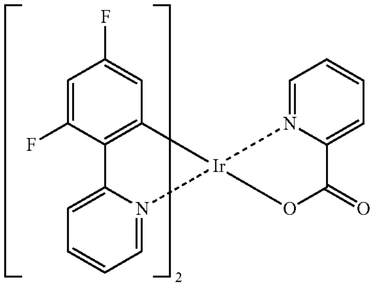
PD18
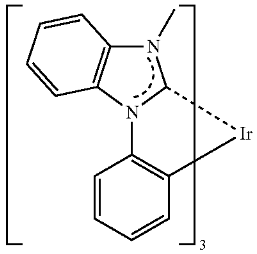
PD19
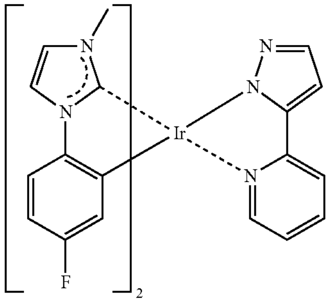

-continued

PD20

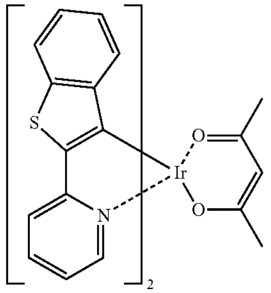

PD21

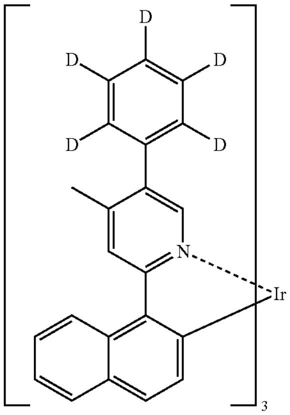

PD22

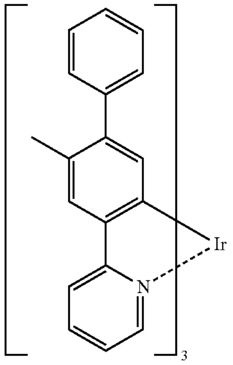

PD23

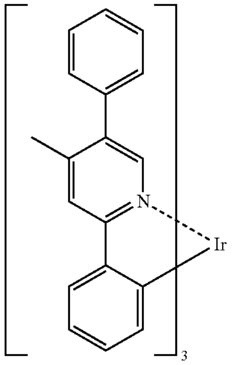

-continued

PD24

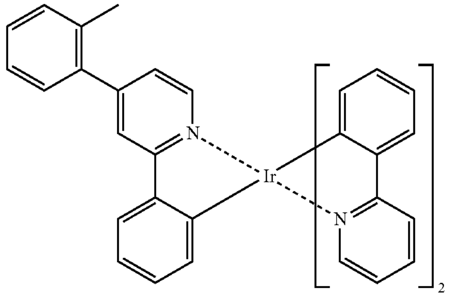

PD25

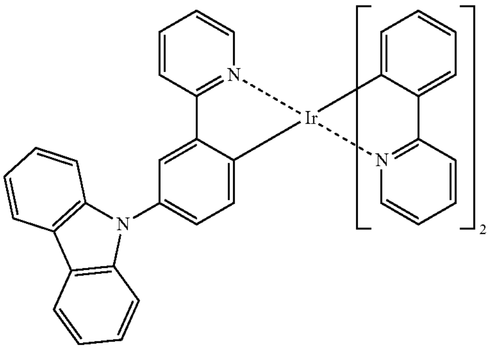

The first stack ST1 may further include the hole transport region HTR which transports holes provided from the first electrode EL1 to the first first-light emitting layer BEML-1, and a first intermediate electron transport region which transports electrons generated from the first charge generation layer CGL1 to the first first-light emitting layer BEML-1.

The hole transport region HTR may include a hole injection layer HIL on the first electrode EL1 and a hole transport layer HTL on the hole injection layer HIL. The hole transport layer HTL may come into contact (e.g., physical contact) with a lower surface of the first first-light emitting layer BEML-1. However, embodiments of the present disclosure are not limited thereto. The hole transport region HTR may further include a hole-side additional layer on the hole transport layer HTL. The hole-side additional layer may include at least one of a hole buffer layer, a light emitting auxiliary layer, or an electron blocking layer. The hole buffer layer may be a layer which increases light emission efficiency by compensating for a resonance distance according to the wavelength of light emitted from a light emitting layer. The electron blocking layer may be a layer which serves to prevent or reduce injection of an electron from an electron transport region to a hole transport region.

The first intermediate electron transport region may include a first intermediate electron transport layer METL1 on the first first-light emitting layer BEML-1. The first intermediate electron transport layer METL1 is between the first first-light emitting layer BEML-1 and the first charge generation layer CGL1, and may come into contact (e.g., physical contact) with each of the first first-light emitting layer BEML-1 and the first charge generation layer CGL1. However, embodiments of the present disclosure are not limited thereto. The first intermediate electron transport region may further include a first intermediate electron-side additional layer between the first intermediate electron transport layer METL1 and the first first-light emitting layer BEML-1. The first intermediate electron-side additional layer may include at least one selected from an electron buffer layer and a hole blocking layer. In addition, a first intermediate electron injection layer may be between the first intermediate electron transport layer METL1 and the first charge generation layer CGL1.

The second stack ST2 may further include a first intermediate hole transport region MHTR1 which transports holes generated from the first charge generation layer CGL1 to the second first-light emitting layer BEML-2, and a second intermediate electron transport region which transports electrons provided from the second charge generation layer CGL2 to the second first-light emitting layer BEML-2.

The first intermediate hole transport region MHTR1 may include a first intermediate hole injection layer MHIL1 on the first charge generation layer CGL1, and a first intermediate hole transport layer MHTL1 on the first intermediate hole injection layer MHIL1. The first intermediate hole transport layer MHTL1 may come into contact (e.g., physical contact) with a lower surface of the second first-light emitting layer BEML-2. However, embodiments of the present disclosure are not limited thereto. The first intermediate hole transport region MHTR1 may further include a first intermediate hole-side additional layer on the first intermediate hole transport layer MHTL1. The first intermediate hole-side additional layer may include at least one of a hole buffer layer, a light emitting auxiliary layer, or an electron blocking layer.

The second intermediate electron transport region may include a second intermediate electron transport layer METL2 on the second first-light emitting layer BEML-2. The second intermediate electron transport layer METL2 is between the second first-light emitting layer BEML-2 and the second charge generation layer CGL2, and may come into contact (e.g., physical contact) with each of the second first-light emitting layer BEML-2 and the second charge generation layer CGL2. However, embodiments of the present disclosure are not limited thereto. The second intermediate electron transport region may further include a second intermediate electron-side additional layer between the second intermediate electron transport layer METL2 and the second first-light emitting layer BEML-2. The second intermediate electron-side additional layer may include at least one selected from an electron buffer layer and a hole blocking layer. In addition, a second intermediate electron injection layer may be between the second intermediate electron transport layer METL2 and the second charge generation layer CGL2.

The third stack ST3 may further include a second intermediate hole transport region MHTR2 which transports holes generated from the second charge generation layer CGL2 to the third first-light emitting layer BEML-3, and a third intermediate electron transport region which transports electrons provided from the third charge generation layer CGL3 to the third first-light emitting layer BEML-3.

The second intermediate hole transport region MHTR2 may include a second intermediate hole injection layer MHIL2 on the second charge generation layer CGL2, and a second intermediate hole transport layer MHTL2 on the second intermediate hole injection layer MHIL2. The second intermediate hole transport layer MHTL2 may come into contact (e.g., physical contact) with a lower surface of the third first-light emitting layer BEML-3. However, embodiments of the present disclosure are not limited thereto. The second intermediate hole transport region MHTR2 may further include a second intermediate hole-side additional layer on the second intermediate hole transport layer MHTL2. The second intermediate hole-side additional layer may include at least one of a hole buffer layer, a light emitting auxiliary layer, or an electron blocking layer.

The third intermediate electron transport region may include a third intermediate electron transport layer METL3 on the third first-light emitting layer BEML-3. The third intermediate electron transport layer METL3 is between the third first-light emitting layer BEML-3 and the third charge generation layer CGL3, and may come into contact (e.g., physical contact) with each of the third first-light emitting layer BEML-3 and the third charge generation layer CGL3. However, embodiments of the present disclosure are not limited thereto. The third intermediate electron transport region may further include a third intermediate electron-side additional layer between the third intermediate electron transport layer METL3 and the third first-light emitting layer BEML-3. The third intermediate electron-side additional layer may include at least one selected from an electron buffer layer and a hole blocking layer. In addition, a third intermediate electron injection layer may be between the third intermediate electron transport layer METL3 and the third charge generation layer CGL3.

The fourth stack ST4 may further include a third intermediate hole transport region MHTR3 which transports holes generated from the third charge generation layer CGL3 to the second light emitting layer GEML, and the electron transport region ETR which transports electrons provided from the second electrode EL2 to the second light emitting layer GEML. The fourth stack ST4 may include the electron transport region ETR including the electron injection layer EIL of an embodiment described above.

The third intermediate hole transport region MHTR3 may include a third intermediate hole injection layer MHIL3 on the third charge generation layer CGL3, and a third intermediate hole transport layer MHTL3 on the third intermediate hole injection layer MHIL3. The third intermediate hole transport layer MHTL3 may come into contact (e.g., physical contact) with a lower surface of the second light emitting layer GEML. However, embodiments of the present disclosure are not limited thereto. The third intermediate hole transport region MHTR3 may further include a third intermediate hole-side additional layer on the third intermediate hole transport layer MHTL3. The third intermediate hole-side additional layer may include at least one of a hole buffer layer, a light emitting auxiliary layer, or an electron blocking layer.

The electron transport region ETR may include the electron transport layer ETL on the second light emitting layer GEML, and the electron injection layer EIL on the electron transport layer ETL. The electron transport layer ETL may come into contact (e.g., physical contact) with the second light emitting layer GEML. However, embodiments of the present disclosure are not limited thereto. The electron transport region ETR may further include an electron-side additional layer between the electron transport layer ETL and the second light emitting layer GEML. The electron-side additional layer may include at least one selected from an electron buffer layer and a hole blocking layer.

Figure 5B:
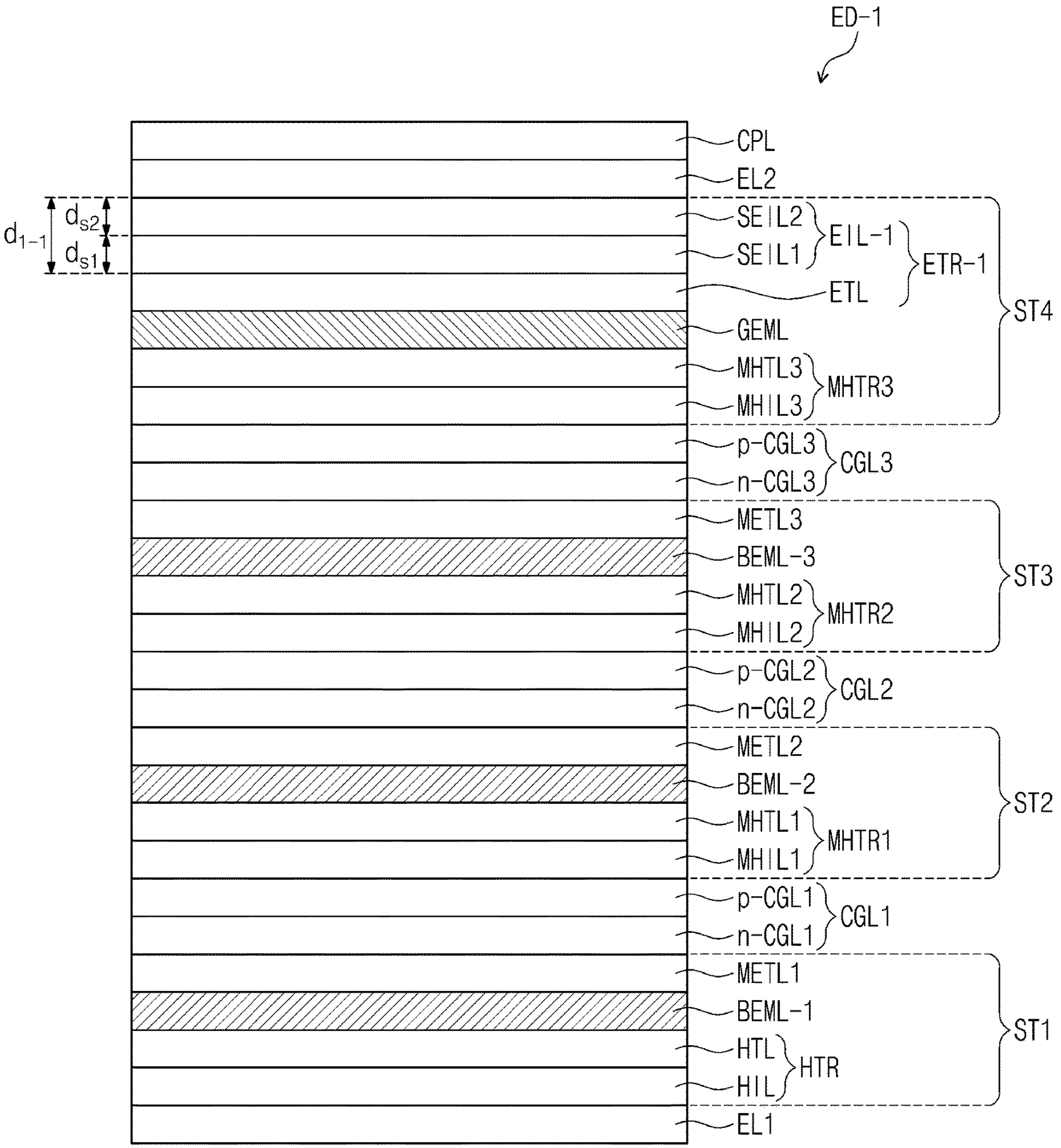
Figure 5C:
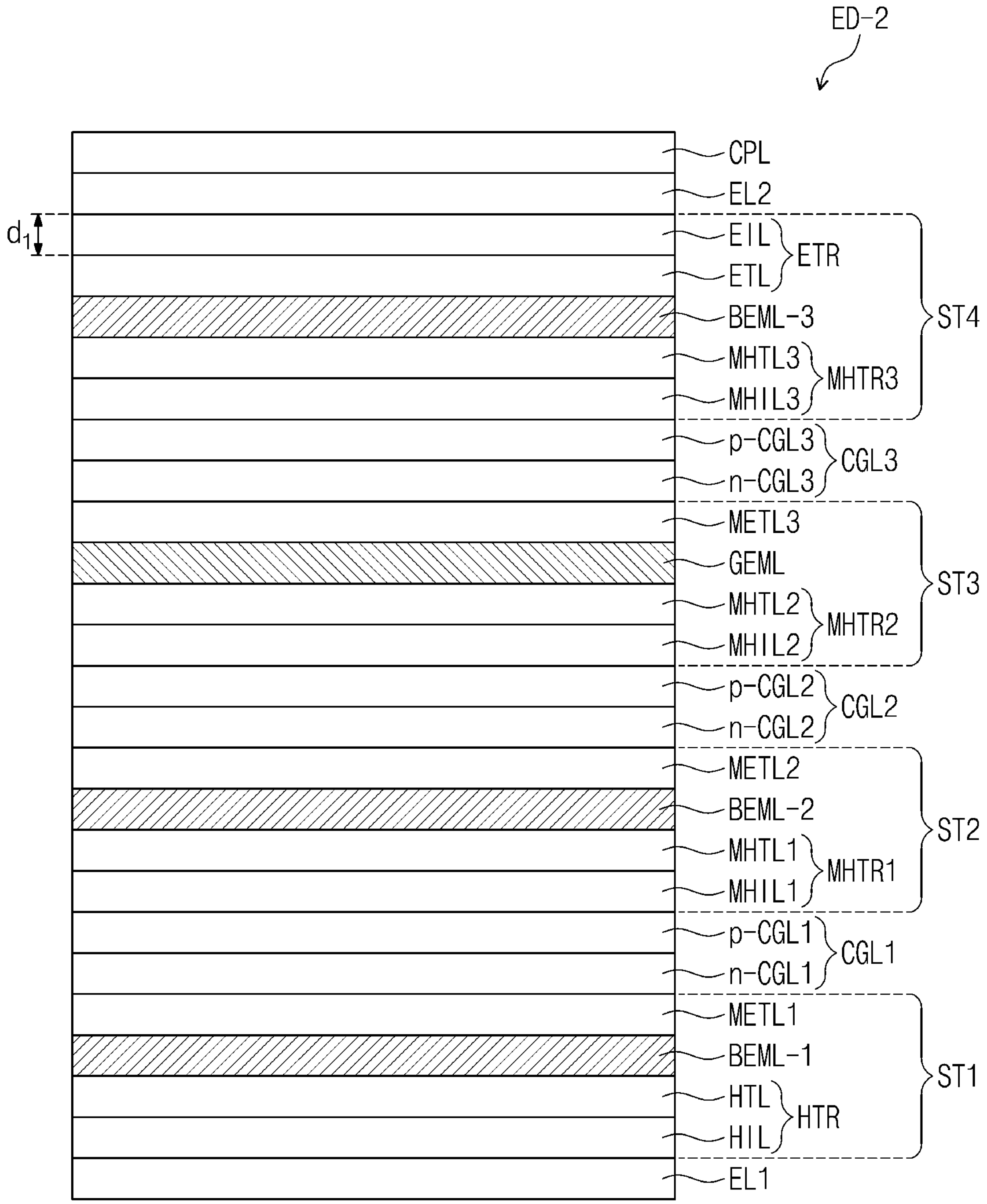
Figure 5D:
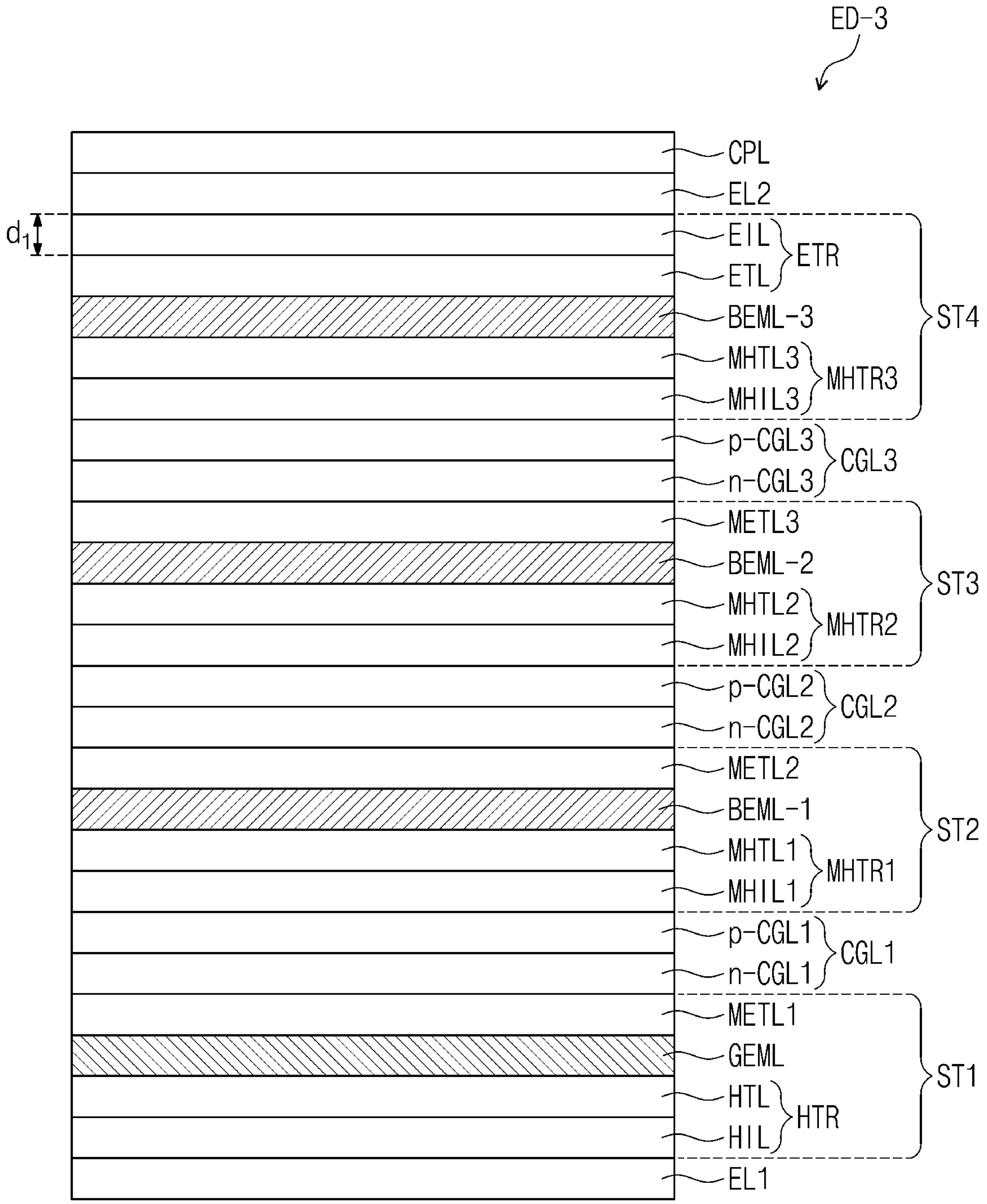

FIG. 5B to FIG. 5D is respectively a cross-sectional view of light emitting devices ED-1, ED-2, and ED-3 according to embodiments of the present disclosure. Hereinafter, in describing the light emitting devices ED-1, ED-2, and ED-3 according to embodiments of the present disclosure with reference to FIG. 5B to FIG. 5D, the same reference numerals are given to the components described above with reference to FIG. 5A, and duplicative descriptions thereof will not be repeated here.

Referring to FIG. 5B, an electron transport region ETR-1 may be below the second electrode EL2. The electron transport region ETR-1 may include an electron injection layer EIL-1 below the second electrode EL2, and an electron transport layer ETL below the electron injection layer EIL-1. The light emitting device ED-1 according to an embodiment is different from the light emitting device ED illustrated in FIG. 5A in that the electron injection layer EIL-1 has a double-layered structure. The electron injection layer EIL-1 of an embodiment may include a first sub-electron injection layer SEIL1 and a second sub-electron injection layer SEIL2. The first sub-electron injection layer SEIL1 and the second sub-electron injection layer SEIL2 may come into contact (e.g., physical contact) with each other.

In the light emitting device ED-1 according to embodiments of the present disclosure, the electron injection layer EIL-1 includes a double-layered structure formed of a metal material, so that the interface between the electron injection layer EIL-1 and adjacent functional layers may be stabilized, and accordingly, the stability of a thin film may be improved to improve the luminescence efficiency and lifespan properties of the light emitting device ED-1.

The second sub-electron injection layer SEIL2 may be below the second electrode EL2. The second sub-electron injection layer SEIL2 may be directly on a lower surface of the second electrode EL2. An upper surface of the second sub-electron injection layer SEIL2 and the lower surface of the second electrode EL2 may contact (e.g., physically contact) each other.

The second sub-electron injection layer SEIL2 may include ytterbium (Yb). Ytterbium (Yb) is a metal having a low work function, and may lower a driving voltage by facilitating the injection of electrons to a light emitting layer. Therefore, it is possible to expect improved electron injection properties by including ytterbium (Yb) in the sub-electron injection layer SEIL2 directly on the second electrode EL2. In addition, because the second sub-electron injection layer SEIL2 including ytterbium (Yb) whose self-diffusion coefficient is smaller than that of magnesium (Mg) is adjacent to the second electrode EL2, the interface between the second electrode EL2 and the electron injection layer EIL-2 may be stabilized, so that the stability of the light emitting device ED-1 may be enhanced. In an embodiment, the second sub-electron injection layer SEIL2 may be formed of a single material of ytterbium (Yb). When the second sub-electron injection layer SEIL2 is formed of a single material of ytterbium (Yb), an effective bonding area between metals may be increased at the interface between the second electrode EL2 and the second sub-electron injection layer SEIL2. Accordingly, the coverage properties of the second electrode EL2 are improved to prevent or reduce the pixel shrinkage of the light emitting device ED-1, and accordingly, the lifespan of the light emitting device ED-1 may be improved.

The first sub-electron injection layer SEIL1 may include magnesium (Mg). In an embodiment, the first sub-electron injection layer SEIL1 may be formed of a single material of magnesium (Mg). When the first sub-electron injection layer SEIL1 including magnesium (Mg) is below the second sub-electron injection layer SEIL2, the light transmittance rate of the electron injection layer EIL-1 is increased to improve the efficiency of the light emitting device ED-1. In addition, magnesium (Mg) included in the first sub-electron injection layer SEIL1 may prevent or reduce distribution of ytterbium (Yb) included in the second sub-electron injection layer SEIL2 to a functional layer below the electron injection layer EIL-1. Due to the material properties of a metal included in the electron injection layer EIL-1, physical distribution in which some of metal particles move may occur. The first sub-electron injection layer SEIL1 may be below the second sub-electron injection layer SEIL2 to prevent or reduce distribution of metal particles included in the second sub-electron injection layer SEIL2 to a lower layer, for example, the electron transport layer ETL and the light emitting layers BEML-1, BEML-2, BEML-3, GEML. Accordingly, it is possible to reduce the generation of defects such as pixel shrinkage and/or dark spots during device driving.

In an embodiment, a thickness $d_{1-1}$ of the electron injection layer EIL-1 may be about 1 nm to about 2 nm. When the thickness $d_{1-1}$ of the electron injection layer EIL-1 satisfies the above range, excellent electron injection properties may be implemented without a substantial increase in the driving voltage, and the luminescence efficiency of the light emitting device ED-1 may be improved. When the thickness $d_{1-1}$ of the electron injection layer EIL-1 is less than about 1 nm, the surface of the electron injection layer EIL-1 becomes unstable due to a small thickness, so that the coverage properties of the second electrode EIL may be degraded. When the thickness $d_{1-1}$ of the electron injection layer EIL-1 is greater than about 2 nm, a driving voltage may increase due to a large thickness, and the device lifespan may be reduced.

In an embodiment, a thickness $d_{S1}$ of the first sub-electron injection layer SEIL1 may be about 0.5 nm to about 0.9 nm. When the thickness $d_{S1}$ of the first sub-electron injection layer SEIL1 is less than about 0.5 nm, due to a smaller thickness, thin film stability may be degraded to reduce device lifespan, and transmittance may be reduced to degrade luminescence efficiency. When the thickness $d_{S1}$ of the first sub-electron injection layer SEIL1 is greater than about 0.9 nm, electron injection properties may be degraded, so that a driving voltage may be increased, and luminescence efficiency and lifespan may be degraded. When the thickness of the first sub-electron injection layer SEIL1 satisfies the above range, it is possible to secure electron injection properties and increase the transmittance rate of light emitted from the light emitting layers BEML-1, BEML-2, BEML-3, and GEML.

In an embodiment, a thickness $d_{S2}$ of the second sub-electron injection layer SEIL2 may be about 0.1 nm to about 0.5 nm. When the thickness $d_{S2}$ of the second sub-electron injection layer SEIL2 is less than about 0.1 nm, due to a smaller thickness, the coverage properties of the second electrode EL2 may be degraded, and thus, pixel shrinkage may occur, and lifespan properties may be degraded. When the thickness $d_{S2}$ of the second sub-electron injection layer SEIL2 is greater than about 0.5 nm, electron injection properties may be degraded, so that the luminescence efficiency and lifespan properties of the light emitting device ED-1 may be degraded.

Referring to FIG. 5C and FIG. 5D, when compared to the light emitting device ED illustrated in FIG. 5A, in the light emitting devices ED-2 and ED-3 of an embodiment, the second light emitting layer GEML may not be included in the fourth stack ST4, but in a different stack. For example, as in the light emitting device ED-2 of an embodiment illustrated in FIG. 5C, the third stack ST3 may include the second light emitting layer GEML, and each of the first stack ST1, the second stack ST2, and the fourth stack ST4 may respectively include the first light emitting layers BEML-1, BEML-2, and BEML-3. In some embodiments, as in the light emitting device ED-3 of an embodiment illustrated in FIG. 5D, the first stack ST1 may include the second light emitting layer GEML, and the second stack ST2, the third stack ST3, and the fourth stack ST4 may respectively include the first light emitting layers BEML-1, BEML-2, and BEML-3. In some embodiments, the second stack ST2 may include the second light emitting layer GEML, and the remaining first stack ST1, the third stack ST3, and the fourth stack ST4 may respectively include first light emitting layers BEML-1, BEML-2, and BEML-3.

Referring to FIG. 5A to FIG. 5D together, in the light emitting devices ED, ED-1, ED-2, and ED-3 according to an embodiment, the first electrode EL1 has conductivity (e.g., electrical conductivity). The first electrode EL1 may be formed of a metal material, a metal alloy, and/or a conductive compound. The first electrode EL1 may be an anode or a cathode. However, embodiments of the present disclosure are not limited thereto. In addition, the first electrode EL1 may be a pixel electrode.

In the light emitting devices ED, ED-1, ED-2, and ED-3 according to an embodiment, the first electrode EL1 may be a reflective electrode. For example, the first electrode EL1 may include highly reflective Ag, Mg, Cu, Al, Pt, Pd, Au, Ni, Nd, Ir, Cr, Li, Ca, LiF/Ca, LiF/Al, Mo, Ti, W, In, Zn, Sn, and/or a compound or mixture thereof (for example, a mixture of Ag and Mg). In some embodiments, the first electrode EL1 may have a multi-layered structure including a reflective film formed of any one of the above materials, and a transparent conductive film formed of indium tin oxide (ITO), indium zinc oxide (IZO), zinc oxide (ZnO), indium tin zinc oxide (ITZO), and/or the like. For example, the first electrode EL1 may have a two-layered structure of ITO/Ag or a three-layered structure of ITO/Ag/ITO, but is not limited thereto. In addition, embodiments of the present disclosure are not limited thereto. The first electrode EL1 may include any one of the above-described metal materials, a combination of two or more selected from the above-described metal materials, an oxide of any one of the above-described metal materials, and/or the like. The thickness of the first electrode EL1 may be about 70 nm to about 1000 nm. For example, the thickness of the first electrode EL1 may be about 100 nm to about 300 nm.

In the light emitting devices ED, ED-1, ED-2, and ED-3 according to an embodiment, the hole transport region HTR and the intermediate hole transport regions MHTR1, MHTR2, and MHTR3 may have a single-layered structure having a single layer formed of a single material, a single-layered structure having a single layer formed of a plurality of different materials, or a multi-layered structure having a plurality of layers formed of a plurality of different materials.

Each of the hole transport region HTR and the intermediate hole transport regions MHTR1, MHTR2, and MHTR3 may be formed using various suitable methods such as vacuum deposition, spin coating, casting, Langmuir-Blodgett (LB), inkjet printing, laser printing, laser induced thermal imaging (LITI), and/or the like.

Each of the hole transport region HTR and the intermediate hole transport regions MHTR1, MHTR2, and MHTR3 may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino]triphenylamine (m-MTDATA), 4,4'4"-Tris(N,N-diphenylamino)triphenylamine (TDATA), 4,4',4"-tris[N(2-naphthyl)-N-phenylamino]-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonic acid (PANI/CSA), Polyaniline/Poly(4-styrenesulfonate) (PANI/PSS), N,N'-di(naphthalene-I-yl)-N,N'-diphenyl-benzidine (NPB), triphenylamine-containing polyether ketone (TPAPEK), 4-Isopropyl-4'-methyldiphenyliodonium [Tetrakis(pentafluorophenyl) borate], dipyrazino[2,3-f: 2',3'-h]quinoxaline-2,3,6,7,10,11-hexacarbonitrile (HATCN), and/or the like.

Each of the hole transport region HTR and the intermediate hole transport regions MHTR1, MHTR2, and MHTR3 may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(naphthalene-I-yl)-N,N'-diphenyl-benzidine (NPB), 4,4'-Cyclohexylidene bis[N,N-bis(4-methylphenyl)benzenamine](TAPC), 4,4'-Bis[N,N'-(3-tolyl)amino]-3,3'-dimethylbiphenyl (HMTPD), (1,3-Bis(N-carbazolyl)benzene (mCP), and/or the like.

In addition, each of the hole transport region HTR and the intermediate hole transport regions MHTR1, MHTR2, and MHTR3 may include CzSi(9-(4-tert-Butylphenyl)-3,6-bis(triphenylsilyl)-9H-carbazole), 9-phenyl-9H-3,9'-bicarbazole (CCP), 1,3-bis(1,8-dimethyl-9H-carbazol-9-yl)benzene (mDCP), and/or the like.

The hole transport region HTR may include the above-described compounds of the hole transport region in at least one of the hole injection layer HIL, the hole transport layer HTL, or the hole-side additional layer. The intermediate hole transport regions MHTR1, MHTR2, and MHTR3 may include the above-described compounds of the hole transport region in at least one of the intermediate hole injection layers MHIL1, MHIL2, and MHIL3, the intermediate hole transport layers MHTL1, MHTL2, and MHTL3, or an intermediate hole-side additional layer.

The thickness of each of the hole transport region HTR and the intermediate hole transport regions MHTR1, MHTR2, and MHTR3 may be about 10 nm to about 1000 nm, for example, about 10 nm to about 500 nm. The thickness of each of the hole injection layer HIL and the intermediate hole injection layers MHIL1, MHIL2, and MHIL3 may be, for example, about 5 nm to about 100 nm. The thickness of each of the hole transport layer HTL and the intermediate hole transport layers MHTL1, MHTL2, and MHTL3 may be, for example, about 5 nm to about 100 nm. When the hole transport region HTR includes the hole-side additional layer, the thickness of the hole-side additional layer may be about 1 nm to about 100 nm. When the intermediate hole transport regions MHTR1, MHTR2, and MHTR3 include the intermediate hole-side additional layer, the thickness of the intermediate hole-side additional layer may be about 1 nm to about 100 nm. When the thickness of each of the hole transport region HTR, the intermediate hole transport regions MHTR1, MHTR2, and MHTR3, and each layer included therein satisfy the above-described ranges, suitable or satisfactory hole transport properties may be obtained without a substantial increase in driving voltage.

Each of the hole transport region HTR and the intermediate hole transport regions MHTR1, MHTR2, and MHTR3 may further include a charge generation material in addition to the above-mentioned materials in order to improve conductivity (e.g., electrical conductivity). The charge generation material may be uniformly or non-uniformly dispersed in the hole transport region HTR and the intermediate hole transport regions MHTR1, MHTR2, and MHTR3. The charge generation material may be, for example, a p-type dopant. The p-type dopant may include at least one of a halogenated metal compound, a quinone derivative, a metal oxide, or a cyano group-containing compound, but is not limited thereto. For example, the p-type dopant may be a halogenated metal compound such as CuI and/or RbI, a quinone derivative such as tetracyanoquinodimethane (TCNQ) and/or 2,3,5,6-tetrafluoro-7,7'8,8-tetracyanoquinodimethane (F4-TCNQ), a metal oxide such as a tungsten oxide and/or a molybdenum oxide, and/or the like, but embodiments of the present disclosure are not limited thereto.

The first light emitting layers BEML-1, BEML-2, and BEML-3 and the second light emitting layer GEML are provided on the hole transport region HTR or the intermediate hole transport regions MHTR1, MHTR2, and MHTR3. The first first-light emitting layer BEML-1 is provided on the hole transport region HTR, the second first-light emitting layer BEML-2 is provided on the first intermediate hole transport region MHTR1, the third first-light emitting layer BEML-3 is provided on the second intermediate hole transport region MHTR2, and the second light emitting layer GEML is provided on the third intermediate hole transport region MHTR3.

The first light emitting layers BEML-1, BEML-2, and BEML-3 and the second light emitting layer GEML include the host material and the dopant material described above. The first light emitting layers BEML-1, BEML-2, and BEML-3 and the second light emitting layer GEML may include, as a hole transporting host material, a material including a carbazole derivative moiety, and/or an amine derivative moiety. The first light emitting layers BEML-1, BEML-2, and BEML-3 and the second light emitting layer GEML may include, as an electron transporting host material, a material including a nitrogen-containing aromatic ring structure, such as a pyridine derivative moiety, a pyridazine derivative moiety, a pyrimidine derivative moiety, a pyrazine derivative moiety, and/or a triazine derivative moiety.

The first light emitting layers BEML-1, BEML-2, and BEML-3 and the second light emitting layer GEML may include, as a host material, an anthracene derivative, a pyrene derivative, a fluoranthene derivative, a chrysene derivative, a dihydrobenzanthracene derivative, a triphenylene derivative, and/or the like. In addition, the first light emitting layers BEML-1, BEML-2, and BEML-3 and the second light emitting layer GEML may further include, as a host material, any suitable material generally used in the art. In some embodiments, the first light emitting layers BEML-1, BEML-2, and BEML-3 and the second light emitting layer GEML may include, as a host material, at least one of Bis[2-(diphenylphosphino)phenyl]ether oxide (DPEPO), 4,4'-Bis(carbazol-9-yl)biphenyl (CBP), 1,3-Bis(carbazol-9-yl)benzene (mCP), 2,8-Bis(diphenylphosphoryl)dibenzo[b,d]furan (PPF), 4,4',4"-Tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto. For example, tris(8-hydroxyquinolino)aluminum ($Alq_3$), poly(N-vinylcarbazole (PVK), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), and/or the like may be used as a host material.

In an embodiment, the first light emitting layers BEML-1, BEML-2, and BEML-3 may include, any suitable fluorescent dopant material generally used in the art. In some embodiments, the first light emitting layers BEML-1, BEML-2, and BEML-3 may include a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi), perylene and a derivative thereof (for example, 2,5,8,11-tetra-t-butylperylene(TBP)), pyrene and a derivative thereof (for example, 1,1-dipyrene, 1,4-dipyrenylbenzene, and/or 1,4-bis(N, N-diphenylamino)pyrene), and/or the like.

The second light emitting layer GEML may include any suitable phosphorescent dopant material generally used in the art. For example, as a phosphorescent dopant, a metal complex including iridium (Ir), platinum (Pt), osmium (Os), gold (Au), titanium (Ti), zirconium (Zr), hafnium (Hf), europium (Eu), terbium (Tb), and/or thulium (Tm) may be used. In some embodiments, iridium(III) bis(4,6-difluorophenylpyridinato-N,C2')picolinate (Flrpic), Bis(2,4-difluorophenylpyridinato)-tetrakis(1-pyrazolyl)borate iridium(III) (Fir6), and/or platinum octaethyl porphyrin (PtOEP) may be used as a phosphorescent dopant. The second light emitting layer GEML may include a phosphorescent dopant that emits a green color.

Each of the electron transport region ETR and an intermediate electron transport region is on the first light emitting layers BEML-1, BEML-2, and BEML-3 and the second light emitting layer GEML. Each of the electron transport region ETR and the intermediate electron transport region may have a single-layered structure having a single layer formed of a single material, a single-layered structure and having a single layer formed of a plurality of different materials, or a multi-layered structure having a plurality of layers formed of a plurality of different materials.

Each of the electron transport region ETR and the intermediate electron transport region may be formed using various suitable methods such as vacuum deposition, spin coating, casting, Langmuir-Blodgett (LB), inkjet printing, laser printing, laser induced thermal imaging (LITI), and/or the like.

The electron transport region ETR may include the magnesium (Mg) and ytterbium (Yb) metals described above in the electron injection layers EIL and EIL-1 of an embodiment. The electron injection layer EIL and EIL-1 of an embodiment may be composed of the magnesium (Mg) and ytterbium (Yb) metals described above. However, embodiments of the present disclosure are not limited thereto. The electron injection layer EIL and EIL-1 of an embodiment may further include compounds to be further described herein below, in addition to the magnesium (Mg) and ytterbium (Yb) metals described above.

Each of the electron transport region ETR and the intermediate electron transport region may include an anthracene-based compound. However, embodiments of the present disclosure are not limited thereto. Each of the electron transport region ETR and the intermediate electron transport region may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine (T2T), 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato- N1,O8)-(1,1'-biphenyl-4-olato)aluminum (BAlq), berylliumbis(benzoquinolin-10-olate) ($Bebq_2$), 9,10-di (naphthalene-2-yl)anthracene (ADN), 1,3-bis[3,5-di(pyridin-3-yl)phenyl]benzene (BmPyPhB), and/or a compound or mixture thereof.

In addition, each of the electron transport region ETR and the intermediate electron transport region may include a halogenated metal such as LiF, NaCl, CsF, RbCl, RbI, CuI, and/or KI, a lanthanum group metal such as Yb, or a co-deposition material of the above halogenated metal and the lanthanum group metal. For example, the electron transport region ETR and the intermediate electron transport region may include KI:Yb, RbI:Yb, and the like as a co-deposition material. In some embodiments, as the electron transport region ETR and the intermediate electron transport region, a metal oxide such as $Li_2O$ and/or BaO, and/or 8-hydroxyl-Lithium quinolate (Liq) and/or the like may be used, but embodiments of the present disclosure are not limited thereto. Each of the electron transport region ETR and the intermediate electron transport region may also be composed of a mixture of an electron transport material and an insulating organo metal salt (e.g., an electrically insulating organo metal salt). The organo metal salt may be a material having an energy band gap of about 4 eV or greater. For example, the organo metal salt may include metal acetate, metal benzoate, metal acetoacetate, metal acetylacetonate, and/or metal stearate.

Each of the electron transport region ETR and the intermediate electron transport region may further include at least one selected from 2,9-dimethyl-4,7-diphenyl-1,10-phenanthroline (BCP) and 4,7-diphenyl-1,10-phenanthroline (Bphen) in addition to the above-mentioned materials, but embodiments of the present disclosure are not limited thereto.

The electron transport region ETR may include the above-described compounds of the electron transport region in the electron injection layer EIL and EIL-1 or the electron transport layer ETL. When the electron transport region ETR includes the electron-side additional layer, the electron-side additional layer may include the above-described material. The intermediate electron transport region may include the above-described compounds of the electron transport region in the intermediate electron transport layers METL1, METL2, and METL3. The intermediate electron transport region may include the above-described compounds of the electron transport region in an intermediate electron-side additional layer, or an intermediate electron injection layer.

The thickness of each of the electron transport region ETR and the intermediate electron transport region may be, for example, about 10 nm to about 150 nm. The thicknesses of the electron transport layer ETL may be about 0.1 nm to about 100 nm, for example, about 0.3 nm to about 50 nm. When the thickness of the electron transport layer ETL satisfies the above-described range, suitable or satisfactory electron transport properties may be obtained without a substantial increase in driving voltage. The thickness of each of the intermediate electron transport layers METL1, METL2, and METL3 included in the intermediate electron transport region may be about 0.1 nm to about 100 nm, for example, about 0.1 nm to about 50 nm.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode.

The second electrode EL2 may be a transflective electrode or a transmissive electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, and/or a compound or a mixture thereof (for example, AgMg, AgYb, or MgAg). In some embodiments, the second electrode EL2 may be of a multi-layered structure including a reflective film or a transflective film, both formed of the above-referenced materials, and a transparent conductive film formed of indium tin oxide (ITO), indium zinc oxide (IZO), zinc oxide (ZnO), indium tin zinc oxide (ITZO), and/or the like. For example, the second electrode EL2 may include any one of the above-described metal materials, a combination of two or more selected from the above-described metal materials, an oxide of any one of the above-described metal materials, and/or the like.

In some embodiments, the second electrode EL2 may be connected to an auxiliary electrode. When the second electrode EL2 is connected to the auxiliary electrode, the resistance of the second electrode EL2 may be reduced.

In some embodiments, a capping layer CPL may be further on the second electrode EL2 of the light emitting devices ED, ED-1, ED-2, and ED-3 of an embodiment. The capping layer CPL may include multilayers, or a single layer.

In an embodiment, the capping layer CPL may be an organic layer, and/or an inorganic layer. For example, when the capping layer CPL includes an inorganic substance, the inorganic substance may include an alkaline metal compound such as LiF, an alkaline earth metal compound such as $MgF_2$, SiON, $SiN_x$, SiOy, and/or the like.

For example, when the capping layer CPL includes an organic substance, the organic substance may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-Tris (carbazol sol-9-yl) triphenylamine (TCTA), and/or the like, and/or may include an epoxy resin, and/or an acrylate such as a methacrylate. However, embodiments of the present disclosure are not limited thereto. The capping layer CPL may include at least one selected from the following compounds P1 to P5.

P1

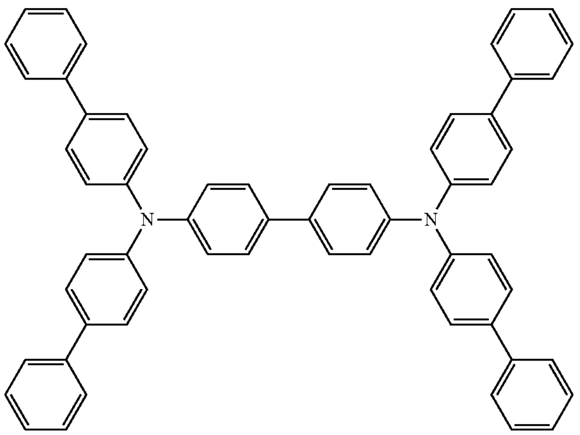

-continued

P2

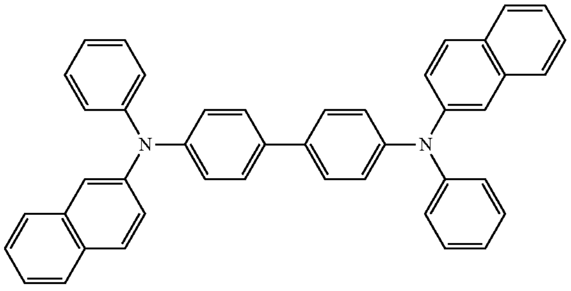

P3

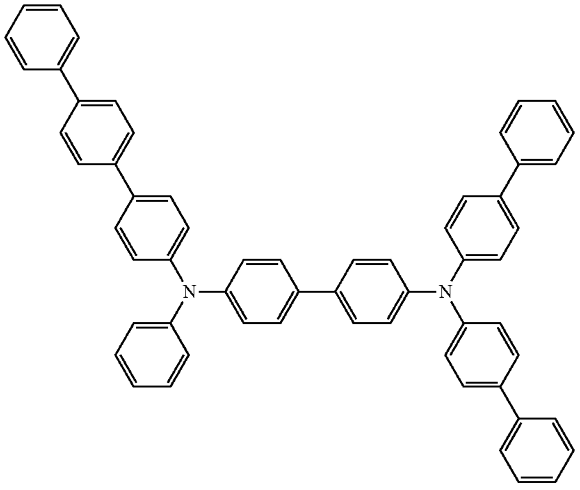

P4

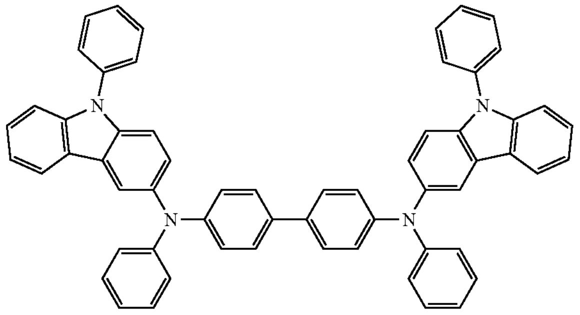

P5

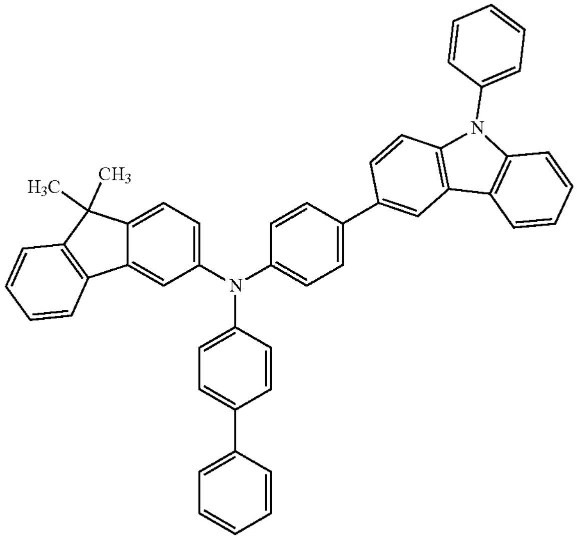

In some embodiments, the refractive index of the capping layer CPL may be about 1.6 or greater. For example, for light in a wavelength region of about 550 nm to about 660 nm, the refractive index of the capping layer CPL may be about 1.6 or greater.

In some embodiments, the light emitting devices ED, ED-1, ED-2, and ED-3 included in the display apparatus ES of an embodiment have a structure including the plurality of first light emitting layers BEML-1, BEML-2, and BEML-3 and the second light emitting layer GEML, and thus, may use light emission at a plurality of resonance distances, so that luminescence efficiency may be increased or maximized. In the light emitting device ED illustrated in FIG. 5A, in order to increase or maximize the efficiency in a fourth resonance region of the first light having a wavelength range of about 420 nm to about 480 nm, a second light emitting layer which emits the second light having a wavelength range of about 520 nm to about 600 nm is in the fourth stack ST4, so that the luminescence efficiency of the light emitting device may be increased or maximized.

Hereinafter, results of the evaluation of properties of a light emitting device according to embodiments of the present disclosure will be described with reference to Examples and Comparative Examples. In addition, the Examples below are for illustrative purposes only to facilitate the understanding of the subject matter of the present disclosure, and thus, the scope of the present disclosure is not limited thereto.

Manufacturing of Light Emitting Device

In each of the Examples and Comparative Examples, a tandem light emitting device was manufactured in which a first stack, a second stack, and a third stack including a first light emitting layer emitting light having a wavelength range of about 420 nm to about 480 nm were stacked, and a fourth stack including a second light emitting layer emitting light having a wavelength range of about 520 nm to about 600 nm was stacked on the third stack. An n-type charge generation layer in which 2,4,6-Tris(3-(pyrimidin-5-yl)phenyl)-1,3,5-triazine (TPM-TAZ) is doped with Liq, and a p-type charge generation layer in which 4,4'-Bis(N-carbazolyl)-1'1-biphenyl (CBP) is doped with Li are between respective stacks. In addition, ITO/Ag/ITO as a first electrode and AgMg as a second electrode were used, and 1,4,5,8,9,11-Hexaazatriphenylenehexacarbonitrile (HATCN) as a material for a hole injection layer and an intermediate hole injection layer, N,N'-Di(1-naphthyl)-N,N'-diphenyl-(1,1'-biphenyl)-4,4'-diamine (NPB) as a material for a hole transport layer and an intermediate hole transport layer, 2,4,6-tris(biphenyl-3-yl)-1,3,5-triazine (T2T) as a material for an intermediate electron transport layer, a layer in which TPM-TAZ is doped with Liq as a material for an electron injection layer, and Mg and Yb as a material for an electron injection material were used. Each layer was formed by a deposition method under vacuum conditions. On the second electrode, a capping layer having a thickness of about 70 nm was formed through the aforementioned compound P4.

In the Examples and Comparative Examples, the aforementioned H1-1 was used a host included in the first light emitting layer. The aforementioned FD32 was used a dopant included in the first light emitting layer. The aforementioned H4-3 was used a hole transporting host included in the second light emitting layer. H3-23 was used an electron transporting host included in the second light emitting layer. PD13 was used a dopant included in the second light emitting layer.

In the devices of Examples and Comparative Examples, each of the first light emitting layers BEML-1, BEML-2, and BEML-3 included in the first stack, the second stack, and the third stack and the second light emitting layer GEML were manufactured to have a single-layered structure. Meanwhile, in the devices of the Examples and Comparative Examples, all of the second light emitting layers were manufactured to have a single-layered structure in which a hole transporting host and an electron transporting host were mixed together.

Evaluation of Properties of Examples 1 to 4 and Comparative Examples 1 to 9

In the devices of Examples 1 to 4, an electron injection layer was manufactured to have a single-layered structure as the stacking structure illustrated in FIG. 5A. In Example 1, the light emitting device was manufactured by setting the mass ratio of magnesium (Mg) and ytterbium (Yb) to about 5:5, and stacking the electron injection layer to a thickness of about 1.0 nm. In Example 2, the light emitting device was manufactured by setting the mass ratio of magnesium (Mg) and ytterbium (Yb) to about 7:3, and stacking the electron injection layer to a thickness of about 1.0 nm. In Example 3, the light emitting device was manufactured by setting the mass ratio of magnesium (Mg) and ytterbium (Yb) to about 8:2, and stacking the electron injection layer to a thickness of about 1.0 nm. In Example 4, the light emitting device was manufactured by setting the mass ratio of magnesium (Mg) and ytterbium (Yb) to about 8:2, and stacking the electron injection layer to a thickness of about 2.0 nm.

In Comparative Examples 1 and 2, the light emitting device was manufactured by stacking an electron injection layer to a thickness of about 1.0 nm, wherein the electron injection layer was formed of a single material of magnesium (Mg) or ytterbium (Yb). Compared to Example 3, in Comparative Example 3, the light emitting device was manufactured in substantially the same manner as in Example 3, except that lithium fluoride (LiF) was used instead of magnesium (Mg) when forming the electron injection layer. Compared to Example 3, in Comparative Example 4, the light emitting device was manufactured in substantially the same manner as in Example 3, except that lithium fluoride (LiF) was used instead of ytterbium (Yb) when forming the electron injection layer, and the mass ratio of lithium fluoride (LiF) and magnesium (Mg) was set to about 8:2. Compared to Example 3, in Comparative Example 5, the light emitting device was manufactured in substantially the same manner as in Example 3, except that the electron injection layer was stacked to a thickness of about 0.5 nm. Compared to Example 3, in Comparative Example 6, the light emitting device was manufactured in substantially the same manner as in Example 3, except that the electron injection layer was stacked to a thickness of about 2.5 nm. Compared to Example 3, in Comparative Example 7, the light emitting device was manufactured in substantially the same manner as in Example 3, except that the mass ratio of magnesium (Mg) and ytterbium (Yb) was set to about 4:6. Compared to Example 3, in Comparative Example 8, the light emitting device was manufactured in substantially the same manner as in Example 3, except that the mass ratio of magnesium (Mg) and ytterbium (Yb) was set to about 9:1. Compared to Example 3, in Comparative Example 9, the light emitting device was manufactured in substantially the same manner as in Example 3, except that the mass ratio of magnesium (Mg) and ytterbium (Yb) was set to about 9.5:0.5.

The evaluation results of Examples 1 to 4 and Comparative Examples 1 to 9 are shown in Table 1 below. In the evaluation of light emitting devices of Table 1, the driving voltage represents a voltage value corresponding to a luminance of about 3500 nit. The device lifespan is time measured until the luminance of a light emitting device drops to about 97% of its initial luminance. The driving voltage, luminescence efficiency, and device lifespan are relative comparison values based on 100% of the driving voltage, luminous efficiency, and device lifespan of Comparative Example 1.

TABLE 1

| | Electron injection layer | Thick-ness | Efficiency (Cd/A/y) | Driving voltage (V) | Lumin-ance (nit) | Life-span |
|---|---|---|---|---|---|---|
| Example 1 | Mg:Yb (5:5) | 1.0 nm | 106% | 100% | 1500 | 110% |
| Example 2 | Mg:Yb (7:3) | 1.0 nm | 108% | 100% | 1500 | 113% |
| Example 3 | Mg:Yb (8:2) | 1.0 nm | 109% | 100% | 1500 | 115% |
| Example 4 | Mg:Yb (8:2) | 2.0 nm | 108% | 102% | 1500 | 116% |
| Comparative Example 1 | Yb | 1.0 nm | 100% | 100% | 1500 | 100% |
| Comparative Example 2 | Mg | 1.0 nm | 101% | 104% | 1500 | 101% |
| Comparative Example 3 | LiF:Yb (8:2) | 1.0 nm | 105% | 99% | 1500 | 95% |
| Comparative Example 4 | LiF:Mg (8:2) | 1.0 nm | 108% | 100% | 1500 | 105% |
| Comparative Example 5 | Mg:Yb (8:2) | 0.5 nm | 102% | 102% | 1500 | 104% |
| Comparative Example 6 | Mg:Yb (8:2) | 2.5 nm | 104% | 104% | 1500 | 108% |
| Comparative Example 7 | Mg:Yb (4:6) | 1.0 nm | 99% | 100% | 1500 | 100% |
| Comparative Example 8 | Mg:Yb (9:1) | 1.0 nm | 105% | 102% | 1500 | 101% |
| Comparative Example 9 | Mg:Yb (9.5:0.5) | 1.0 nm | 100% | 103% | 1500 | 100% |

Referring to the results in Table 1, it can be seen that the light emitting devices of Examples exhibit similar or lower levels of driving voltage, similar or better luminous efficiency and device lifetime lifespan properties than the light emitting devices of Comparative Examples. The light emitting device ED according to an embodiment of the present disclosure includes magnesium (Mg) and ytterbium (Yb) in the electron injection layer EIL which is included in the electron transport region ETR below the second electrode EL2, so that the coverage of the second electrode EL2 may be improved, and the interface between the second electrode EL2 and the electron transport region ETR may be stably maintained. The light emitting device ED of an embodiment has the electron injection layer EIL composed of magnesium (Mg) and ytterbium (Yb), so that an effective bonding area between metals may be increased at the interface between the second electrode EL2 and the electron injection layer EIL. For example, the coverage properties of the second electrode EL2 may be improved. Accordingly, the interface properties between the second electrode EL2 and the electron injection layer EIL are stabilized to prevent or reduce the deterioration of the light emitting device ED, and defects such as pixel shrinkage may be suppressed or reduced to improve device lifespan.

When compared to Examples 1 to 3 having a similar structure to that of Comparative Examples 1 and 2, it can be seen that when an electron injection layer is composed of a single material of magnesium (Mg) or ytterbium (Yb), the luminescence efficiency and lifespan are degraded compared to those of Examples 1 to 3 in which magnesium (Mg) and ytterbium (Yb) are used together. When compared to Comparative Examples 1 and 2, Examples 1 to 3 apply both magnesium (Mg) and ytterbium (Yb) to an electron injection layer, so that electron injection properties are high, and, for example, the coverage properties of a second electrode are improved, so that the stability of a light emitting device is increased. Through the above, it can be seen that when compared to Comparative Examples 1 and 2, Examples 1 to 3 exhibit excellent luminescence efficiency and lifespan properties, and may be applied to a display apparatus of an embodiment.

When compared to Examples 1 to 3 having a similar structure to that of Comparative Example 3, it can be seen that in the case of Comparative Example 3 in which an electron injection layer included a mixture of ytterbium (Yb) and lithium fluoride (LiF), the luminescence efficiency and lifespan were all degraded compared to those of Examples 1 to 3. In the case of Comparative Example 3, it is determined that although electron injection properties were improved by mixing together an ytterbium (Yb) metal with lithium fluoride (LiF), the coverage properties of a second electrode were degraded, so that the luminescence efficiency and device lifespan were reduced.

When compared to Examples 1 to 3 having a similar structure to that of Comparative Example 4, it can be seen that in the case of Comparative Example 4 in which an electron injection layer included a mixture of magnesium (Mg) and lithium fluoride (LiF), the luminescence efficiency and lifespan were all degraded compared to those of Examples 1 to 3. In the case of Comparative Example 4, it is determined that although electron injection properties were improved by mixing together a magnesium (Mg) metal with lithium fluoride (LiF), the coverage properties of a second electrode were degraded, so that the luminescence efficiency and device lifespan were reduced.

When comparing Examples 1 to 4 and Comparative Examples 5 and 6, it can be seen that there is a benefit when the thickness of an electron injection layer is 10 nm to 20 nm. According to Comparative Examples 5 and 6, it can be seen that the driving voltage was increased, and the luminescence efficiency and lifespan were degraded compared to those of Examples 1 to 4 of the present disclosure. When the thickness of an electron injection layer is less than about 10 nm as in the case of Comparative Example 5, because the interface properties between a second electrode and the electron injection layer becomes unstable, the stability of a thin film may be lowered to increase a driving voltage, and the luminescence efficiency and lifespan may be degraded. In addition, when the thickness of an electron injection layer is greater than about 20 nm as in the case of Comparative Example 6, electron injection properties may be degraded and a driving voltage is increased, so that luminescence efficiency and lifespan may be degraded. Therefore, there is a benefit when the thickness of an electron injection layer is about 10 nm to about 20 nm.

When comparing Examples 1 to 4 and Comparative Examples 7 to 9, there is a benefit when the mass ratio of magnesium (Mg) and ytterbium (Yb) included in an electron injection layer is about 5:5 to about 8:2. According to Comparative Examples 7 to 9, the mass ratio of magnesium (Mg) and ytterbium (Yb) is out of about 5:5 to about 8:2, so that it can be seen that the luminescence efficiency and device lifespan are degraded compared to those of Examples 1 to 4.

Evaluation of Properties of Examples 5 to 7 and Comparative Examples 10 to 12

As in the light emitting device ED-1 illustrated in FIG. 5B, in the devices of Examples 5 to 7, the electron injection layer EIL-1 was manufactured to have a double-layered structure by separating the first sub-electron injection layer SEIL1 including magnesium (Mg), and the second sub-electron injection layer SEIL2 including ytterbium (Yb) on an upper portion of the first sub-electron injection layer SEIL1. In Example 5, the light emitting device was manufactured in which an electron injection layer had a double-layered structure, a first sub-electron injection layer was stacked to a thickness of about 0.9 nm, and a second sub-electron injection layer was stacked to a thickness of about 0.1 nm. In Example 6, the light emitting device was manufactured in which an electron injection layer had a double-layered structure, a first sub-electron injection layer was stacked to a thickness of about 0.8 nm, and a second sub-electron injection layer was stacked to a thickness of about 0.2 nm. In Example 7, the light emitting device was manufactured in which an electron injection layer had a double-layered structure, and each of a first sub-electron injection layer and a second sub-electron injection layer was stacked to a thickness of about 0.5 nm.

Compared to Example 5, in Comparative Example 10, the light emitting device was manufactured in substantially the same manner as in Example 5, except that a first sub-electron injection layer was stacked to a thickness of about 0.95 nm, and a second sub-electron injection layer was stacked to a thickness of about 0.05 nm. Compared to Example 5, in Comparative Example 11, the light emitting device was manufactured in substantially the same manner as in Example 5, except that a first sub-electron injection layer was stacked to a thickness of about 0.4 nm, and a second sub-electron injection layer was stacked to a thickness of about 0.6 nm. Compared to Example 5, in Comparative Example 12, the light emitting device was manufactured in substantially the same manner as in Example 5, except that a first sub-electron injection layer was stacked to a thickness of about 0.2 nm, and a second sub-electron injection layer was stacked to a thickness of about 0.8 nm. The evaluation results of Examples 5 to 7 and Comparative Examples 10 to 12 are shown in Table 2 below. In the evaluation of light emitting devices of Table 2, the driving voltage represents a voltage value corresponding to a luminance of about 3500 nit. The device lifespan is time measured until the luminance of a light emitting device drops to about 97% of its initial luminance. The driving voltage, luminescence efficiency, and device lifespan are relative comparison values based on 100% of the driving voltage, luminous efficiency, and device lifespan of Comparative Example 1.

TABLE 2

| | Electron injection layer | Thickness | Efficiency (Cd/A/y) | Driving voltage (V) | Luminance (nit) | Lifespan |
|---|---|---|---|---|---|---|
| Example 5 | Mg/Yb | 0.9 nm/ 0.1 nm | 105% | 100% | 1500 | 104% |
| Example 6 | Mg/Yb | 0.8 nm/ 0.2 nm | 106% | 100% | 1500 | 106% |
| Example 7 | Mg/Yb | 0.5 nm/ 0.5 nm | 104% | 100% | 1500 | 106% |
| Comparative Example 10 | Mg/Yb | 0.95 nm/ 0.05 nm | 100% | 103% | 1500 | 99% |
| Comparative Example 11 | Mg/Yb | 0.4 nm/ 0.6 nm | 100% | 100% | 1500 | 101% |
| Comparative Example 12 | Mg/Yb | 0.2 nm/ 0.8 nm | 101% | 100% | 1500 | 103% |

Referring to Table 2 above, in the case of Comparative Examples 10 to 12, it can be seen that the lifespan was degraded compared to that of Examples 5 to 7 of the present disclosure. When an electron injection layer has a double-layered structure of a first sub-electron injection layer and a second sub-electron injection layer, there is a benefit when the thickness of the first sub-electron injection layer is about 0.5 nm to about 0.9 nm and the thickness of the second sub-electron injection layer is about 0.1 nm to about 0.5 nm in order to improve electron injection properties and improve the coverage properties of a second electrode.

Figure 6:
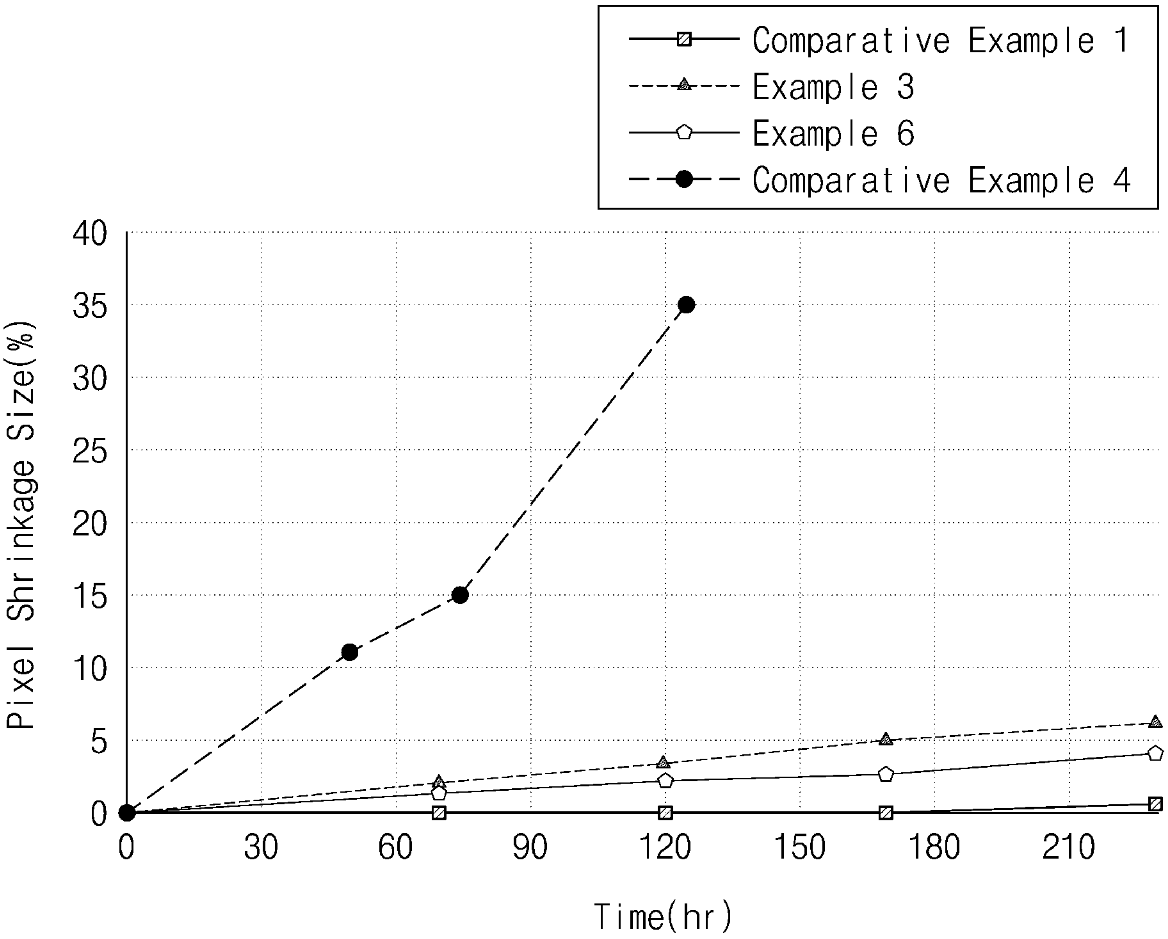
FIG. 6 is a graph showing changes in pixel shrinkage size over time measured in each light emitting device of Examples and Comparative Examples.

FIG. 6 is a graph showing changes in pixel shrinkage size over time measured in the light emitting device of each of Example 3, Example 6, Comparative Example 1, and Comparative Example 4. Aging was performed on each of Example 3, Example 6, Comparative Example 1, and Comparative Example 4 under the condition of about 1500 nit, and the degree of change in pixel shrinkage size over time was measured using an optical microscope. In FIG. 6, X-axis represents time (hr), and Y-axis represent a pixel shrinkage size.

Referring to FIG. 6, in the case of Example 3 which includes an electron injection layer including magnesium (Mg) and ytterbium (Yb), it can be seen that the degree of increase in pixel shrinkage size is significantly lower than that of Comparative Example 4 which includes an electron injection layer including lithium fluoride (LiF) and magnesium (Mg). For example, when about 120 hours have elapsed, the pixel shrinkage rate of Example 3 was less than about 5%, but the pixel shrinkage rate of Comparative Example 4 was about 35% or higher, which confirms that the pixel shrinkage size was increased by about 7 times or more compared to that of Example 3. When a metal halogen compound such as lithium fluoride (LiF) is introduced into an electron injection layer, due to its tendency to ionize itself, the metal halogen compound is separated into ions to cause physical distribution in the electron injection layer. Accordingly, as the driving time of a light emitting device passes, the film component of the electron injection layer may be changed to affect interface properties.

In addition, in the case of Example 6, an electron injection layer has a double-layered structure which includes a first sub-electron injection layer including magnesium (Mg), and a second sub-electron injection layer including ytterbium (Yb) on an upper portion of the first sub-electron injection layer, so that it can be seen that the degree of increase in pixel shrinkage size is significantly lower than that of Comparative Example 4.

Referring to Table 1 and FIG. 6 together, it can be seen that Comparative Example 4 had almost no pixel shrinkage phenomenon occurred, but had reduced luminescence efficiency and lifespan compared to those of Examples. When an electron injection layer is formed of a single material of ytterbium (Yb) as in Comparative Example 1, the coverage properties of a second electrode may be improved to prevent or reduce a pixel shrinkage phenomenon, but luminescence efficiency is reduced and thin film stability is degraded compared to Examples, so that luminescence efficiency and lifespan may be reduced.

A light emitting device according to an embodiment of the present disclosure includes magnesium (Mg) and ytterbium (Yb) in an electron injection layer below a second electrode, so that the interface between the second electrode and the electron injection layer is stabilized to improve the coverage properties of the second electrode. Accordingly, a pixel shrinkage phenomenon which occurs during device driving may be prevented or reduced, and electron injection properties by the electron injection layer may be improved, so that the luminescence efficiency and device lifespan properties of the light emitting device may be improved. A display apparatus of an embodiment includes the light emitting device of an embodiment, and thus, may have improved luminescence efficiency and lifespan properties, and may exhibit excellent reliability by preventing or reducing defects such as pixel shrinkage.

According to embodiments of the present disclosure, electron injection properties may be improved and a pixel shrinkage phenomenon may be prevented or reduced in a light emitting device, so that it is possible to provide a light emitting device and a display apparatus with improved luminescence efficiency and device lifespan and excellent reliability.

Although the subject matter of the present disclosure has been described with reference to example embodiments of the present disclosure, it will be understood by those skilled in the art that various changes in form and details may be made therein without departing from the spirit and scope of the present disclosure as defined by the following claims, and equivalents thereof. Accordingly, the technical scope of the present disclosure is not intended to be limited to the contents set forth in the detailed description of the specification, but is intended to be defined by the appended claims, and equivalents thereof.

What is claimed is:

1. A light emitting device comprising:

a first electrode;

a hole transport region on the first electrode;

a first light emitting layer on the hole transport region and configured to emit light of a first wavelength;

a second light emitting layer on the hole transport region and configured to emit light of a second wavelength different from the first wavelength;

an electron transport region comprising an electron transport layer on the first light emitting layer and the second light emitting layer, and an electron injection layer on the electron transport layer; and a second electrode on the electron transport region, wherein the electron injection layer comprises magnesium (Mg) and ytterbium (Yb), wherein a mass ratio of the magnesium (Mg) and the ytterbium (Yb) is about 5:5 to about 8:2, and wherein a thickness of the electron injection layer is about 1 nm to about 2 nm.

2. The light emitting device of claim 1, wherein the electron injection layer is directly on a lower surface of the second electrode.

3. The light emitting device of claim 1, wherein the electron injection layer comprises:

a first sub-electron injection layer on the electron transport layer and comprising the magnesium (Mg); and a second sub-electron injection layer on the first sub-electron injection layer and comprising the ytterbium (Yb).

4. The light emitting device of claim 3, wherein a thickness of the first sub-electron injection layer is about 0.5 nm to about 0.9 nm, and a thickness of the second sub-electron injection layer is about 0.1 nm to about 0.5 nm.

5. The light emitting device of claim 1, wherein the first wavelength is about 420 nm to about 480 nm, and the second wavelength is about 520 nm to about 600 nm.

6. The light emitting device of claim 1, further comprising a first charge generation layer between the first light emitting layer and the second light emitting layer.

7. The light emitting device of claim 6, wherein the first charge generation layer comprises:

a first p-type charge generation layer doped with a p-type dopant; and a first n-type charge generation layer doped with an n-type dopant.

8. The light emitting device of claim 6, further comprising an intermediate electron transport layer between the first light emitting layer and the first charge generation layer, and an intermediate hole transport layer between the first charge generation layer and the second light emitting layer.

9. The light emitting device of claim 1, further comprising an additional light emitting layer between the hole transport region and the electron transport region and configured to emit the light of the first wavelength.

10. The light emitting device of claim 9, wherein the additional light emitting layer comprises:

a first additional light emitting layer between the first light emitting layer and the second light emitting layer; and a second additional light emitting layer between the first additional light emitting layer and the second light emitting layer.

11. The light emitting device of claim 9, wherein the additional light emitting layer comprises a third additional light emitting layer between the second electrode and the second light emitting layer, and configured to emit the light of the first wavelength.

12. The light emitting device of claim 1, wherein the second light emitting layer is between the first light emitting layer and the second electrode.

13. A light emitting device comprising:

a first electrode;

a plurality of first light emitting layers on the first electrode and configured to emit light of a first wavelength;

a second light emitting layer on the first electrode and configured to emit light of a second wavelength different from the first wavelength;

an electron transport region comprising an electron transport layer on the first light emitting layer and the second light emitting layer, and an electron injection layer on the electron transport layer; and a second electrode on the electron transport region, wherein a plurality of first light emitting layers comprise a first first-light emitting layer, a second first-light emitting layer, and a third first-light emitting layer, and the electron injection layer comprises magnesium (Mg) and ytterbium (Yb), wherein a mass ratio of the magnesium (Mg) and the ytterbium (Yb) is about 5:5 to about 8:2, and wherein a thickness of the electron injection layer is about 1 nm to about 2 nm.

14. A display apparatus comprising:

a substrate on which a first pixel region configured to emit light of a first wavelength, a second pixel region configured to emit light of a second wavelength different from the first wavelength, and a third pixel region configured to emit light of a third wavelength different from the first wavelength and the second wavelength are defined; and a plurality of light emitting devices that overlap the first pixel region, the second pixel region, and the third pixel region on the substrate, wherein each of the plurality of light emitting devices comprises:

a first electrode;

a hole transport region on the first electrode;

a first light emitting layer on the hole transport region and configured to emit the light of the first wavelength;

a second light emitting layer on the hole transport region and configured to emit the light of the second wavelength;

an electron transport region comprising an electron transport layer on the first light emitting layer and the second light emitting layer, and an electron injection layer on the electron transport layer; and a second electrode on the electron transport region, wherein the electron injection layer comprises magnesium (Mg) and ytterbium (Yb), wherein a mass ratio of the magnesium (Mg) and the ytterbium (Yb) is about 5:5 to about 8:2, and wherein a thickness of the electron injection layer is about 1 nm to about 2 nm.

15. The display apparatus of claim 14, further comprising a light control layer on the plurality of light emitting devices, wherein the light control layer comprises:

a first light control unit overlapping the first pixel region and configured to transmit the light of the first wavelength;

a second light control unit overlapping the second pixel region and configured to transmit the light of the second wavelength; and a third light control unit overlapping the third pixel region and configured to transmit the light of the third wavelength.

16. The display apparatus of claim 15, wherein a fourth pixel region configured to emit white light is defined on the substrate, and the light control layer further comprises a transmission unit overlapping the fourth pixel region and configured to transmit the white light.

* * * * *